(12) United States Patent  
Smith et al.

(10) Patent No.: US 9,001,251 B2
(45) Date of Patent: Apr. 7, 2015

(54) OVERSAMPLED IMAGE SENSOR WITH CONDITIONAL PIXEL READOUT

(71) Applicant: Rambus Inc., Sunnyvale, CA (US)

(72) Inventors: Craig M. Smith, Spencerport, NY (US); Michael Guidash, Rochester, NY (US); Jay Endsley, San Jose, CA (US); Thomas Vogelsang, Mountain View, CA (US); James E. Harris, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 14/482,065

(22) Filed: Sep. 10, 2014

(65) Prior Publication Data

US 2015/0070544 A1  Mar. 12, 2015

Related U.S. Application Data

(60) Provisional application No. 61/875,882, filed on Sep. 10, 2013.

(51) Int. Cl.
 *H04N 3/14* (2006.01)
 *H04N 5/335* (2011.01)
 *H04N 5/378* (2011.01)
 *H01L 31/062* (2012.01)
 *H01L 31/113* (2006.01)

(52) U.S. Cl.
 CPC ..................................... *H04N 5/378* (2013.01)

(58) Field of Classification Search
 USPC ........................ 348/302, 308, 312; 250/208.1; 257/290–292
 See application file for complete search history.

(56) References Cited

U.S. PATENT DOCUMENTS

| | | | |
|---|---|---|---|
| 5,481,317 A | 1/1996 | Hieda | |
| 5,859,927 A | 1/1999 | Adams et al. | |
| 5,915,079 A | 6/1999 | Vondran, Jr. et al. | |
| 8,619,168 B2 * | 12/2013 | Choi et al. | 348/294 |
| 8,629,927 B2 * | 1/2014 | Bechtel et al. | 348/302 |
| 2007/0262237 A1 | 11/2007 | Mann | |
| 2009/0059044 A1 | 3/2009 | Tay | |
| 2009/0161753 A1 | 6/2009 | Youn et al. | |
| 2010/0013963 A1 | 1/2010 | Jannard et al. | |
| 2014/0022431 A1 * | 1/2014 | Chen et al. | 348/308 |
| 2014/0158863 A1 * | 6/2014 | Guidash | 250/208.1 |
| 2014/0175264 A1 * | 6/2014 | Xue et al. | 250/208.1 |
| 2014/0293102 A1 * | 10/2014 | Vogelsang et al. | 348/294 |
| 2014/0313387 A1 * | 10/2014 | Vogelsang et al. | 348/308 |
| 2014/0320716 A1 * | 10/2014 | Huang | 348/302 |

OTHER PUBLICATIONS

Holst, Gerhard, "Optimising sCMOS Sensor Performance in Digital Camera Applications," Presentation at Image Sensors 2013, London, UK, Mar. 19-21, 2013. 25 pages.

(Continued)

*Primary Examiner* — Kelly L Jerabek
(74) *Attorney, Agent, or Firm* — Charles Shemwell

(57) ABSTRACT

In a pixel array within an integrated-circuit image sensor, each of a plurality of pixels is evaluated to determine whether charge integrated within the pixel in response to incident light exceeds a first threshold. N-bit digital samples corresponding to the charge integrated within at least a subset of the plurality of pixels are generated, and then applied to a lookup table to retrieve respective M-bit digital values (M being less than N), wherein a stepwise range of charge integration levels represented by possible states of the M-bit digital values extends upward from a starting charge integration level that is determined based on the first threshold.

20 Claims, 36 Drawing Sheets

(56) References Cited

OTHER PUBLICATIONS

Snoeij et al., "A Low-Power Column-Parallel 12-bit ADC for CMOS Imagers," Proc. IEEE Workshop CCDs, AIS, pp. 169-172, 2005. 4 pages.

Texas Instruments, "OMAP4460 Multimedia Device Technical Reference Manual," version Y (Public Version), Section 8.3.3.7.13, Feb. 2011, Revised Mar. 2013. 4 pages.

PCT Invitation to Pay Fees and Partial International Search Report dated Dec. 18, 2014 in International Application No. PCT/US2014/054886. 5 pages.

* cited by examiner

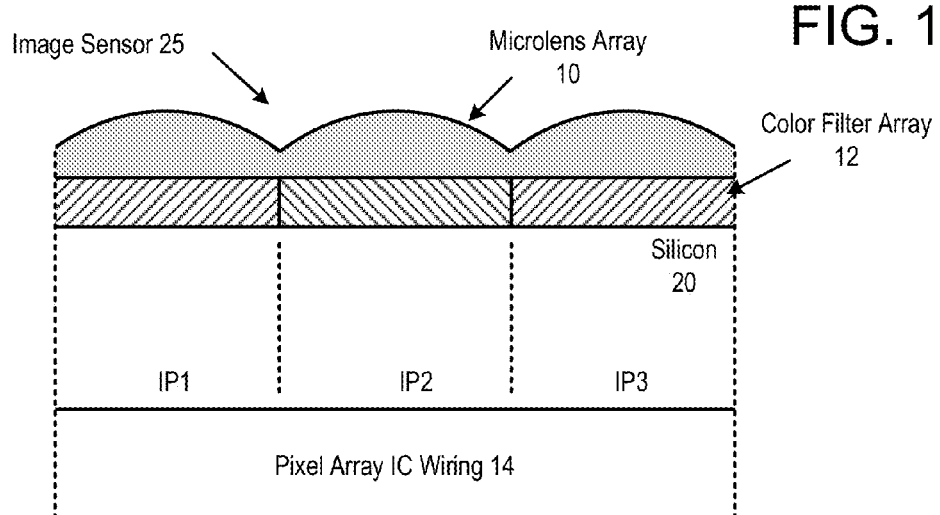
FIG. 1
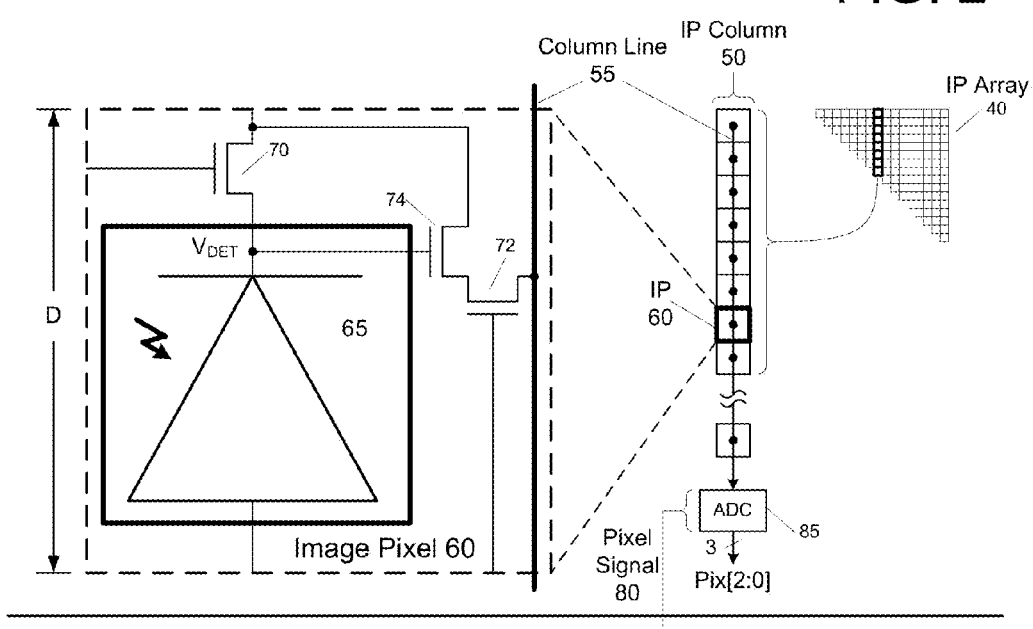
FIG. 2
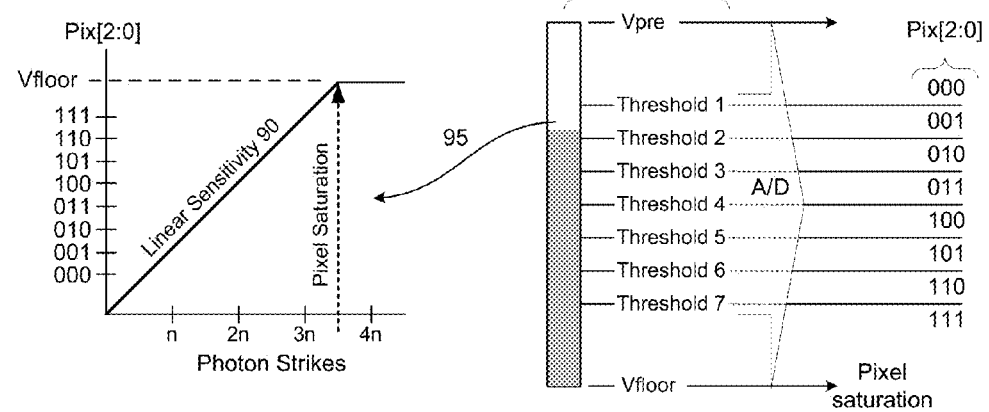

| Control | Sampling interval | Photons (det. - accum.) | Threshold met? | ADC value | Memory Element |
|---|---|---|---|---|---|
| Begin exposure, Threshold = 20 | 0 | N/A | N/A | X X X X X | X X X X X X X X |
| | 1 | 4 - 4 | n | 0 0 1 0 0 | 0 0 0 0 0 0 0 0 |
| | 2 | 7 - 11 | n | 0 1 0 1 1 | 0 0 0 0 0 0 0 0 |
| | 3 | 2 - 13 | n | 0 1 1 0 1 | 0 0 0 0 0 0 0 0 |
| | 4 | 11 - 24 | y | 1 1 0 0 0 →| 0 0 0 1 1 0 0 0 |
| | 5 | 14 - 14 | n | 0 1 1 1 0 | 0 0 0 1 1 0 0 0 |
| | 6 | 8 - 22 | y | 1 0 1 1 0 →| 0 0 0 1 0 1 1 1 0 |
| | 7 | 4 - 4 | n | 0 0 1 0 0 | 0 0 0 1 0 1 1 1 0 |
| | 8 | 0 - 4 | n | 0 0 1 0 0 | 0 0 0 1 0 1 1 1 0 |
| | 9 | 6 - 10 | n | 0 1 0 1 0 | 0 0 0 1 0 1 1 1 0 |
| | 10 | 13 - 23 | y | 1 0 1 1 1 →| 0 0 1 0 0 0 1 0 1 |
| | 11 | 1 - 1 | n | 0 0 0 0 1 | 0 0 1 0 0 0 1 0 1 |
| | 12 | 2 - 3 | n | 0 0 0 1 1 | 0 0 1 0 0 0 1 0 1 |
| | 13 | 12 - 15 | n | 0 1 1 1 1 | 0 0 1 0 0 0 1 0 1 |
| | 14 | 13 - 28 | y | 1 1 1 0 0 →| 0 0 1 1 0 0 0 0 1 |
| | 15 | 26 - 26 | y | 1 1 0 1 0 →| 0 0 1 1 1 1 0 1 1 |
| Reset, Residue | 16 | 19 - 19 | n | 1 0 0 1 1 →| 0 1 0 0 0 1 1 1 0 |

Residue 190    Image data 195

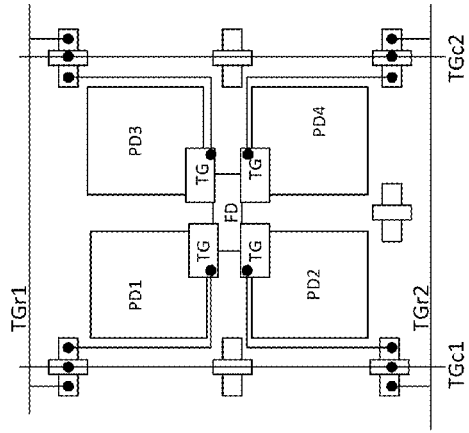
FIG. 17
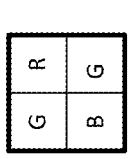
FIG. 18A
FIG. 18B
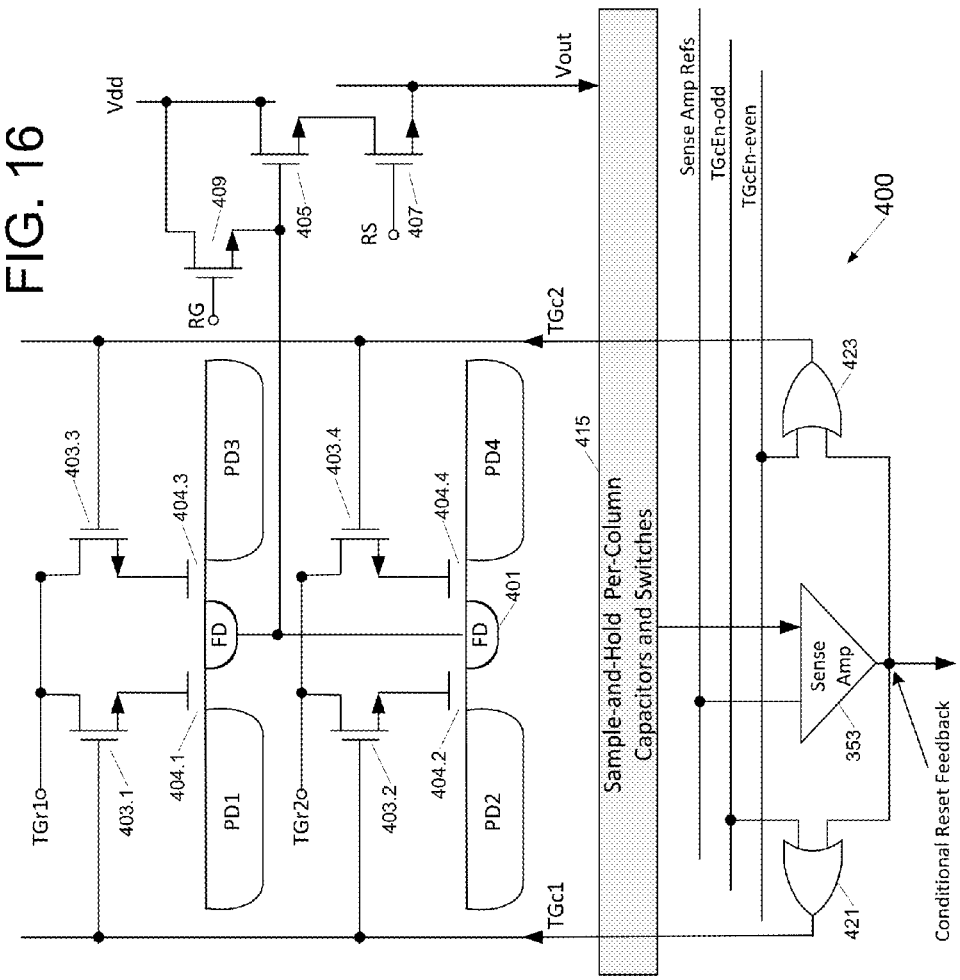
FIG. 16

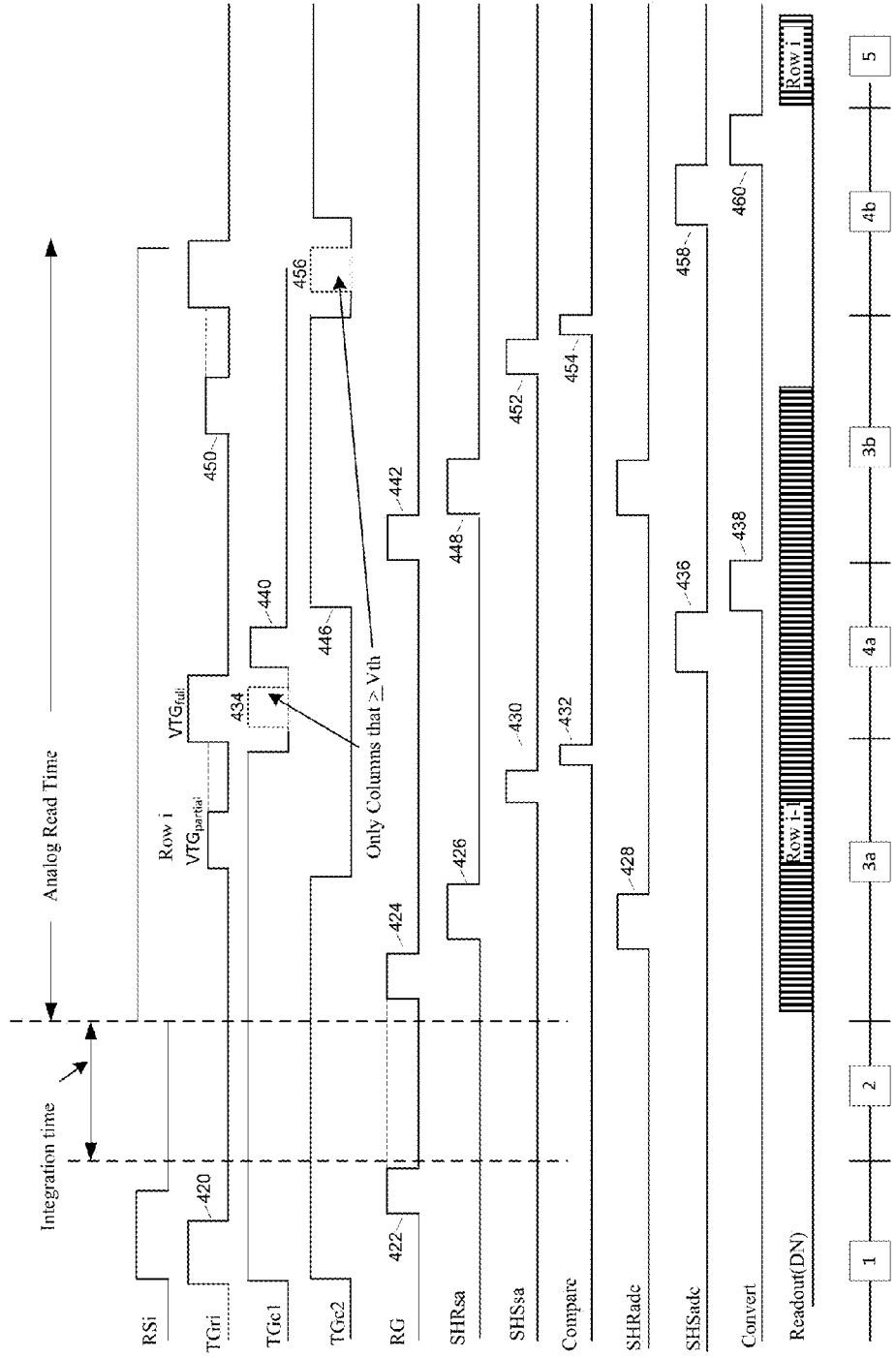
FIG. 19 Full Resolution Read-Out

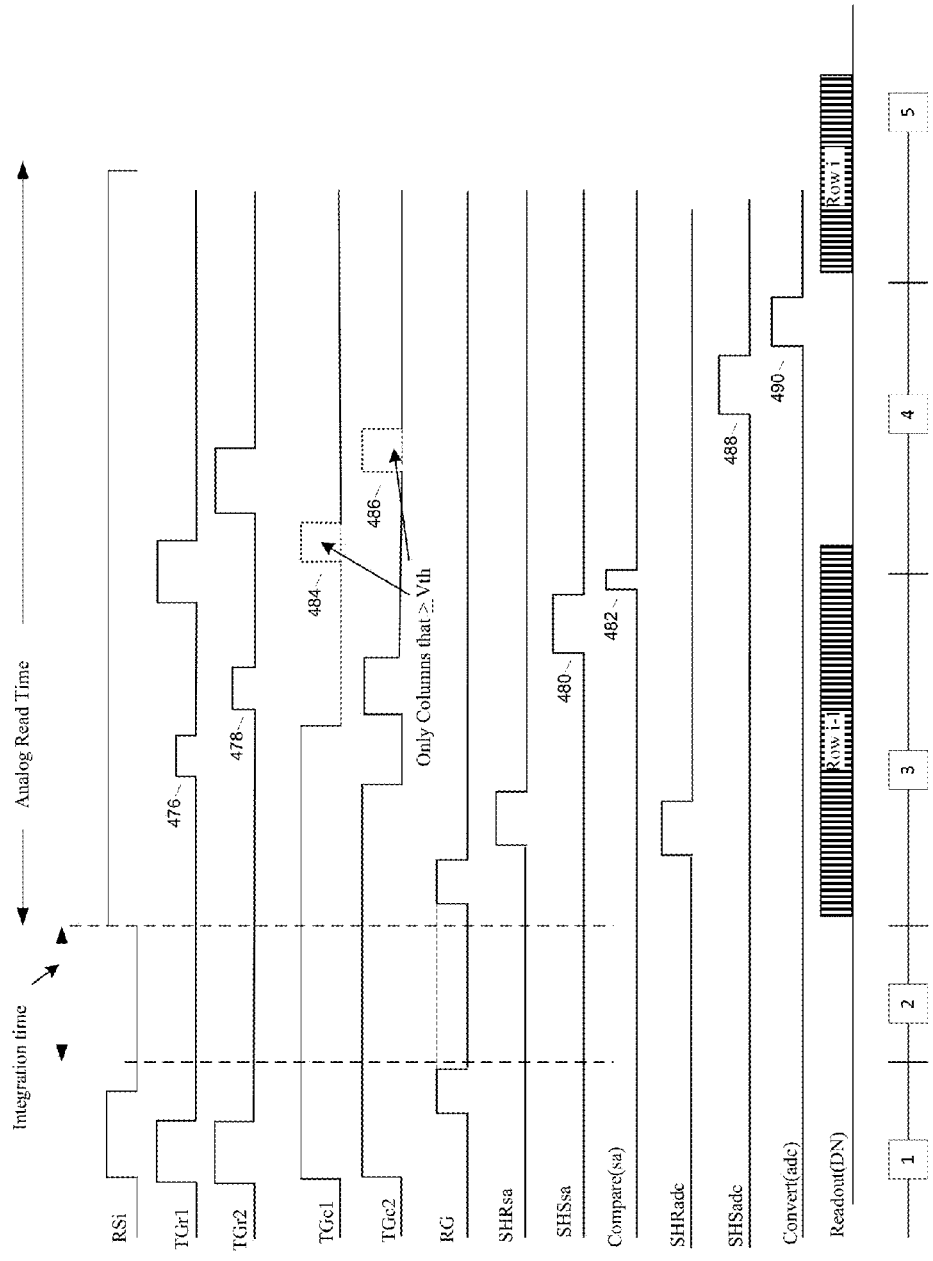
FIG. 20 Decimated (Binned) Read-Out

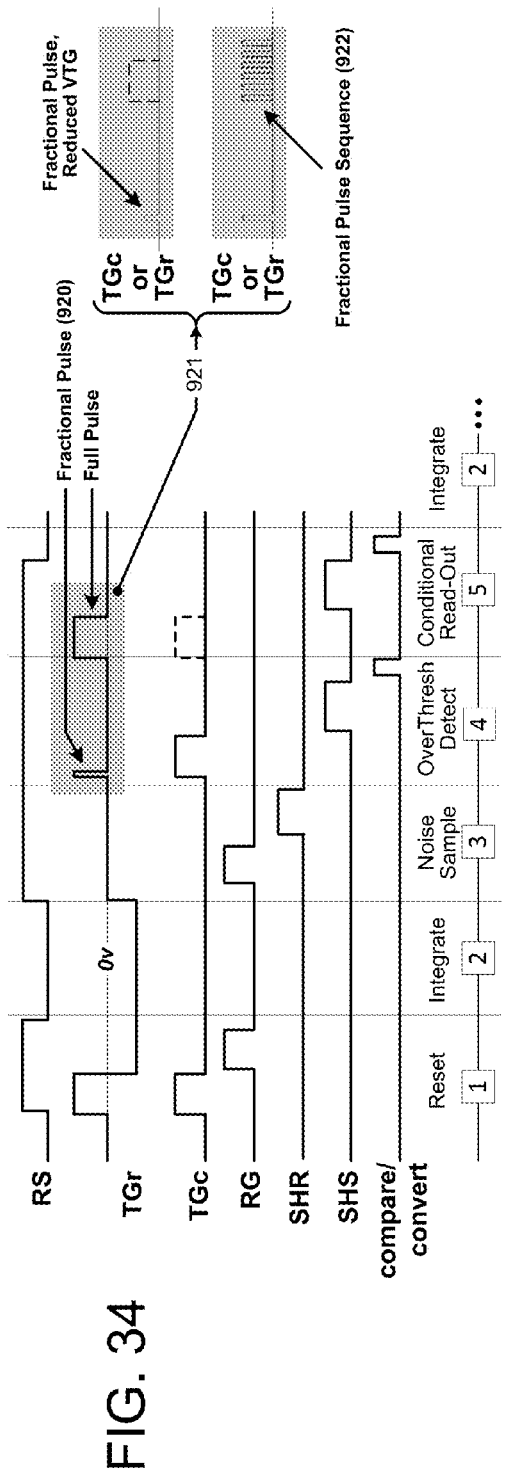
FIG. 34
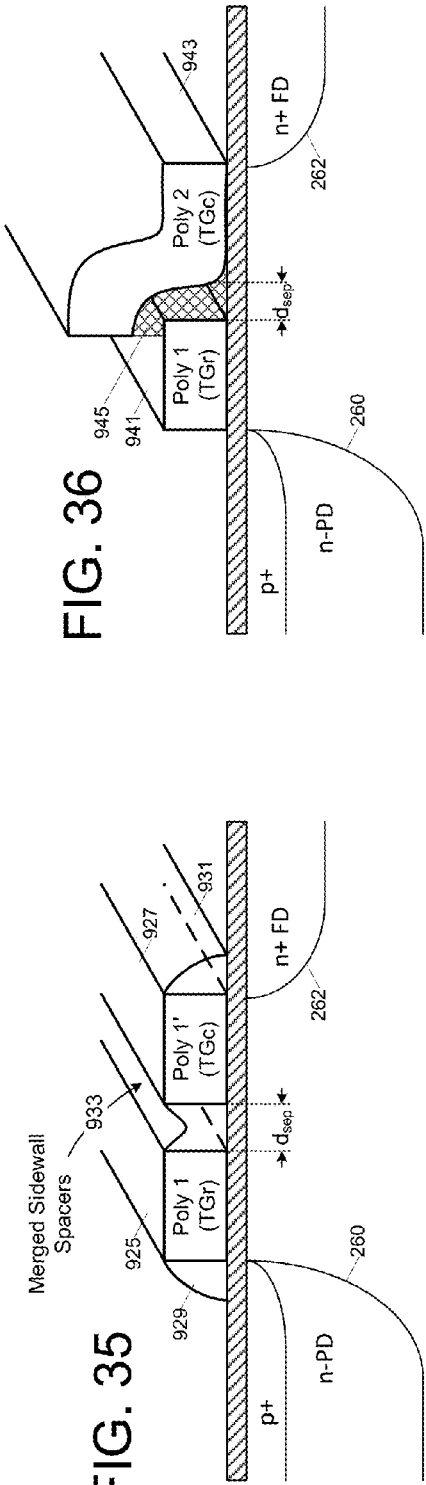
FIG. 35
FIG. 36

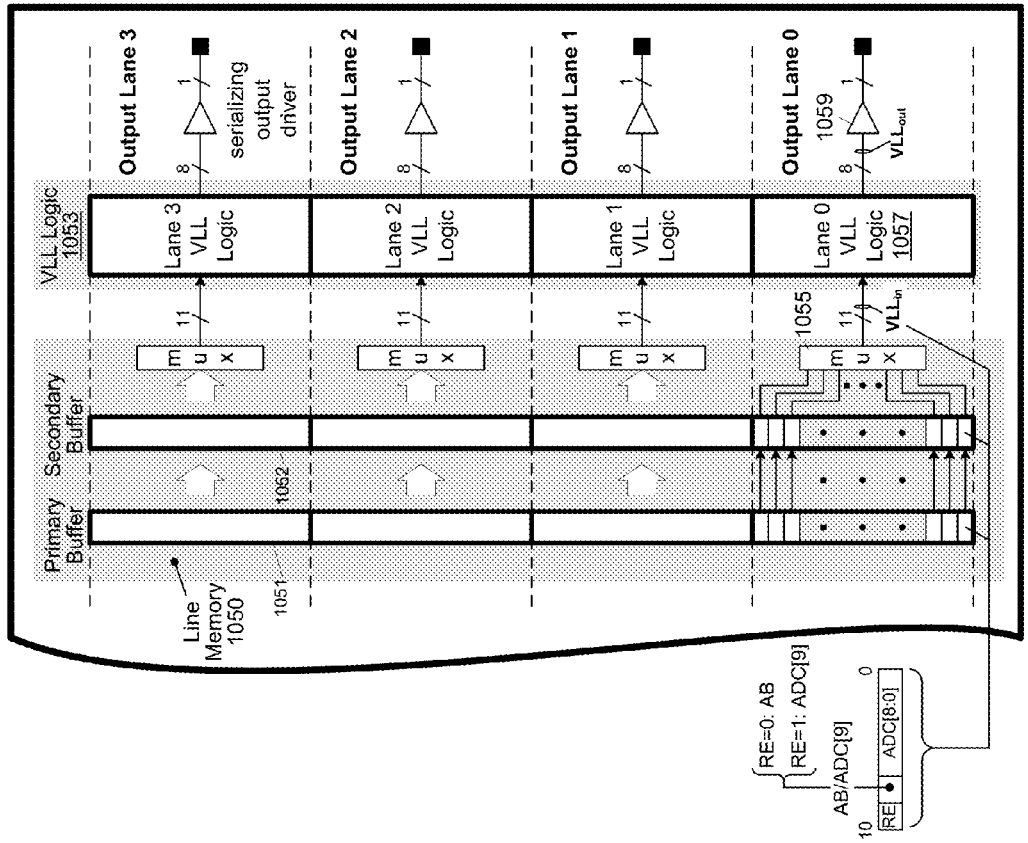
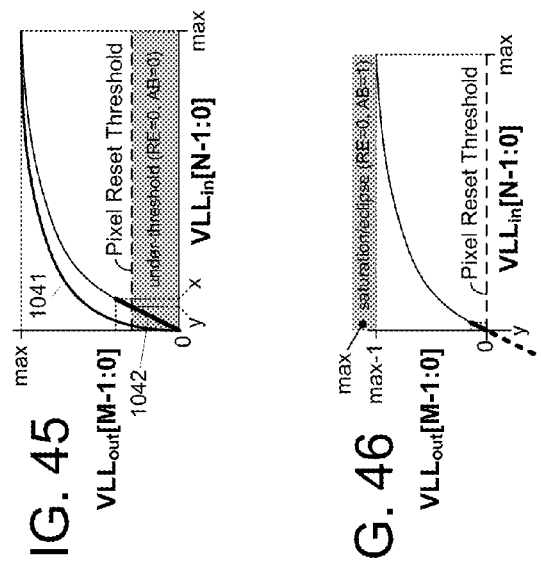
FIG. 45  FIG. 46  FIG. 47

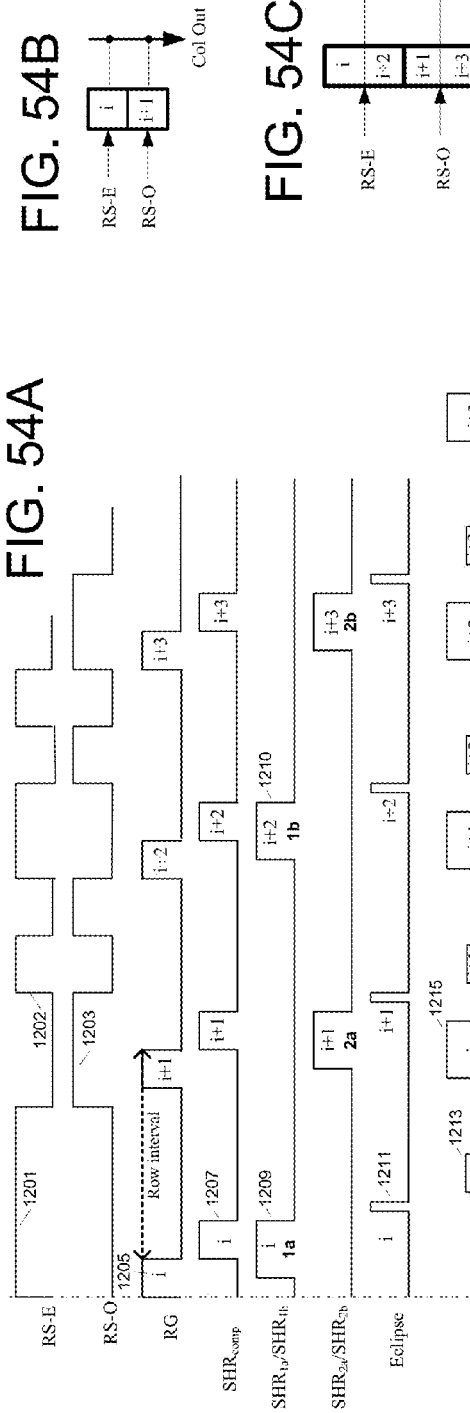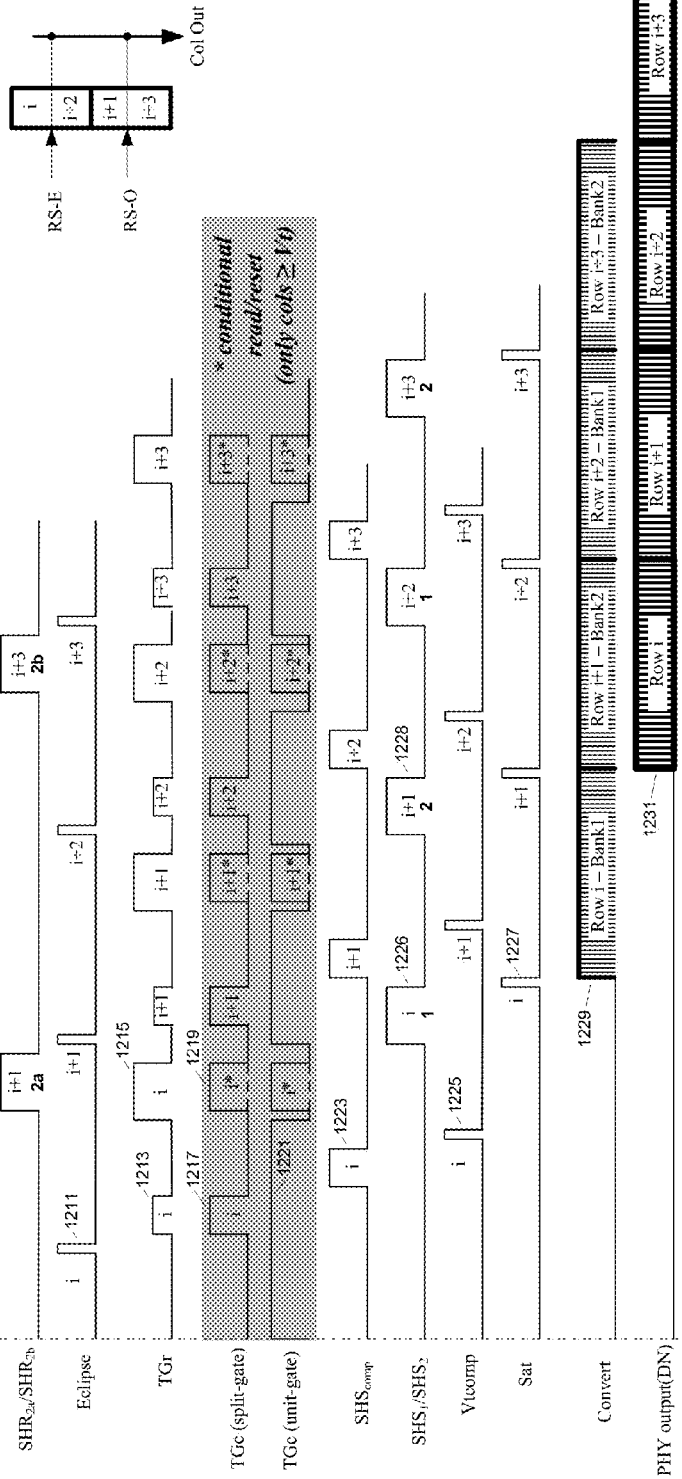
FIG. 54A
FIG. 54B
FIG. 54C

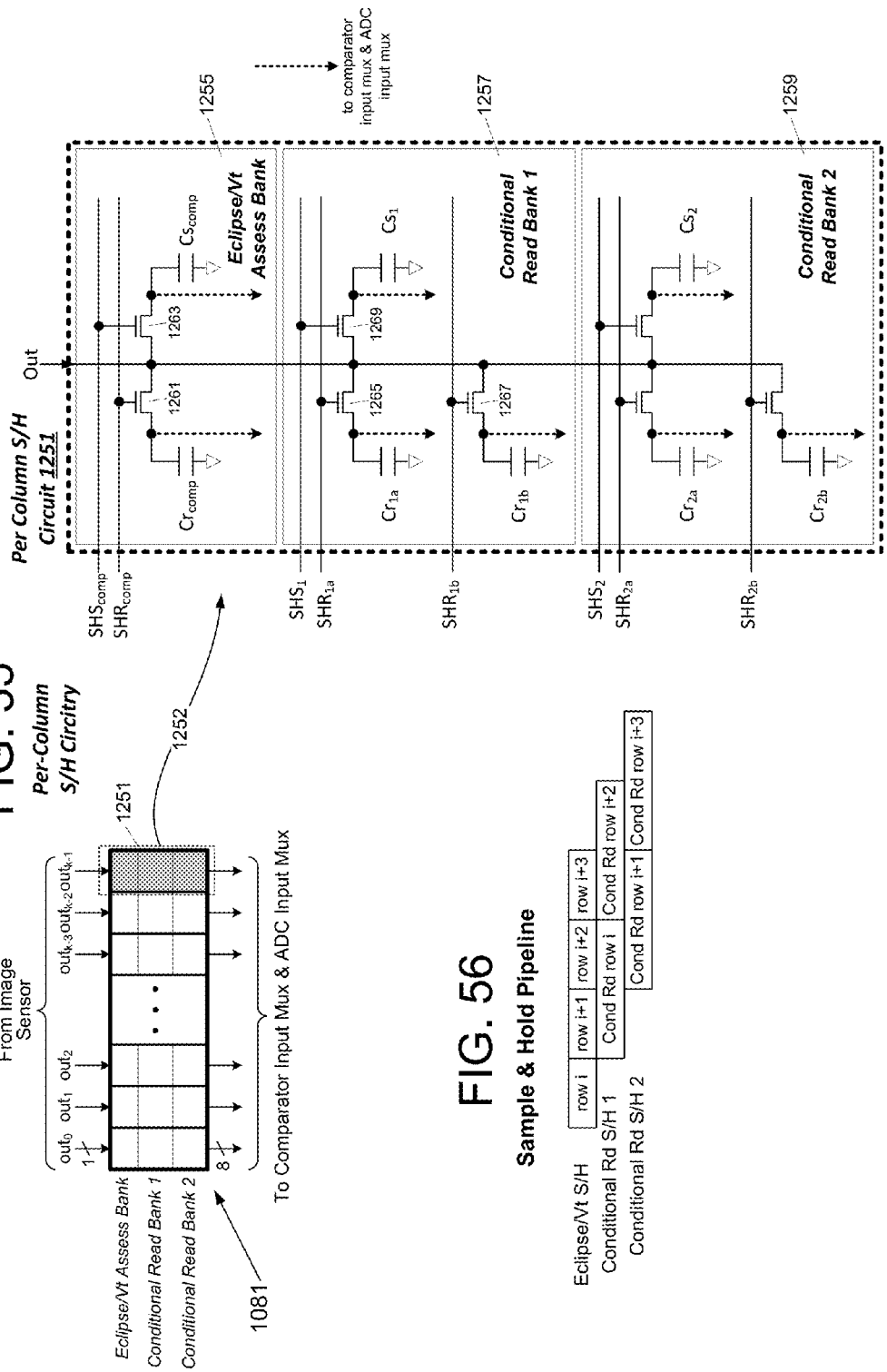

Readout Dilation

Readout Dilation within image sensor having 1x4 Shared-Readout pixel blocks

Readout Dilation within image sensor having 2x2 Shared-Readout pixel blocks

*Read Kernels*

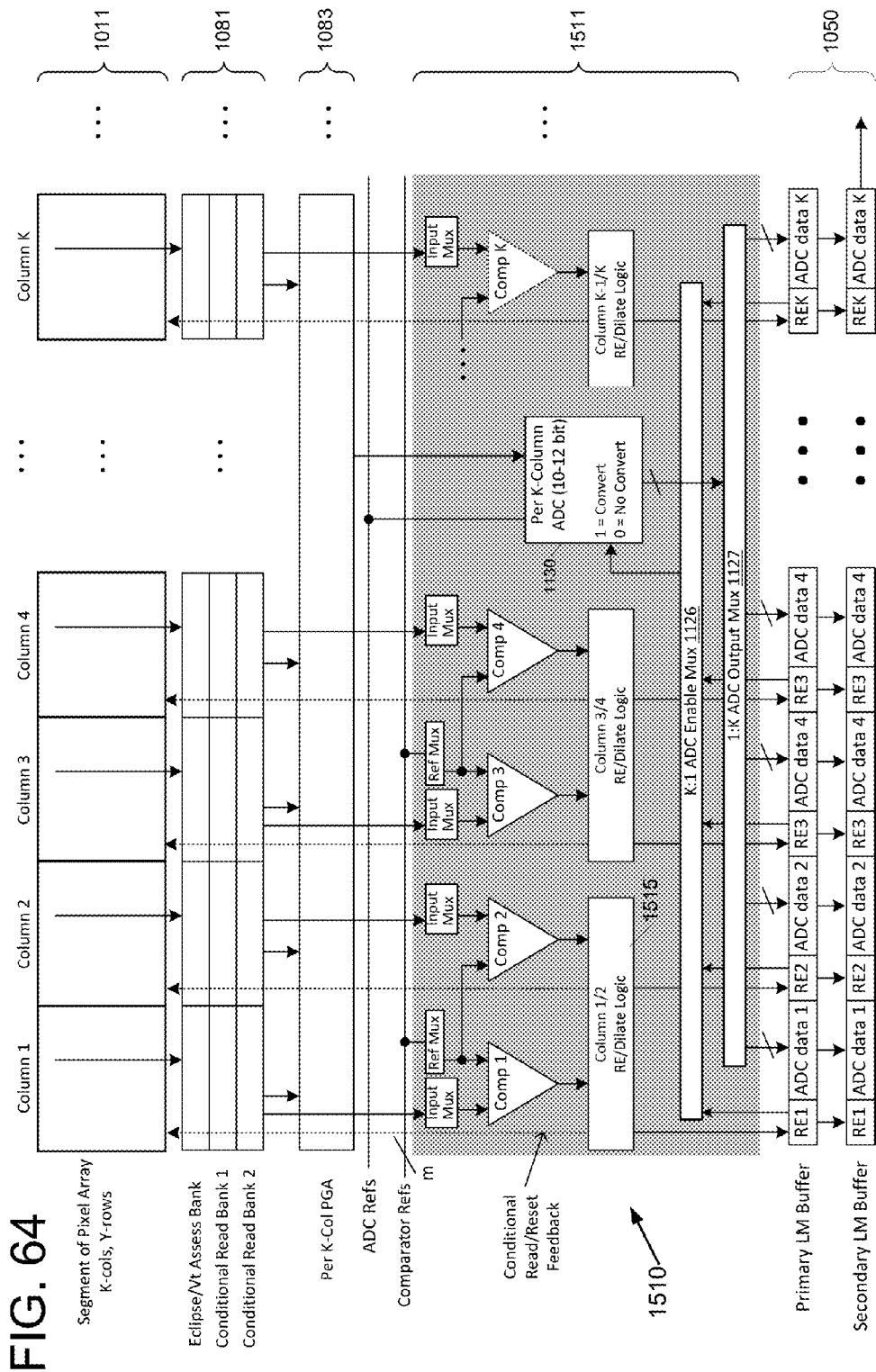

OVERSAMPLED IMAGE SENSOR WITH CONDITIONAL PIXEL READOUT

CROSS REFERENCE TO RELATED APPLICATIONS

This application claims priority to and hereby incorporates by reference U.S. Provisional Patent Application No. 61/875,882 filed Sep. 10, 2013 and entitled "Oversampled Image Sensor with Conditional Pixel Readout."

TECHNICAL FIELD

The present disclosure relates to the field of electronic image sensors, and more specifically to a sampling architecture for use in such image sensors.

BACKGROUND

Digital image sensors, such as CMOS or CCD sensors, include a plurality of photosensitive elements ("photosensors") each configured to convert photons incident upon the photosensors ("captured light" or "collected light") into electric charge. The electric charge can then be converted into image data representing the light captured by each photosensor. The image data includes a digital representation of the captured light, and may be manipulated or processed to produce a digital image capable of display on a viewing device. Image sensors are implemented in integrated circuits ("ICs") with a physical surface that may be divided into a plurality of pixel regions (for instance, one or more photosensors and attendant control circuitry) configured to convert light into an electrical signal (charge, voltage, current, etc.). For convenience, pixel regions within an image sensor may also be referred to as image pixels ("IPs") and the aggregate of the pixel regions or image pixels will be referred to as the image sensor region. An image sensor IC typically will also include areas outside of the image sensor region, for example certain types of control, sampling, or interface circuitry. Most CMOS image sensors contain A/D (analog-to-digital) circuitry to convert pixel electrical signals into digital image data. The A/D circuitry can be one or more ADCs (analog-to-digital converters) located within or at the periphery of the image sensor region.

BRIEF DESCRIPTION OF THE DRAWINGS

The various embodiments disclosed herein are illustrated by way of example, and not by way of limitation, in the figures of the accompanying drawings and in which like reference numerals refer to similar elements and in which:

FIG. 1 illustrates a cross-section of a portion of an image sensor, according to one embodiment;

FIG. 2 illustrates partial array circuitry of an analog pixel image sensor with multiple pixel signal thresholds, according to one embodiment useful, e.g., in the layout of FIG. 1;

FIG. 16 illustrates a quad-pixel, shared floating diffusion image sensor architecture in which the row and column transfer-gate control lines disclosed in the embodiments of FIGS. 10-14 may be applied in a manner that enables multiple decimation modes without requiring additional array-traversing control lines;

FIG. 17 illustrates an exemplary physical layout of the quad-pixel architecture shown in FIG. 16;

FIGS. 18A and 18B illustrate color filter array (CFA) patterns that may be employed with respect to the quad-pixel architecture of FIGS. 16 and 17;

FIGS. 19 and 20 present timing diagrams illustrating exemplary phases of full-resolution (non-binning) and binned-mode pixel read-out operations, respectively, within an image sensor containing the 2×2 quad-pixel arrangement shown in FIG. 16;

FIG. 34 illustrates an alternative overthreshold detection operation within the split-gate pixel of FIG. 31;

FIG. 35 illustrates an exemplary implementation of the dual-control gate shown in FIG. 31;

FIG. 36 illustrates an alternative manner of implementing the dual-control gate structure of FIG. 31;

FIG. 45 illustrates an exemplary compression function that may be applied within the VLL of FIG. 44 to convert an N-bit input to an M-bit output, where M is less than N.

FIG. 46 illustrates an exemplary threshold referenced VLL transform;

FIG. 47 illustrates embodiments of a line memory and VLL logic circuit that may be used to implement the line memory and VLL logic shown in FIG. 44;

FIG. 54A illustrates an exemplary timing diagram in accordance with the sensor architecture of FIG. 52 and operational sequence of FIG. 53, including alternate TGc waveforms corresponding to split-gate and continuous-gate pixel array embodiments, respectively;

FIGS. 54B and 54C present exemplary read-out sequences that may be employed with respect to even and odd rows of pixels.

FIG. 55 illustrates an embodiment of multi-bank sample-and-hold circuit that may be used to implement the sample-and-hold (S/H) circuitry depicted in FIG. 53;

FIG. 56 illustrates an exemplary sample and hold pipeline corresponding generally to the S/H bank usage intervals within the timing arrangement of FIG. 54;

FIG. 64 illustrates an exemplary K-column section of an image sensor having logic to carry out read-dilation operations as illustrated in FIGS. 62A/62B and 63A/63B.

DETAILED DESCRIPTION

Figure 3:
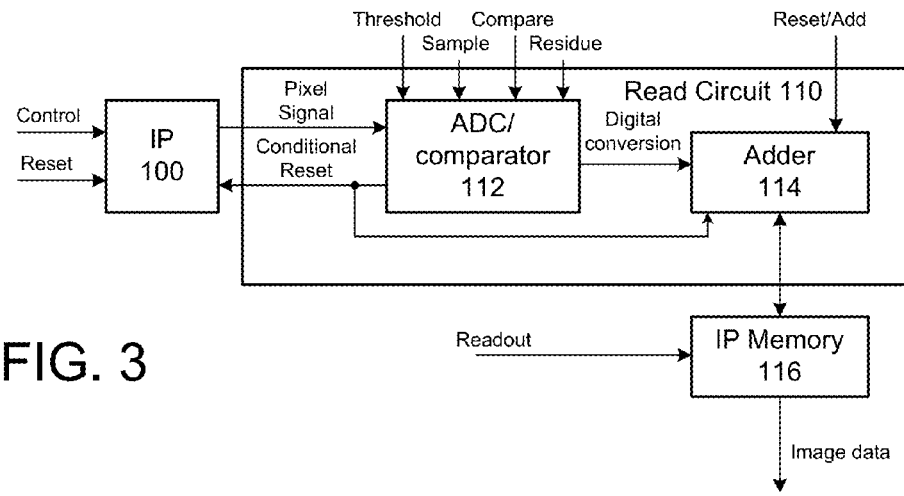
FIG. 3 illustrates an example image sensor read circuit configured to convert a pixel signal into a multi-bit digital conversion, according to one embodiment useful, e.g., with the embodiments of FIGS. 1 and 2.

In some image sensors, electrical information representing a photon response and resulting from light incident upon a pixel region (referred to herein as a "pixel signal") is converted to a digital image data value by read circuitry. The read circuitry can reside within the image sensor, or can be located external to the image sensor. In some approaches, a read circuit can be located within the image sensor for use by one or more pixel regions adjacent or near the read circuit. For read circuits located external to the image sensor, the pixel signals of one or more pixel regions associated with the read circuits can be transferred from the pixel regions to the read circuits.

Each read circuit samples a pixel region, receives a pixel signal from the sampled pixel region, and converts the pixel signal to a multi-bit digital value representative of the pixel signal. In the event that a pixel signal or a digital value representative of the pixel signal exceeds a sampling threshold, the pixel signal stored at the pixel region associated with the pixel signal is reset (for instance, by resetting a photosensitive element associated with the pixel region). If the pixel signal or the digital value do not exceed the sampling threshold, the pixel signal stored at the pixel region is not reset. The sampling of a pixel region and the resetting of a pixel signal at the pixel region only when the pixel signal exceeds a sampling threshold is referred to herein as "non-destructive sampling with conditional reset."

Image Sensor Overview

FIG. 1 illustrates a partial cross-section of an image sensor 25 useful in an embodiment. In image sensor 25, light passing through a microlens array 10 and a color filter array 12 (useful for color imaging) is incident upon a silicon section 20 of the image sensor. The use of microlenses (or other concentrating optics) and color filters is optional and is shown here for illustrative purposes only. Silicon 20 contains photodiodes (not shown) to collect charge generated by photons absorbed by the silicon, and access transistors (also not shown) to operate the photodiodes. Pixel array IC wiring 14 provides connections used to route signals and supply voltages within the array. As shown, image sensor 25 is a BackSide Illuminated (BSI) sensor because light enters the silicon from the side of the integrated circuit opposite the wiring layers and primary active circuit formation. Optionally, pixel array IC wiring 14 can be arranged between the color filter array 12 and silicon 20 (with primary active circuit formation within the "top" of the silicon as oriented in FIG. 1) for FrontSide Illumination (FSI).

The image sensor 25 includes a plurality of IPs ("image pixels"), IP1-IP3 shown, upon which light collected by the lenses of the microlens array 10 is respectively incident. Each IP includes one or more photodiodes embedded within the silicon 20. At least some photons entering silicon 20 are converted to electron-hole pairs in the silicon and the resulting electrons (or holes in alternate embodiments) are collected by the IPs. The description herein will refer to this process as the capture and conversion of light by the IPs into image data for the purposes of simplicity. Each IP of the image sensor represents a portion of the surface area of the image sensor, and the IPs of the image sensor may be organized into various arrays of columns and rows. In a CMOS or CCD image pixel technology, each IP (for instance, each photosensor) converts light incident upon the IP into a charge and includes readout circuitry configured to convert the charge into a voltage or current. In one embodiment, the light captured by each IP of the image sensor represents one pixel of image data for an associated digital image, though in other embodiments image data from multiple IPs is combined to represent a fewer number (one or more) of pixels (downscaling).

The image sensor 25 may include components outside the IP array. Similarly, portions of the IP array may include components that do not convert light into charge. The region defined by the IPs in the aggregate will be referred to as the image sensor region. As described herein, the image sensor may include amplifiers, analog-to-digital converters ("ADCs"), comparators, controllers, counters, accumulators, registers, transistors, photodiodes, and the like. In different architectures, some of these components may be located within the image sensor region or external to the image sensor region, and some components may be located on a companion integrated circuit. In these embodiments, a lens (such as those of the microlens array 10) may be configured to direct light toward the actual light-sensing elements within the IP rather than, for example, on the amplifiers, comparators, controllers, and other components.

As noted above, an image sensor may include an array of multiple IPs. Each IP, in response to light (for instance, one or more photons), captures and stores a corresponding charge. In one embodiment, upon sampling an IP, if a pixel signal representative of the charge stored at the IP exceeds a sampling threshold, the pixel signal is converted to a digital value representing the pixel signal and the charge stored by the IP is reset. Alternatively, upon sampling an IP, a pixel signal representative of the charge stored at the IP is converted to a digital value representative of the pixel signal, and if the digital value exceeds a sampling threshold, the charge stored by the IP is reset. In other embodiments, an analog-to-digital conversion is begun, and when enough of the conversion has been completed to determine whether the threshold is exceeded, a determination is made as to whether to continue the conversion. For instance, in a successive approximation register ("SAR") ADC, if the threshold is equal to a most-significant-bit(s) pattern, as soon as the pattern is resolved a determination can be made as to whether to continue the conversion and perform a reset of the pixel, or stop the conversion. A determination of whether a pixel signal or a digital value representative of a pixel signal exceeds a sampling threshold can be made through the use of a comparator configured to compare the pixel signal or the digital value to a sampling threshold.

FIG. 2 illustrates an analog pixel image sensor with multiple pixel signal thresholds, according to one embodiment. The image sensor of FIG. 2 is a CMOS sensor, and includes an IP array 40. The IP array can include any number of columns and rows, with any number of IPs per column and per row. IP column 50, a column representative of full or partial IP columns in the IP array, is highlighted in FIG. 2. The IP column 50 includes a plurality of IPs communicatively coupled via the column line 55. IP 60, an IP representative of IPs in the IP array, is highlighted in FIG. 2.

The IP 60 includes a photo diode 65 together with control elements that enable the photo diode to be precharged in preparation for exposure and then sampled after exposure. In operation, a transistor 70 is switched on to couple the cathode of the photo diode to a voltage source and thus "precharge" the cathode of the photo diode to a precharge voltage. The transistor 70 is switched off at or before the start of an exposure interval. With the transistor 70 off, the cathode voltage incrementally discharges in response to photon strikes, lowering the photo diode potential, $V_{DET}$, in proportion to the amount of light detected. At the conclusion of the exposure interval, an access transistor 72 is switched on to enable a signal representative of the photo diode potential to be amplified/driven onto the column line 55 via follower-transistor 74 as pixel signal 80.

An ADC 85 is communicatively coupled to the IP column 50 via the column line 55. In the embodiment of FIG. 2, the ADC is located at the edge of the pixel array 40, and may be located within or external to the image sensor on which the IP array is located. The ADC receives the pixel signal 80 (the representation of the analog photo diode potential) from the IP 60. The ADC digitizes the pixel signal to generate a 3-bit digital value ("Pix[2:0]") representative of the pixel signal. The ADC includes 7 pixel thresholds, Threshold 1 to Threshold 7 (referred to herein as "$V_{T1}$ to $V_{T7}$"). If the magnitude of the pixel signal is less than $V_{pre}$ but greater than $V_{T1}$, the ADC converts the pixel signal to the digital value "000". Pixel signals less than $V_{T1}$ but greater than $V_{T2}$ are converted to the digital value "001", pixel signals between $V_{T2}$ and $V_{T3}$ are converted to "010", and so forth, up to pixel signals less than $V_{T7}$, which are converted to "111".

In the embodiment of FIG. 2, the potential difference between successive pixel thresholds is approximately the same (e.g., $V_{T3}-V_{T4} \approx V_{T5}-V_{T6}$). In other words, the pixel thresholds are linearly distributed between $V_{T1}$ and $V_{T7}$. In addition, in the embodiment of FIG. 2, the potential difference between $V_{pre}$ and $V_{T1}$ is greater than the potential difference between successive pixel thresholds (e.g., $V_{pre}-V_{T1}>V_{T3}-V_{T4}$), although in other embodiments all steps are equal. The selection of $V_{T1}$ such that $V_{pre}-V_{T1}>V_{T3}-V_{T4}$ reduces the effect of, e.g., dark noise when sampling an IP. The potential difference between $V_{T7}$ and $V_{floor}$ in the embodiment of FIG. 2 also can be greater than the potential difference between successive pixel thresholds (e.g., $V_{T7}-V_{floor}>V_{T3}-V_{T4}$). Finally, instead of linear threshold spacing, a given embodiment can space the thresholds exponentially, e.g., with each threshold spacing doubling from the one below, or in another pre-determined way that can be converted back to linear. For systems that accumulate multiple ADC samples to form an image, non-linear spacing is converted to a linear value prior to accumulation.

$V_{floor}$ represents the pixel saturation threshold at which the cathode voltage of the photo diode 65 no longer linearly discharges in response to photon strikes. For pixel signals within the linear sensitivity region 90, the conversion of pixel signals to digital values is shown in graph 95. It should be noted that the maximum number of detectable photon strikes (i.e., the pixel saturation point) is proportional to the capacitance of the photo diode and thus its physical size. Consequently, in a traditional sensor design the photo diode footprint is dictated by the dynamic range required in a given application and does not scale appreciably with shrinking process geometries.

During the capture of an image, in one embodiment the IPs of a given row or rows in the IP column 50 and each other column in the IP array 40 are successively sampled and the pixel signals associated with each are converted into digital values using the ADC or ADCs associated with each column. The digital values output by the ADCs are accumulated (conditionally in some embodiments, as explained below) and stored during the image capture period. Other types and configurations of IPs than that illustrated in FIG. 2 can be used in the image sensor system. For instance, a different arrangement of transistors can be used than the transistors 70, 72, and 74. In addition, although one ADC 85 is shown in FIG. 2 in conjunction with the IP column 50, in other embodiments, more than one ADC can be used per IP column, with different ADC groups serving different sections of the array rows of the ADC column. Additional combinations of ADCs (in the form of read circuits) and IPs are described below in greater detail. Finally, the output of the ADC (e.g. Pix[2:0] in the embodiment of FIG. 2) can be any multi-bit length, and can be associated with any number of thresholds distributed in any manner between $V_{pre}$ and $V_{floor}$.

Image Sensor System with Multi-Bit Sampling and Conditional Reset

FIG. 3 illustrates an example image sensor read circuit configured to convert a pixel signal into a multi-bit digital conversion, according to one embodiment. The embodiment of FIG. 3 illustrates an IP 100, an IP memory 116, and a read circuit 110, the read circuit including an ADC/comparator circuit 112 (hereinafter "ADC/comparator") and an adder 114. It should be noted that in other embodiments, the modules of FIG. 3 can include additional, fewer, and/or different components. For example, the ADC/comparator can be implemented as separate components, and the adder can be located external to the read circuit.

The IP 100 represents an IP in an image sensor, and can be, for instance, the IP 60 of FIG. 2. The IP 100 receives one or more control signals, for instance from external control logic. A control signal can enable the IP to begin an image capture, for instance by resetting the IP to Vpre and enabling the exposure of the IP's photosensitive element to light to result in the storing of charge relative to Vpre. Similarly, a control signal can enable the IP to end an image capture, for instance by disabling the exposure of the IP's photosensitive element to light after the passing of an image capture period. A control signal can also enable the outputting of a pixel signal by an IP and the subsequent conversion of the pixel signal to a digital value representative of the pixel signal by a read circuit (referred to herein as "sampling the IP" or "sampling the pixel signals"). As described above, a pixel signal can be a representation of the integrated charge (e.g., a source follower voltage, an amplified voltage, or a current having a component proportional to the integrated charge).

The IP 100 receives a reset signal, for instance from external control logic. The reset signal resets the charge stored by the IP to Vpre, for instance at the beginning of an image capture period. The IP also receives a conditional reset signal from the ADC/comparator 112 (in some circuits, the conditional reset and initial reset are supplied using common circuitry). The conditional reset signal resets the charge stored by the IP, for instance during an image capture period in response to a pixel signal exceeding a sampling threshold when the IP is sampled. It should be noted that in other embodiments, the conditional reset signal is received from a different entity. In one implementation, the ADC/comparator may determine that the pixel signal exceeds a sampling threshold, and may enable external control logic to output a conditional reset signal to the IP; in such an embodiment, the reset signal (a row-wise signal) and the conditional reset signal (a column-wise signal) may be ANDed by the IP to initiate all resets. For simplicity, the remainder of the description will be limited to embodiments in which the ADC/comparator provides conditional reset signals to the IP.

The read circuit 110 receives a threshold signal, a sample signal (or "sample enable signal"), a compare signal (or "compare enable signal"), a residue signal (or "residue enable signal"), and a reset signal, for instance from external control logic, and receives pixel signals from the IP 100. The IP memory element 116 corresponding to IP 100 receives a readout signal that selects it for readout/write by adder 114 and for external readout. The ADC/comparator 112 samples the IP 100 in response to receiving one or more sample signals. During an image capture, the ADC/comparator receives a sample signal at various sampling intervals, for instance periodically or according to a pre-defined sampling interval pattern (referred to herein as a "sampling policy"). Alternatively, the sample signal received by the ADC/comparator can include a sampling policy, and the ADC/comparator can be configured to sample the IP based on the sampling policy. In other embodiments, the IP receives one or more sample signals and outputs pixel signals based on the received sample signals. In yet other embodiments, the IP outputs pixel signals periodically or according to a sampling policy, or the ADC/comparator samples pixel signals periodically or according to a sampling policy, independent of received sample signals. The ADC/comparator can request a pixel signal from the IP prior to sampling the pixel signal from the IP.

During a sampling of the IP, the ADC/comparator 112 receives a pixel signal from the IP and converts (optionally in some embodiments based on the pixel signal exceeding the sampling threshold) the pixel signal to a multiple-bit digital value representative of the pixel signal. If the pixel signal exceeds a sampling threshold, the ADC/comparator outputs a conditional reset signal to reset the charge stored at the IP. If the pixel signal does not exceed a sampling threshold, the ADC/comparator does not output a conditional reset signal to reset the charge stored at the IP. The sampling threshold can be varied during the image capture and received via the threshold signal, or can be pre-determined or preset for a given image capture. One sampling threshold can be used during multiple image captures, different sampling thresholds can be used for different image captures, and multiple sampling thresholds can be used during a single image capture. In one embodiment, the sampling threshold varies in response to detected changing light conditions (for instance, the sampling threshold can decrease in response to low light conditions, and can increase in response to high light conditions).

In one embodiment, the sampling threshold is an analog signal threshold. In this embodiment, the ADC/comparator 112 includes an analog comparator and compares the pixel signal to the sampling threshold to determine if the pixel signal exceeds the sampling threshold. If the pixel signal includes a voltage representative of the charge stored by the IP 100, the sampling threshold is exceeded if the pixel signal is lower than the sampling threshold. Using the embodiment of FIG. 2 as an example, if the sampling threshold of the ADC/comparator is Threshold 4, then the pixel signal will exceed the sampling threshold only if the pixel signal includes a voltage lower than the voltage associated with Threshold 4.

In one embodiment, the sampling threshold is a digital signal threshold. In this embodiment, the ADC/comparator 112 includes a digital comparator, and first converts the pixel signal to a digital value representative of the pixel signal. The ADC/comparator then compares the digital value to the sampling threshold to determine if the pixel signal exceeds the sampling threshold. Using the embodiment of FIG. 2 as an example, for a sampling threshold of "101", if the ADC/comparator converts a pixel signal to a digital value of "001" (indicating that the pixel signal is between Threshold 1 and Threshold 2), then the pixel signal does not exceed the sampling threshold and a conditional reset signal is not outputted. However, if the ADC/comparator converts a pixel signal to a digital value of "110" (indicating that the pixel signal is between Threshold 6 and Threshold 7), then the pixel signal does exceed the sampling threshold and a conditional reset signal is outputted.

In another embodiment, the sampling threshold is a digital signal threshold that can be evaluated prior to the complete digital conversion of the pixel signal. This can be advantageous in some embodiments or use cases to allow faster conditional reset of a pixel, and/or power savings by avoiding unneeded ADC operations. For instance, with a successive approximation register ADC, multiple clock cycles are used to resolve the digital representation of the pixel signal. The first clock cycle resolves the most significant bit, the second clock cycle the next most significant bit, etc., until all bit positions have been resolved. Using the embodiment of FIG. 2 as an example, for a sampling threshold of "100," a determination of whether the threshold is met or not can be resolved after the first SAR ADC clock cycle. For a sampling threshold of "110," a determination of whether the threshold is met or not can be resolved after the second SAR ADC clock cycle. For embodiments with a bit depth of, e.g., 6 or 8 bits, making a reset determination after one or two conversion cycles can result in significant time/power savings, which can be realized by selecting a sampling threshold with one or more LSBs that are 0.

In one embodiment, a row-wise compare signal is supplied to each ADC/comparator "compare" signal input, and signals the ADC/comparator as to the appropriate clock cycle to perform the comparison. When the compare signal is asserted, the comparison is performed based on the current state of the analog-to-digital conversion. If the threshold is met by the compare for ADC/comparator 112, the conditional reset signal is asserted to IP 100 and to adder 114, and the SAR ADC continues converting the pixel signal. If the threshold is not met, the conditional reset signal is not asserted, and can be used in conjunction with the compare signal to gate the clock signal of SAR ADC to terminate the conversion.

The ADC/comparator 112 outputs a digital value representative of a pixel signal received by the ADC/comparator (referred to herein as a "digital conversion") to the adder 114. The ADC/comparator 112 can output a digital conversion in response to the pixel signal associated with the digital conversion exceeding a sampling threshold. The conditional reset signal can be used as an enable to signal to the adder 114 to load the digital conversion and add it to the IP memory 116 location corresponding to IP 100 (which in this embodiment is selected from a plurality of such locations by address selection of the readout line). In other embodiments, the ADC/comparator outputs a digital conversion during each sampling of the IP 100, regardless of whether the pixel signal associated with the digital conversion exceeds a sampling threshold. In these embodiments, the adder can be configured to accumulate digital conversions associated with pixel signals that exceed a sampling threshold and to disregard digital conversions associated with pixel signals that do not exceed a sampling threshold. Alternately, if the threshold is set to "001" in FIG. 2, for example, the adder can unconditionally add the digital conversion to IP memory 116 each time IP 100 is read, while still producing correct results. In some embodiments, adder 114 may be configured to execute a weighted sum in which the value to be accumulated is multiplied with a weighting factor prior to adding to the IMP memory 116. The weight factor can depend on the sampling policy, the sub-frame being added, etc.

In one embodiment, the ADC/comparator 112 also outputs a digital conversion in response to receiving a residue signal assertion (without the compare signal being asserted). The residue signal assertion is associated with the end of an image capture, and enables the ADC/comparator to output a full digital conversion to the adder 114 regardless of whether the pixel signal associated with the digital conversion exceeds a sampling threshold, and asserts the conditional reset. The residue signal can prevent the loss of image information associated with light received by the IP 100 but not surpassing the threshold at the end of a capture period. If the pixel signal representative of such received light does not exceed the sampling threshold, the ADC/comparator otherwise may not output the digital conversion associated with the pixel signal, and the charge stored by the IP would not be reset by the conditional reset signal (which is also triggered by assertion of the residue signal). In embodiments where the ADC/comparator outputs digital conversions to the adder regardless of whether the pixel signals associated with the digital conversions exceed a sampling threshold, the adder can receive the residue signal, and can be configured to accumulate a digital conversion associated with a pixel signal received at the end of a capture period in response to receiving the signal.

The adder 114 is configured to accumulate digital conversions received during a capture period. As discussed above, in embodiments in which the ADC/comparator 112 outputs digital conversions only if the pixel signals associated with the digital conversions exceed a sampling threshold, the adder accumulates all received digital conversions (including the additional digital conversion output by the ADC/comparator in response to receiving a residue signal) into IP memory 116. In embodiments in which the ADC/comparator outputs digital conversions associated with each received pixel signal, the adder accumulates only the digital conversions associated with pixel signals that exceed the sampling threshold, plus the digital conversion output by the ADC/comparator in response to receive a residue signal, into IP memory 116; such embodiments require the adder to be aware of when pixel signals exceed a sampling threshold and when a residue signal is received, and are not discussed further herein for the purpose of simplicity.

The adder 114 receives reset/add control signaling, for instance from external control logic. In response to receiving a reset signal (for instance at the beginning of an image capture period), the accumulator stores all zeros to the selected IP memory location 116 the accumulation of received digital conversions as image data. The adder also receives a reset signal and resets the accumulation of received digital conversions.

In alternative embodiments, the adder is located external to the read circuit 110. For instance, the ADC/comparator can output a stream of conversions to a digital channel (e.g., multiplexed with other conversions from other ADCs) to a separate circuit that supplies the accumulation function. In such a case, the ADC/comparator must also output a symbol for "no conversion," which can be 0. One possibility is for a circuit in the digital channel interface (e.g., PHY 134 in FIG. 4) to code digital conversions to reduce bandwidth. A "no conversion" in one embodiment is output as a "00," a upper threshold exceeded ADC conversion is output as a "01," and all other ADC conversions are output as "1xxxxxx," where an x represents one of the resolved bits of the ADC conversion and the number of x positions is equal to the bit depth of the ADC.

In one embodiment, the IP is configured to output a pixel signal and receive a conditional reset on the same line. In this embodiment, the IP and the ADC/comparator 112 alternately drive the pixel signal and the conditional reset on the shared line. For example, the IP can output a pixel signal on the shared line during a first portion of a sample period, and can receive conditional resets on the shared line during a second portion of a sample period. Finally, the ADC/comparator can receive a threshold signal, a sample signal, and a residue signal on a shared line. For example, the ADC/comparator can receive a threshold signal at the beginning of an image capture, can receive sample signals throughout the image capture period, and can receive a residue signal at the end of the image capture period. It should also be noted that the reset signal received by the IP can be the same reset signal received by the accumulator 114, and can be received on a shared line.

Figure 4:
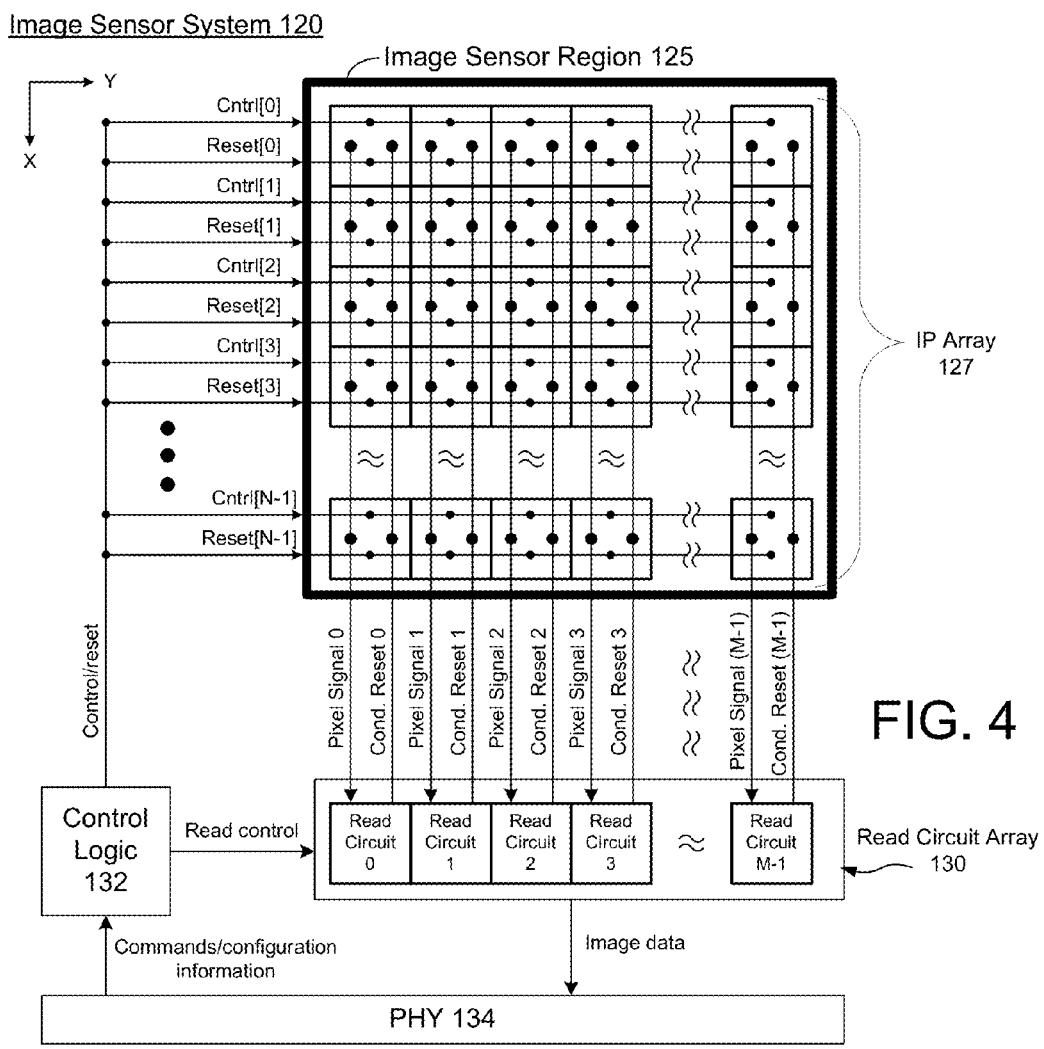
FIG. 4 illustrates an example circuit block diagram embodiment of an image sensor system with a multi-bit architecture, according to one embodiment using, e.g., the cross-section of FIG. 1 and the circuitry of FIGS. 2 and 3.

FIG. 4 illustrates an example embodiment of an image sensor system with a multi-bit architecture, according to one embodiment. The image sensor system 120 of FIG. 4 includes an image sensor region 125, a read circuit array 130, control logic 132, and a physical signaling interface 134. In other embodiments, the image sensor system may include fewer, additional, or different components than illustrated in the embodiment of FIG. 4 (for instance, the circuit may have memory 116 integrated therewith). The image sensor system shown in FIG. 4 can be implemented as a single IC, or can be implemented as multiple ICs (for instance, the image sensor region and the read circuit array can be located on separate ICs). Further, various components (such as the read circuit array, the control logic, and the physical signaling interface) can be integrated within the image sensor region 125.

For purposes of example, the image sensor system 120 and a host IC (not shown in FIG. 4) communicatively coupled to the image sensor system are assumed to form the primary image acquisition components within a camera (e.g., a still-image or video camera within a mobile device, compact camera, digital SLR camera, stand-alone or platform-integrated webcam, high-definition video camera, security camera, automotive camera, etc.). The image sensor IC and host IC can be more generally deployed alone or together with like or different imaging components within virtually any imaging system or device including without limitation metrology instruments, medical instruments, gaming systems or other consumer electronics devices, military and industrial imaging systems, transportation-related systems, space-based imaging systems and so forth. Operation of the image sensor system generally involves the capture of an image or frame through the exposure of IPs to light, the conversion of stored charge as a result of the exposure into image data, and the outputting of the image data to a storage medium.

The image sensor region 125 includes an IP array 127 including N-rows (indexed from 0 to N−1) and M-columns (indexed from 0 to M−1). The physical signaling interface 134 is configured to receive commands and configuration information from a host IC (e.g., a general-purpose or special-purpose processor, application-specific integrated circuit (ASIC) or any other control component configured to control the image sensor IC), and is configured to provide the received commands and configuration information to the control logic 132. The physical signaling interface is also configured to receive image data from the read circuit array 130 and to output received image data to the host IC.

The control logic 132 is configured to receive commands and configuration information from the physical signaling interface 134, and is configured to transmit signals configured to manipulate the operations and functionality of the image sensor system 120. For example, in response to receiving a command to capture an image or frame, the control logic may output a series of exposure signals (configured to cause IPs to reset) and sample signals (configured to cause the read circuits in the read circuit array 130 to sample the pixel signals from the IPs in the IP array 127), enabling the capture of the image or frame by the image sensor system. Similarly, in response to receiving a command to initialize or reset the image sensor system, the control logic may output reset signals configured to reset each IP in the IP array, causing each IP to disregard any accumulated charge. The control signals produced by the control logic identify particular IPs within the IP array for sampling, may control the functionality of read circuits associated with IPs, or may control any other functionality associated with the image sensor system. The control logic is shown in FIG. 4 as external to the image sensor region 125, but as noted above, all or portions of the control logic may be implemented locally within the image sensor region.

The control logic 132 outputs control and reset signals for each IP in the image sensor region 125. As illustrated in the embodiment of FIG. 4, each IP in an image pixel IP[X][Y] receives a row-parallel Cntrl[X] signal (corresponding to a "row" select control signal for each IP) and a row—parallel Reset[X] signal from the control logic to reset the IPs, wherein "X" and "Y" refer to the coordinates of the IP within the image sensor region. Although the control signal and reset signals received at any given IP are each only 1 bit as indexed in the embodiment of FIG. 4, it is to be appreciated that such an indexing is done for the purposes of simplicity only, and that these signals may in practice be any width or dimension.

The read circuit array 130 includes M read circuits, each configured to receive pixel signals from a column of IPs in the IP array 127. It should be noted that in other embodiments, the read circuit array can include multiple read circuits configured to receive pixel signals from each IP column, as is discussed in FIGS. 5a, 5b, and 5c. A pixel signal bus couples the IPs in each IP column in the IP array to the read circuit associated with the IP column within the read circuit array. Each IP is configured to output a pixel signal produced by the IP to the pixel signal bus, and each read circuit is configured to sample the pixel signals from the IPs in the IP column associated with the read circuit. For example, read circuit 0 is configured to sample pixel signals from pixel signal bus 0, and so forth. Each read circuit in the read circuit array can sample pixel signals iteratively from IPs in the IP column associated with the read circuit (for instance, by sampling pixel signals from successive IPs in order over multiple passes), or can sample pixel signals according to a pre-determined non-sequential order. In one embodiment, read circuits can sample multiple pixel signals simultaneously. Although not illustrated in the embodiments of FIG. 3 and FIG. 4, the read circuits can additionally include memories configured to store accumulated digital values prior to outputting the accumulated values as image data.

A conditional reset bus couples the IPs in each IP column in the IP array 127 to the read circuit associated with each IP column. After sampling a pixel signal from an IP in an IP column, the read circuit associated with the IP column produces a conditional reset signal if the sampled pixel signal exceeds a sampling threshold. For example, if an IP in an IP column outputs a pixel signal to a read circuit associated with the IP column via the pixel signal bus coupling the IP to the read circuit, and if the read circuit determines that the pixel signal exceeds a sampling threshold, the read circuit outputs a conditional reset signal to the IP via the conditional reset bus coupling the read circuit to the IP and the IP resets the charge stored at the IP. As described above, the pixel signal bus and the conditional reset bus can be implemented in a shared bus with Cntrl[X] enabling pixel signals to be output from row X to the shared bus and Reset[X] enabling conditional reset for pixels in row X from the shared bus, though such embodiments are not described further herein for the purposes of simplicity.

The control logic 132 produces read control signals for the read circuits in the read circuit array 130. The read control signals can control the sampling of pixel signals from the IPs in the IP array 127 by the read circuits, the conversion of sampled pixel signals into digital values, the accumulation of the digital values, the outputting of the accumulated digital values, and the resetting of the adders. The read control signals can include a threshold signal, a sample signal, a compare signal, a residue signal, a readout signal, and a reset/add signal for each read circuit in the read circuit array as described in FIG. 3.

The control logic 132 is configured to produce read control signals for the read circuit array 130 to enable the capture of an image over an image capture period. Prior to the image capture period or at the first use of a particular IP memory location for an image capture period, the control logic can produce a reset to cause the accumulator of each read circuit 110 to reset the IP memory location. At the beginning of the image capture period, the control logic can produce a threshold signal for each of the read circuits; as discussed above, the threshold signal is used by each read circuit to determine a threshold to which pixel signals are compared for the purposes of conditionally resetting IPs associated with the pixel signals and accumulating digital values associated with the pixel signals. During the image capture period, the control logic can produce a series of sample signals configured to enable the read circuits to sample pixel signals from IPs associated with the read circuits. In one embodiment, the control logic produces sample signals according to one or more sampling policies. Sampling policies are described in greater detail below. At the end of the image capture period, the controlled logic produces a residue signal configured to enable each read circuit to accumulate a digital value representative of a pixel signal regardless of whether the pixel signal exceeds a sampling threshold. After the image capture period, the control logic produces a readout signal configured to enable each read circuit to output the accumulated digital values representative of sampled pixel signals that exceed an associated sampling threshold as image data. The control logic may also produce a reset signal after each image capture period to reset the accumulated digital values within each read circuit.

The control logic may also be configured to produce pause and resume signals configured to cause the IPs and the read circuits to pause and resume an image capture, and to produce any other signal necessary to control the functionality of the IPs and read circuits in the read circuit array. For each read circuit, the image data output by the read circuit is a digital representation of the light captured by each IP in an IP column associated with the read circuit. The image data is received by the physical signaling interface for subsequent output to a host IC.

Figure 5:
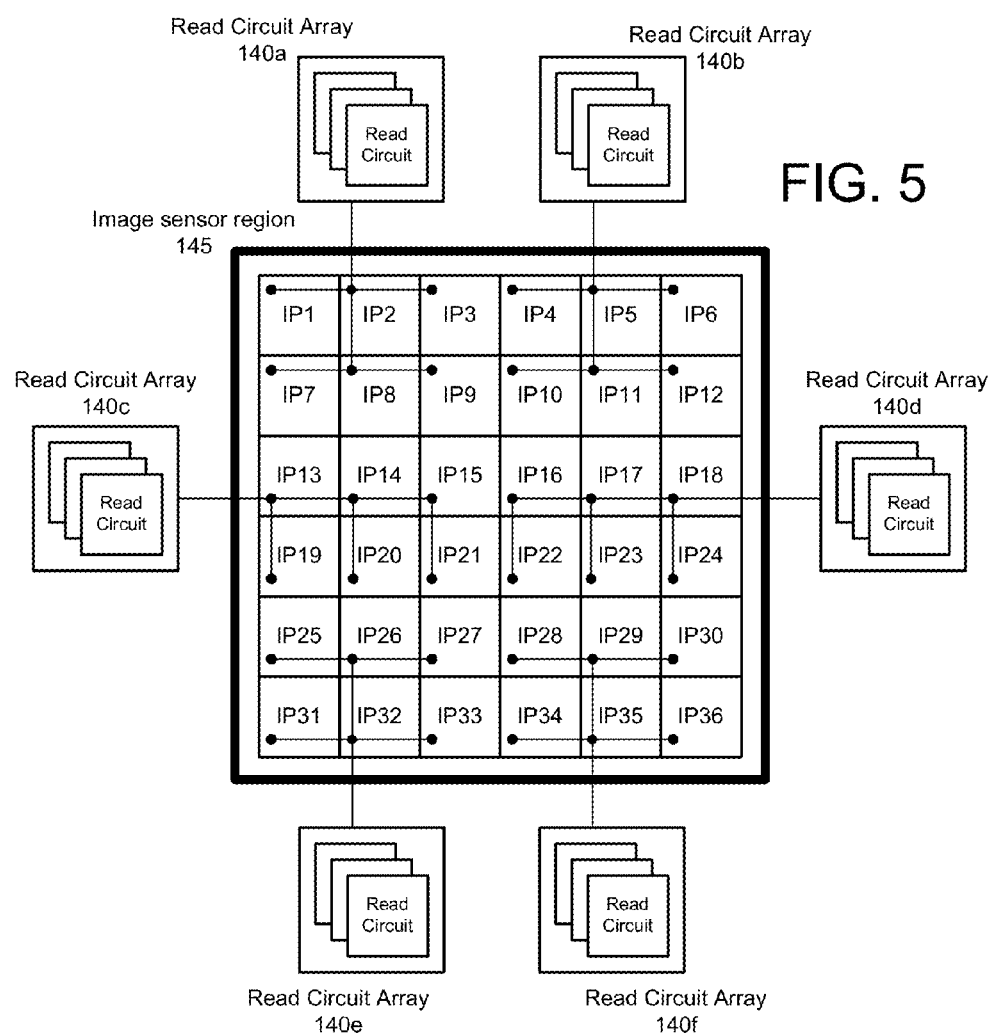
FIG. 5 illustrates another example circuit block diagram of an image sensor system architecture with read circuit arrays located peripherally to an IP array, according to one embodiment using, e.g., the cross-section of FIG. 1 and the circuitry of FIGS. 2 and 3.

FIG. 5 illustrates an example image sensor system architecture with read circuit arrays located peripherally to an IP array, according to one embodiment. In the architecture of FIG. 5, six read circuit arrays (140a, 140b, 140c, 140d, 140e, and 140f) are located around an image sensor region 145 including an IP array. Unlike the embodiment of FIG. 4, in which one read circuit array 130 is located to one side of the image sensor region 125, the read circuit arrays 140 of FIG. 5 are located on all sides of the image sensor region 145. The read circuit arrays can be located within an IC also containing the image sensor region, or can be located on one or more separate ICs. For example, each read circuit array could be located on the periphery of an image sensor IC, or could be located in dedicated read circuit array ICs located adjacent to the image sensor IC.

In the previous embodiment of FIG. 4, each read circuit in the read circuit array 130 is coupled to an IP column in the IP array 127. In the embodiment of FIG. 5, each read circuit array 140x is coupled to a set of six IPs from partial rows and partial columns of the image sensor region 145. For example, read circuit array 140a is coupled to IP1, IP2, IP3, IP7, IP8, and IP9. Each read circuit array 140x includes one or more read circuits. In one embodiment, each read circuit array includes 6 read circuits, with each read circuit in a read circuit array coupled to one IP. In such an embodiment, each read circuit samples only the IP to which it is coupled. More typically, each read circuit will be shared by a block of IPs comprising a large number of rows and one or more columns. Although control logic is not illustrated in the embodiment of FIG. 5, each read circuit array can be coupled to universal control logic, or each may be coupled to dedicated control logic. Further, although a physical signaling interface is not illustrated in the embodiment of FIG. 5, each read circuit array may output image data via a common bus to a common physical signaling interface, or may output image data via a dedicated bus to a dedicated physical signaling interface coupled to each read circuit array.

Figure 6A:
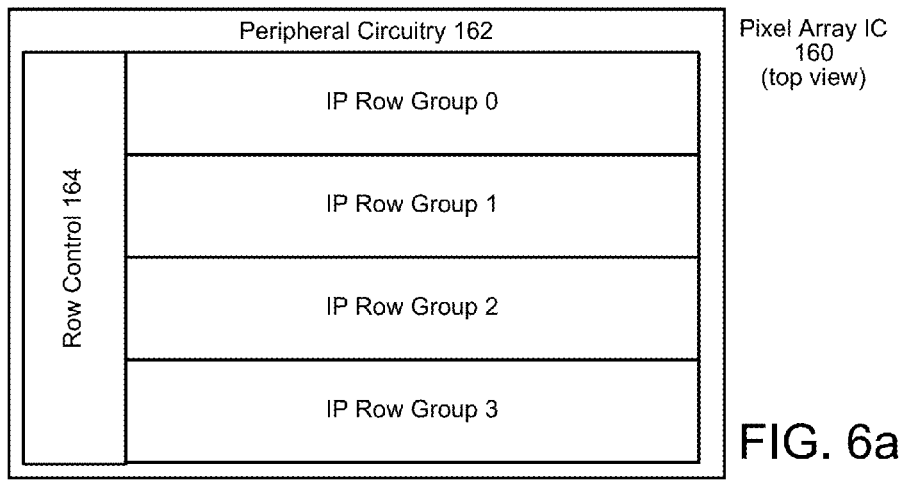
FIG. 6a illustrates a top view of a pixel array IC in an example two-layer image sensor system architecture alternative to FIGS. 4 and 5, according to one embodiment using, e.g., the array circuitry of FIG. 2.

FIG. 6a illustrates a top view of a pixel array IC in an example two-layer image sensor system architecture, according to one embodiment. The pixel array IC of FIG. 6a includes peripheral circuitry 162 surrounding an IP array. The IP array includes row control circuitry 164 and four row groups of IPs (IP Row Groups 0 through 3). Each IP row group is the width of the array and includes one-fourth of the rows in the array, and the row control circuitry provides control and reset signals needed for operation of the IPs (for instance, signals configured to cause the IPs to be enabled for reset and selected for readout, and any other signals discussed herein).

Figure 6B:
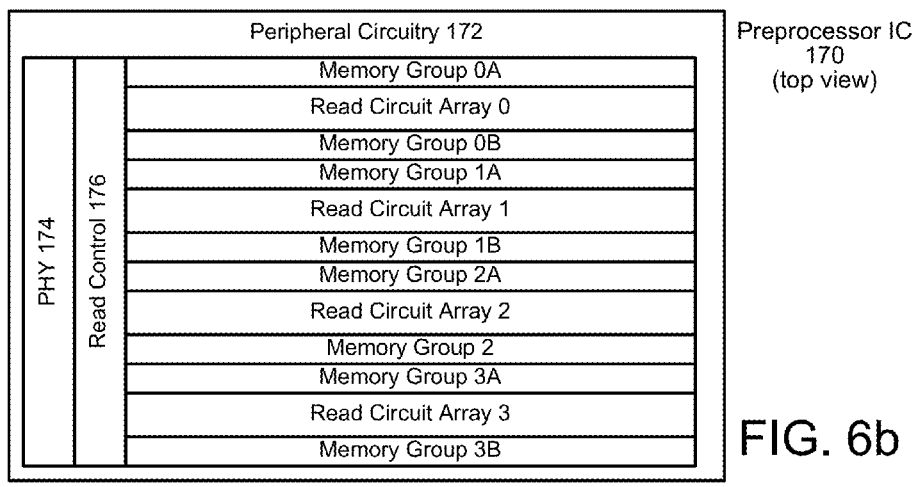
FIG. 6b illustrates a top view of a preprocessor IC in an example two-layer image sensor system architecture alternative to FIGS. 4 and 5, according to one embodiment using, e.g., the read circuitry of FIG. 3.

FIG. 6b illustrates a top view of a preprocessor IC in an example two-layer image sensor system architecture, according to one embodiment. The preprocessor IC of FIG. 6b includes peripheral circuitry 172 surrounding a read circuit array. The read circuit array includes a physical signaling interface 175 (which may alternately be on pixel array IC 160), read control circuitry 176, four read circuit arrays (read circuit array 0 through 3), and accompanying memory groups 0A/B, 1A/B, 2A/B, and 3A/B. Each read circuit array includes one or more read circuits (including an ADC, adder, and reset logic for each IP column) connected to corresponding rows in an associated memory group. When a particular IP row is selected in an IP row group of the pixel array IC, a corresponding row in the corresponding memory group is selected on the preprocessor IC.

Figure 6C:
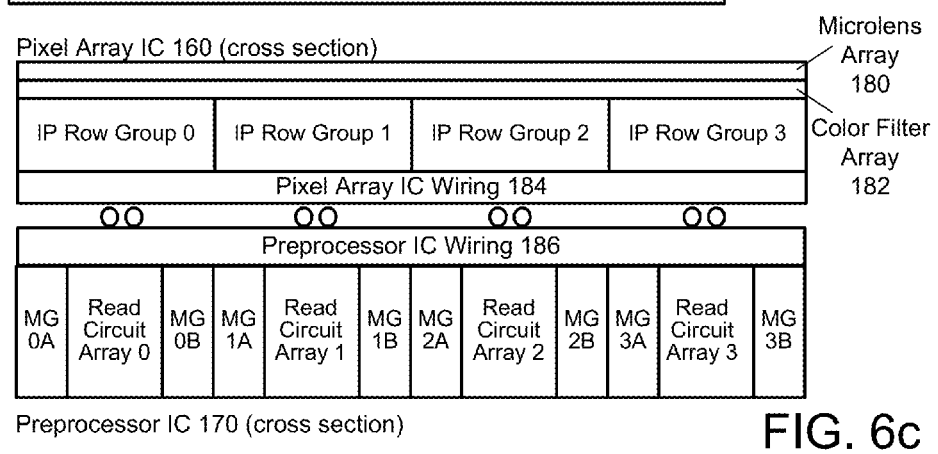
FIG. 6c illustrates a partial cross section of the pixel array IC of FIG. 6a and the preprocessor IC of FIG. 6b in an example two-layer image sensor system architecture, according to one embodiment.

FIG. 6c illustrates a cross section of the pixel array IC of FIG. 6a and the preprocessor IC of FIG. 6b in an example two-layer image sensor system architecture, according to one embodiment. In the embodiment of FIG. 6c, the pixel array IC 160 is located above the preprocessor IC 170 such that the bottom surface of the pixel array IC is coupled to the top surface of the preprocessor IC. A microlens array 180 and a color filter array 182 are located above the pixel array IC. The pixel array IC and the processor IC are coupled via pixel array IC wiring 184 and preprocessor IC wiring 186. By locating the pixel array IC above the preprocessor IC, the die size and percentage of surface area in the image sensor system capable of capturing light is increased. For instance, in a single-layer IC architecture including an IP array and one or more read circuit arrays, the portion of the single-layer IC including the one or more read circuit arrays are incapable of capturing light; such an embodiment reduces the percentage of silicon die used to capture light incident upon the single-layer IC. This requires the camera module footprint to be larger than the lens and the imaging array, and increases the cost and size of the camera module. The top-layer of the embodiment of FIG. 6c, in contrast, does not include read circuit arrays, so the die size of the top single layer IC is reduced to approximately the size of the IP array. Light incident upon the top-layer passes through the microlens array and the color filter array, is captured by the IPs in the IP array, and signals representative of the captured light are sampled by the read circuit arrays via the pixel array IC wiring and the preprocessor IC wiring.

Figures 7, 8, 9:
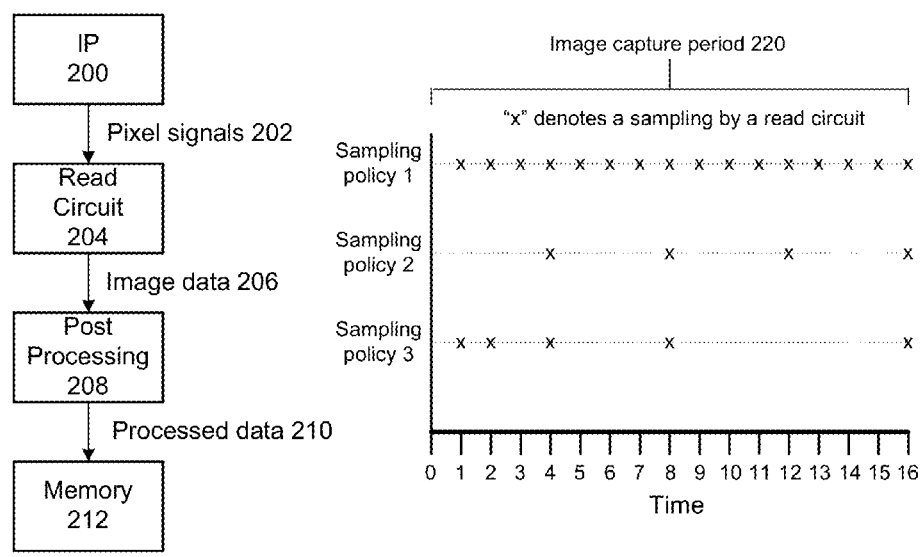
FIG. 7 illustrates the operation of an image sensor read circuit, such as the read circuit of FIG. 3, according to one embodiment.
FIG. 8 illustrates data flow in an image capture system, according to one embodiment useful with the systems described herein.
FIG. 9 illustrates various temporal sampling policies for use by an image sensor read circuit, such as the read circuit of FIG. 3, according to one embodiment.

FIG. 7 illustrates the operation of an image sensor read circuit, such as the read circuit of FIG. 3, according to one embodiment. In the example embodiment of FIG. 7, an image is captured over the course of 16 sampling intervals. The ADC of the example embodiment of FIG. 7 converts pixel signals to 5-bit digital values, and the accumulator accumulates 5-bit digital values into a 9-bit digital value during the image capture period. Further, in the embodiment of FIG. 7, the ADC converts received pixel signals into digital values representing the pixel signals such that each additional photon detected by an IP results in an increase in the digital value by one. For example, if an IP detects 5 photons after being reset, the pixel signal produced by the IP will be converted by the ADC into the value "00101". It should be emphasized that in other embodiments, the ADC converts received pixel signals into digital values representing the pixel signals such that multiple additional photons detected by an IP results in an increase in the digital value by one. In the embodiment of FIG. 7, pixel signals are analog voltages, and thus aren't shown in FIG. 7 for the purposes of simplicity.

At the beginning of the image capture period (sampling interval 0), a control signal is received configured to configure an IP of the read circuit to be reset and begin exposure. In the embodiment of FIG. 7, the "begin exposure" control signal also resets the value stored at the memory element corresponding to the IP to zero. In addition, a threshold signal is received to set the sampling threshold for the read circuit at a pixel signal equivalent to 20 photons.

During the first sampling interval, 4 photons are detected by the IP. The IP then produces a pixel signal representing the charge collected by a photosensitive element within the IP equivalent in response to detecting the 4 photons, and the ADC converts this pixel signal to the digital value "00100". Since the 4 detected photons do not trigger the sampling interval of 20 photons ("10100"), the accumulator does not accumulate the digital value "00100", and the charge stored by the IP is not dissipated (the IP is not reset). Note that the column "Photons (det.-accum.)" indicates first the number of photons detected by the IP during a particular sampling interval and second the number of accumulated photons since the last conditional reset of the IP.

During sampling interval 2, 7 additional photons are detected by the IP. The charge stored by the IP increases from the charge produced in response to detecting 4 photons during sampling interval 1 to a charge produced in response to detecting 11 accumulated photons (4 photons during sampling interval 1 and 7 photons during sampling interval 2). The pixel signal produced by the IP in response to the stored charge is converted to the digital value "01011". Since the total 11 photons do not trigger the sampling threshold of 20 photons, the accumulator does not accumulate the digital value "01011", and the IP is not reset. Similarly, during sampling interval 3, 2 additional photons are detected by the IP, and the charge stored by the IP increases to a charge produced in response to detecting 13 accumulated photons (4 photons during sampling interval 1, 7 during sampling interval 2, and 2 during sampling interval 3). The pixel signal produced by the IP in response to this increased stored charge is converted to the digital value "01101". Since the accumulated 13 photons do not trigger the sampling threshold of 20 photons, the accumulator does not accumulate the digital value "01101", and the IP is not reset.

During sampling interval 4, 11 additional photons are detected by the IP. The charge stored by the IP increases to a charge equivalent to detecting 24 accumulated photons (4 during sampling interval 1, 7 during sampling interval 2, 2 during sampling interval 3, and 11 during sampling interval 4). The pixel signal produced by the IP in response to the stored charge is converted to the digital value "11000". Since the accumulated 24 photons exceeds the sampling threshold of 20 photons, the adder accumulates the digital value "11000" into the memory element for the IP, and the IP is reset.

The 14 photons detected during sampling interval 5 do not exceed the sampling interval of 20, the digital value produced by the ADC, "01110" is not accumulated and the IP is not reset. The 8 photons detected during sampling interval 6 results in an accumulated detection of 22 photons by the IP (14 photons during sampling interval 5, and 8 during sampling interval 6), and the adder accumulates the digital value "10110" (resulting in a total accumulated value of "000101110" into the memory element), and the IP is reset.

This process is repeated for each of the 16 sampling intervals. The digital values produced by the ADC during sampling intervals 10, 14, and 15 are all accumulated in response to the sampling threshold of 20 photons being exceeded by the number of accumulated photons detected by the IP. Accordingly, the IPs are reset for the sampling intervals following these intervals (sampling interval 11, 15, and 16). During sampling interval 16, 19 photons are detected by the IP, which does not exceed the sampling threshold of 20 photons. In addition, during sampling interval 16, a residue signal is received configured to instruct the accumulator to accumulate the digital value produced by the ADC (the residue value 190, "10011"). Accordingly, the adder accumulates the value "100 µl" to the maintained accumulation value "001111011" in the memory element to produce the image data 195, "010001110". Finally, a reset signal is received during sampling interval 16, which enables the read circuit to output the image data and which resets the values output by the ADC and stored at the accumulator to zero subsequent to outputting the image data.

FIG. 8 illustrates pixel information flow in an image capture system, according to one embodiment. During the course of an image capture period, an IP 200 detects photons and outputs pixel signals 202 to the read circuit. In response, the read circuit 204 converts the received pixel signals to digital values representative of the receive pixel signals, and for each digital value associated with a pixel signal that exceeds a sampling threshold, accumulates the digital value and resets the IP. After the image capture period, the accumulated digital values are output as image data 206.

A post processing module 208 receives the image data 206 and performs one or more processing operations on the image data to produce the processed data 210. In one embodiment, a response function can be used to transform the image data 206 according to a desired response. For example, the image data can be transformed with a linear function or a logarithmic function based on the intensity of the light detected by the IP. The processed data is then stored in memory 212 for subsequent retrieval and processing. The IP 200, the read circuit 204, the post processing module, and the memory can be located within an IC, or can be located within separate coupled ICs.

FIG. 9 illustrates various temporal sampling policies for use by an image sensor read circuit, such as the read circuit of FIG. 3, according to one embodiment. In the embodiment of FIG. 9, an image is captured over an image capture period 220 equivalent to 16 time units. For each of the three illustrated sampling policies, an "x" indicates the sampling of a given IP by a read circuit.

In sampling policy 1, the read circuit samples the IP after each of the 16 time units. In sampling policy 2, the read circuit samples the IP after every 4 time units. As the read circuit in sampling policy 2 samples the IP less frequently than the read circuit in sampling policy 1, the IP in sampling policy 2 is more likely to saturate than the IP in sampling policy 1. However, the resources (processing, bandwidth, and power) required to implement sampling policy 2 (4 total samples) may be lower than the resources required to implement sampling policy 1 (16 total samples), since the read circuit in sampling policy 2 samples the IP only 25% as often as the read circuit in sampling policy 1.

In sampling policy 3, the read circuit samples the IP after time units 1, 2, 4, 8, and 16. The exponential spacing of the samplings of sampling policy 3 provide short sample intervals (for instance, the sample interval between time unit 0 and time unit 1) and long sample intervals (for instance, the sample interval between time unit 8 and time unit 16). Allowing for both short and long sampling intervals preserves the dynamic range of sampling policy 1 with nearly as few samplings as sampling policy 2 (5 samplings for sampling policy 3 vs. 4 samplings for sampling policy 2). Other sampling policies not illustrated in FIG. 9 may also be implemented by read circuits in the image sensor systems described herein. Depending on the overall length of an exposure interval or other scene- or user-dependent factors, different sampling policies can be selected to meet desired power, SNR, dynamic range, or other performance parameters.

High-SNR Image Sensor with Non-Destructive Threshold Monitoring

While the three-transistor (3T) pixel architecture shown in FIG. 2 is suitable for many applications, four-transistor (4T) designs having a "transfer gate" disposed between the photodiode and source follower (i.e., between node "$V_{DET}$" of photosensitive element 65 and element 74 in FIG. 2) provide a number of advantages. First, the now-isolated floating diffusion at the gate of the source follower may be reset (e.g., coupled to $V_{DD}$) without disturbing the charge state of the photodiode, thereby enabling a correlated double-sampling (CDS) operation in which the noise floor of the floating diffusion is sampled prior to charge integration and then subtracted from the subsequent sampling of the photodiode potential, canceling the noise and significantly improving the SNR. Another advantage is, counterintuitively, a more compact pixel design as the switched connection between the photodiode and source follower (i.e., via the transfer gate) enables the source follower, reset and access transistors to be shared among multiple photodiodes. For example, only seven transistors are required to implement a set of four "4T" pixels having a shared source follower, reset transistor and access transistor (i.e., four transfer-gates plus the three shared transistors), thus effecting an average of 1.75 transistors per pixel (1.75T).

In terms of pixel read-out, the direct connection between photodiode and source follower in a 3T pixel permits the charge state of the photodiode to be read-out without disturbing ongoing photocharge integration. This "non-destructive read" capability is particularly advantageous in the context of the conditional reset operation described above as the 3T pixel may be sampled following an integration interval and then conditionally permitted to continue integrating charge (i.e., not be reset) if the sampling operation indicates that the charge level remains below a predetermined threshold. By contrast, the charge transfer between photodiode and floating diffusion as part of a 4T pixel readout disrupts the state of the photodiode, presenting a challenge for conditional-reset operation.

In a number of embodiments described below in connection with FIGS. 10-14, a modified 4T pixel architecture is operated in a manner that dissociates the reset threshold from pixel sample generation to enable a non-destructive (and yet CDS) overthreshold determination. That is, instead of reading out the net level of charge accumulated within the photodiode (i.e., a pixel sampling operation) and conditionally resetting the photodiode based on that read-out (i.e., as in a 3T pixel sampling operation), a preliminary overthreshold sampling operation is executed to enable detection of an overthreshold state within the photodiode, with the full photodiode read-out (i.e., pixel sample generation) being conditionally executed according to the preliminary overthreshold detection result. In effect, instead of conditionally resetting the photodiode according to the pixel value obtained from full photodiode readout, full photodiode readout is conditioned on the result of a preliminary, non-destructive determination of whether the threshold has been exceeded; an approach enabled, in at least one embodiment, by dissociating the conditional-reset threshold from the pixel value generation.

Figure 10:
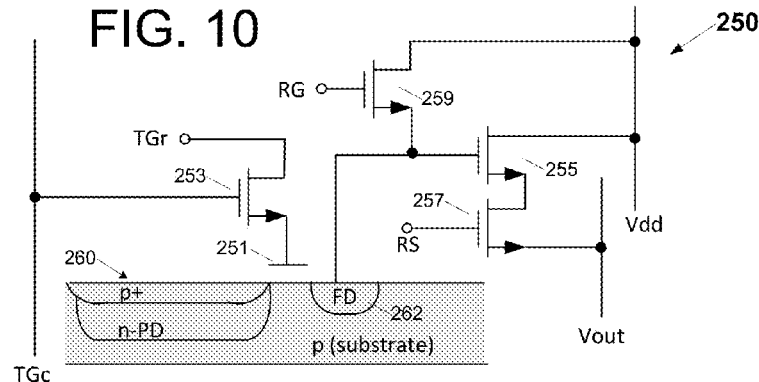
FIG. 10 illustrates an embodiment of a modified 4-transistor pixel in which a non-destructive overthreshold detection operation is executed to enable conditional-reset operation in conjunction with correlated double sampling.

FIG. 10 illustrates an embodiment of a modified 4T pixel 250, referred to herein as a "progressive read-out pixel," in which a non-destructive overthreshold detection operation is executed to enable conditional-reset operation in conjunction with correlated double sampling. As explained more fully below, the overthreshold detection involves a limited read-out of the photodiode state which, when determined to indicate an overthreshold condition, will trigger a more complete read-out of the photodiode state. That is, pixel 250 is read-out in a progression from a limited overthreshold detection read-out to a complete read-out (the latter being conditional according to the overthreshold detection result).

Still referring to FIG. 10, progressive read-out pixel 250 includes a transfer gate 251 disposed between a photodiode 260 (or any other practicable photosensitive element) and floating diffusion node 262, and a transfer-enable transistor 253 coupled between a transfer-gate row line (TGr) and transfer gate 251. The gate of transfer-enable transistor 253 is coupled to a transfer-gate column line (TGc) so that, when TGc is activated, the potential on TGr is applied (minus any transistor threshold) via transfer-enable transistor 253 to the gate of transfer-gate 251, thus enabling charge accumulated within photodiode 260 to be transferred to floating diffusion 262 and sensed by the pixel readout circuitry. More specifically, floating diffusion 262 is coupled to the gate of source follower 255 (an amplification and/or charge-to-voltage conversion element), which is itself coupled between a supply rail ($V_{DD}$ in this example) and a read-out line, Vout, to enable a signal representative of the floating diffusion potential to be output to read-out logic outside the pixel.

As shown, a row-select transistor 257 is coupled between the source follower and the read-out line to enable multiplexed access to the read-out line by respective rows of pixels. That is, row-select lines ("RS") are coupled to the control inputs of row-select transistors 257 within respective rows of pixels and operated on a one-hot basis to select one row of pixels for sense/read-out operations at a time. A reset transistor 259 is also provided within the progressive read-out pixel to enable the floating diffusion to be switchably coupled to the supply rail (i.e., when a reset-gate line (RG) is activated) and thus reset. The photodiode itself may be reset along with the floating diffusion by fully switching on transfer gate 251 (e.g., by asserting TGc while TGr is high) and reset transistor 259 concurrently, or by merely connecting the photodiode to a reset-state floating diffusion.

Figure 11:
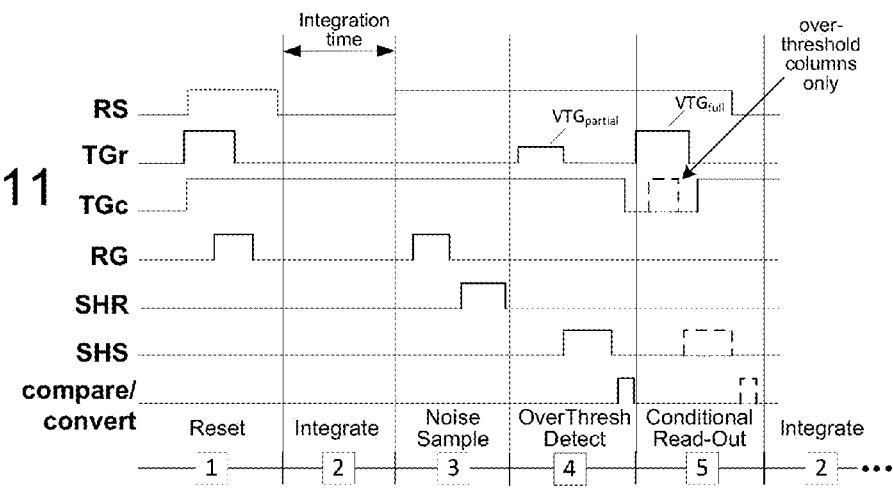
FIG. 11 is a timing diagram illustrating an exemplary pixel cycle within the progressive read-out pixel of FIG. 10.

FIG. 11 is a timing diagram illustrating an exemplary pixel cycle within the progressive read-out pixel of FIG. 10. As shown, the pixel cycle is split into five intervals or phases corresponding to distinct operations carried out to yield an eventual progressive read-out in the final two phases. In the first phase (phase 1), a reset operation is executed within the photodiode and floating diffusion by concurrently asserting logic high signals on the TGr, TGc and RG lines to switch on transfer-enable transistor 253, transfer gate 251 and reset transistor 259, thereby switchably coupling photodiode 260 to the supply rail via transfer gate 251, floating diffusion 262 and reset transistor 259 (the illustrated sequence can begin with an unconditional reset (e.g., at the start of a frame), and can also begin from a preceding conditional read-out/reset operation). To conclude the reset operation, the TGr and RG signals (i.e., signals applied on like-named signal lines) are lowered, thereby switching off transfer gate 251 (and reset transistor 259) so that the photodiode is enabled to accumulate (or integrate) charge in response to incident light in the ensuing integration phase (phase 2). Lastly, although the row-select signal goes high during the reset operation shown in FIG. 11, this is merely a consequence of an implementation-specific row decoder that raises the row-select signal whenever a given row address is decoded in connection with a row-specific operation (e.g., raising the TGr and RG signals during reset directed to a given row). In an alternative embodiment, the row decoder may include logic to suppress assertion of the row-select signal during reset as indicated by the dashed RS pulse in FIG. 11.

At the conclusion of the integration phase, the floating diffusion is reset (i.e., by pulsing the RG signal to couple the floating diffusion to the supply rail) and then sampled by a sample-and-hold element within the column read-out circuit. The reset and sample operation (shown as phase 3 in FIG. 11), in effect, samples the noise level of the floating diffusion and is executed in the embodiment shown by asserting the row-select signal for the pixel row of interest (i.e., the "$i^{th}$" pixel row, selected by RSi) while pulsing a reset-state sample-and-hold signal (SHR) to convey the state of the floating diffusion to the sample-and-hold element (e.g., a switch-accessed capacitive element) within the column read-out circuit via read-out line, Vout.

Figure 12:
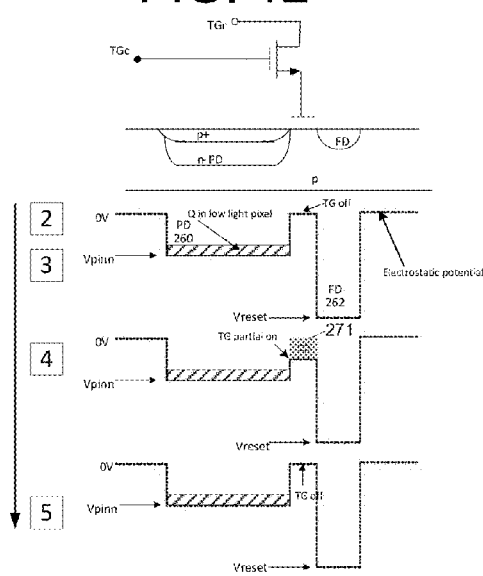
FIGS. 12 and 13 illustrate exemplary electrostatic potential diagrams for the photodiode, transfer gate and floating diffusion of FIG. 10 below their corresponding schematic cross-section diagrams.
Figure 13:
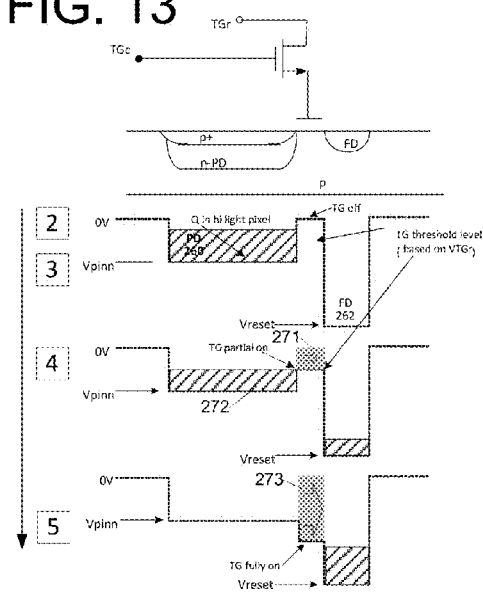

After acquiring the noise sample in phase 3, an overthreshold detection operation is executed in phase 4 by raising the TGr line to a partially-on, "overthreshold-detection" potential, $VTG_{partial}$, concurrently with switching on transfer-enable transistor 253 (i.e., by asserting a logic high TGc signal, although in this embodiment TGc is already on). By this operation, illustrated graphically in FIGS. 12 and 13, $VTG_{partial}$ is applied to transfer gate 251 to switch the transfer gate to a "partial on" state ("TG partial on"). Referring to FIGS. 12 and 13, electrostatic potential diagrams for photodiode 260 (a pinned photodiode in this example), transfer gate 251 and floating diffusion 262 are shown below their corresponding schematic cross-section diagrams. Note that the depicted levels of electrostatic potential are not intended to be an accurate representation of the levels produced in an actual or simulated device, but rather a general (or conceptual) representation to illustrate the operation of the pixel read-out phases. Upon application of $VTG_{partial}$ to transfer gate 251, a relatively shallow channel potential 271 is formed between photodiode 260 and floating diffusion 262. In the example of FIG. 12, the level of charge accumulated within the photodiode at the time of the overthreshold detection operation (phase 4) does not rise to the threshold level required for charge to spill over (i.e., be transferred) to the floating diffusion via the shallow channel potential of the partially-on transfer gate. Accordingly, because the accumulated charge level does not exceed the spillover threshold established by application of $VTG_{partial}$ to the control node of transfer gate 251, there is no spillover from the photodiode to the floating diffusion and the accumulated charge instead remains undisturbed within the photodiode. By contrast, in the example of FIG. 13, the higher level of accumulated charge does exceed the spillover threshold so that a portion of the accumulated charge (i.e., that subset of charge carriers that are above the transfer gate partially-on electrostatic potential) spills over into floating diffusion node 262, with the residual accumulated charge remaining within the photodiode as shown at 272.

Still referring to FIGS. 11, 12 and 13, prior to conclusion of overthreshold detection phase 4, the charge level of the floating diffusion is sampled and held within a signal-state sample-and-hold element (i.e., in response to assertion of signal SHS) to yield a threshold-test sample—the difference between the signal-state sample and the previously obtained reset-state sample—to be evaluated with respect to a conditional-reset threshold. In one embodiment, the conditional-reset threshold is an analog threshold (e.g., to be compared with the threshold-test sample in a sense amplifier in response to assertion of a compare/convert strobe signal) set or programmed to a setting above the sampling noise floor, but low enough to enable detection of minute charge spillover via the shallow transfer gate channel. Alternatively, the threshold-test sample may be digitized in response to assertion of the compare/convert signal (e.g., within an analog-to-digital converter that is also used to generate the finalized pixel sample value) and then compared with a digital conditional-reset threshold, again, set (or programmed to a setting) above the noise floor, but low enough to enable detection of trace charge spillover. In either case, if the threshold-test sample indicates that no detectable spillover occurred (i.e., threshold-test sample value is less than conditional-reset spillover threshold), then the photodiode is deemed to be in the underthreshold state shown in FIG. 12 and the TGc line is held low in the ensuing conditional read-out phase (phase 5, the final phase) to disable transfer gate 251 for the remainder of the progressive read-out operation—in effect, disabling further read-out from the photodiode and thus enabling the photodiode to continue integrating charge without disruption for at least another sampling interval. By contrast, if the threshold-test sample indicates a spillover event (i.e., threshold-test sample greater than conditional-reset/spillover threshold), then the TGc line is pulsed during the conditional read-out phase concurrently with application of a fully-on, "remainder-transfer" potential, $VTG_{full}$, to the TGr line, thereby enabling the remainder of the charge (i.e., charge 272 as shown in FIG. 13) within photodiode 260 to be transferred to floating diffusion 262 via the full-depth transfer-gate channel (273) so that, between the overthreshold transfer in phase 4 and the remainder transfer in phase 5, the charge accumulated within the photodiode since the hard reset in phase 1 is fully transferred to the floating diffusion where it may be sensed in a pixel read-out operation. In the embodiment shown, the pixel-read-out operation is effected by pulsing the SHS signal and compare/convert strobe in sequence during conditional read-out phase 5, though either or both of those pulses may optionally be suppressed in absence of an overthreshold detection. Note that conditional read-out of the photodiode (i.e., effected by pulsing TGc in conjunction with application of $VTG_{full}$ on TGr) effectively resets the photodiode (i.e., drawing off all charge to the floating diffusion), while suppression of the conditional read-out leaves the integration state of the photodiode undisturbed. Accordingly, execution of the conditional read-out operation in phase 5 conditionally resets the photodiode in preparation for integration anew in the succeeding sampling interval (subframe) or refrains from resetting the photodiode to enable cumulative integration in the subsequent sampling interval. Thus, in either case, a new integration phase follows phase 5, with phases 2-5 being repeated for each subframe of the overall frame (or exposure) interval, before repeating the hard reset in a new frame. In other embodiments, where cumulative integration is permitted across frame boundaries, the hard reset operation may be executed to initialize the image sensor and omitted for an indeterminate period of time thereafter.

Figure 14:
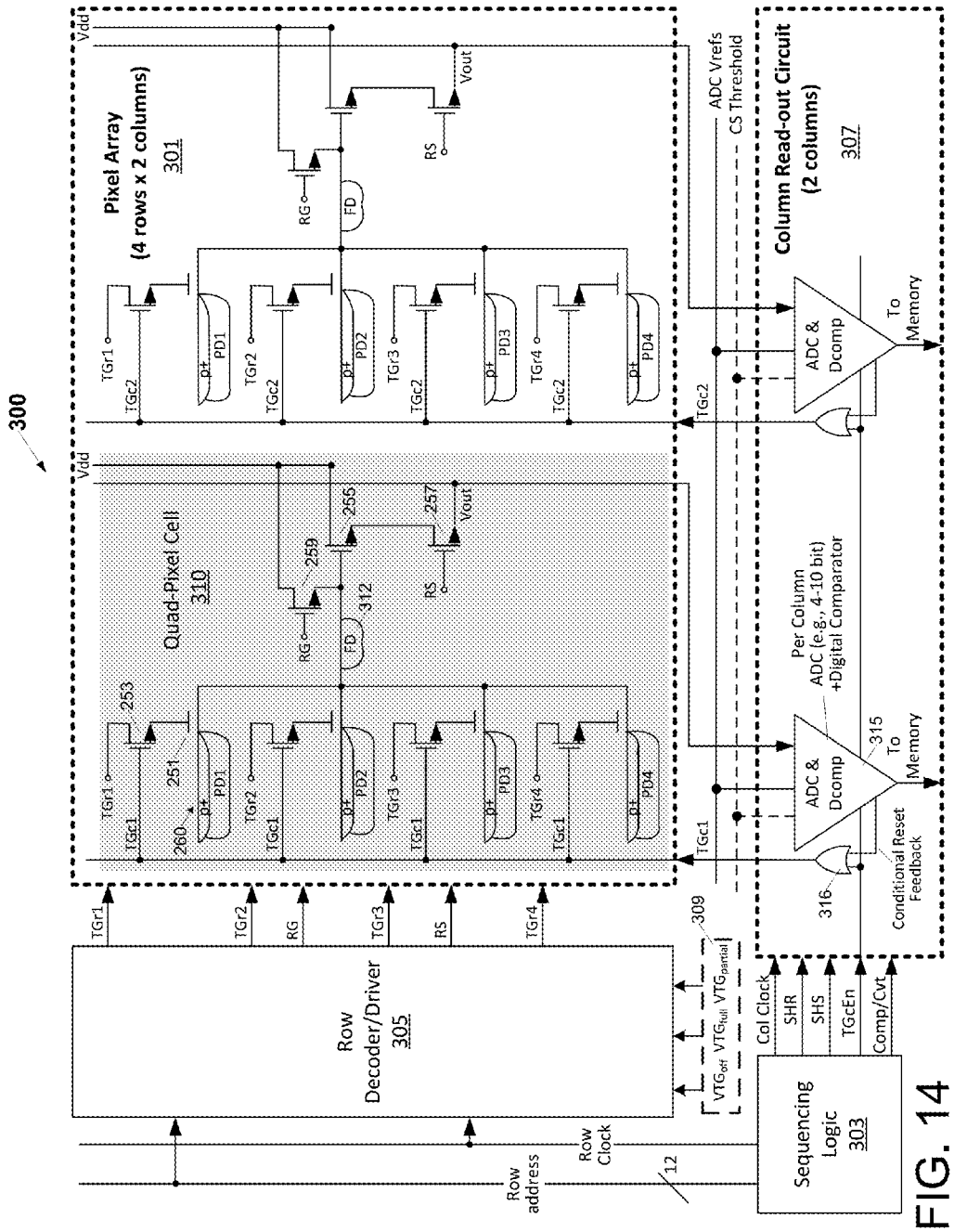
FIG. 14 illustrates an embodiment of an image sensor 300 having a progressive-readout pixel array.

FIG. 14 illustrates an embodiment of an image sensor 300 having a progressive-readout pixel array 301, sequencing logic 303, row decoder/driver 305 and column read-out circuit 307. While pixel array 301 is shown to include four rows and two columns of shared-element pixels, other embodiments may include many more pixel rows and columns to implement, for example, a multi-megapixel or gigapixel image sensor. The column read-out circuit 307 (for which two columns of read-out circuitry are depicted) and row decoder/driver 305 may likewise be scaled to meet the number of pixels in the pixel array.

In the embodiment shown, each column of the pixel array is populated by shared-element pixels in which every four pixels form a quad pixel cell 310 and contain respective photodiodes 260 (PD1-PD4), transfer gates 251, and transfer-enable transistors 253, but share a floating diffusion node 312, reset transistor 259, source follower 255 and row-select transistor 257. By this arrangement, the average transistor count per pixel is 2.75 (i.e., 11 transistors/4 pixels), thus effecting a relatively efficient, 2.75T-pixel image sensor.

As shown, row decoder/driver 305 outputs a shared row-select signal (RS) and reset-gate signal (RG) to each row of quad-pixel cells 310, and outputs independent row transfer-gate control signals (TGr1-TGr4) to drain terminals of respective transfer-enable transistors 253. In an embodiment in which row decoder/driver 305 sequences incrementally through the rows of the array (e.g., pipelining reset, integration and progressive read-out operations with respect to the rows of pixel array 301 such that one row is read-out after another), the row decoder/driver may include logic to assert the RG, RS and TGr signals at the appropriate time for each row (e.g., synthesizing those signals with respect to a row clock from sequencing logic 303). Alternatively, row decoder/driver 305 may receive individual timing signals corresponding to each or any of the RG, RS and TGr signals, multiplexing any individual enable pulse onto the corresponding RG, RS, or TGr lines of a selected row at the appropriate time. In one embodiment, the row decoder/driver receives transfer-gate control voltages corresponding to the off, partially-on and fully-on states shown in FIGS. 11, 12 and 13 (i.e., $VTG_{off}$, $VTG_{partial}$, $VTG_{full}$) from an on-chip or off-chip programmable voltage source 309, switchably coupling each of the different control voltages to a given transfer-gate row line at a deterministic time, for example, as shown in FIG. 11. In alternative embodiments, more than one voltage source 309 may be provided within image sensor 300 to enable transfer-gate control voltages to be locally calibrated and thus compensate for control-voltage and/or performance variations (i.e., non-uniformity) across the pixel array.

Still referring to the embodiment of FIG. 14, column read-out circuit 307 includes a bank of read-out circuits 315, each implementing a digital threshold comparator and a relatively low bit-depth analog-to-digital converter (e.g., a 4-10 bit ADC, though lower or higher bit depth ADCs may be employed) to execute the overthreshold detection and conditional sampling operations, respectively, discussed in connection with FIGS. 11-13. In one implementation, the threshold comparator and ADC are implemented by separate circuits so that the pixel sample value may be generated without regard to the conditional-reset threshold applied in the overthreshold determination. Through this approach, the conditional-reset threshold is dissociated from the reference signals ("ADC Vrefs") used in the ADC conversion, freeing the conditional-reset threshold and ADC reference voltages to be independently adjusted (e.g., through reprogramming a threshold-reference generator) dynamically during or prior to sensor operation to achieve calibration and/or compensate for changing operating conditions or sub-optimal imaging results. In an alternative embodiment, the threshold comparator may be implemented as part of the ADC (e.g., using a reference applied in connection with resolving the digital sample value as the conditional-reset threshold), potentially reducing the footprint of the column read-out logic through more compact circuit design.

In the embodiment shown, the sequencing logic delivers a column clock, sample-and-hold strobes (SHR, SHS, which are applied to enable signal storage within sample-and-hold elements at the front-end of the ADC/threshold comparator), and compare/convert strobe to the column read-out logic to enable the operational timing shown, for example, in FIG. 11. That is, during the overthreshold detection phase (i.e., phase 3), the read-out circuit for a given pixel column asserts (or maintains assertion of) the TGc line (e.g., in response to assertion of a TGcEn signal from sequencing logic 303 and logic OR gate 316) so that, when the row decoder/driver switches the TGr line for a given pixel row to the partially-on potential (e.g., $VTG_{partial}$, which is applied to the transfer gates of the pixel row), execution of the overthreshold detection operation described above is enabled. Accordingly, the threshold comparator within each read-out circuit evaluates the state of the threshold-test sample (which is generated according to the state of shared floating diffusion 312 following application of $VTG_{partial}$ to the transfer gate of a given photodiode) with respect to the conditional-reset threshold to yield a binary overthreshold result. If an overthreshold condition is detected, the read-out circuit raises the TGc signal again a short time later (i.e., in conjunction with the fully-on TGr potential ($VTG_{full}$) to effect a conditional read-out operation, enabling a full read-out of the photodiode state onto Vout and resetting the photodiode) and executes an analog-to-digital conversion operation in response to assertion of the compare/convert strobe to yield a digitized pixel sample.

Read-Out Circuitry

Figure 15A:
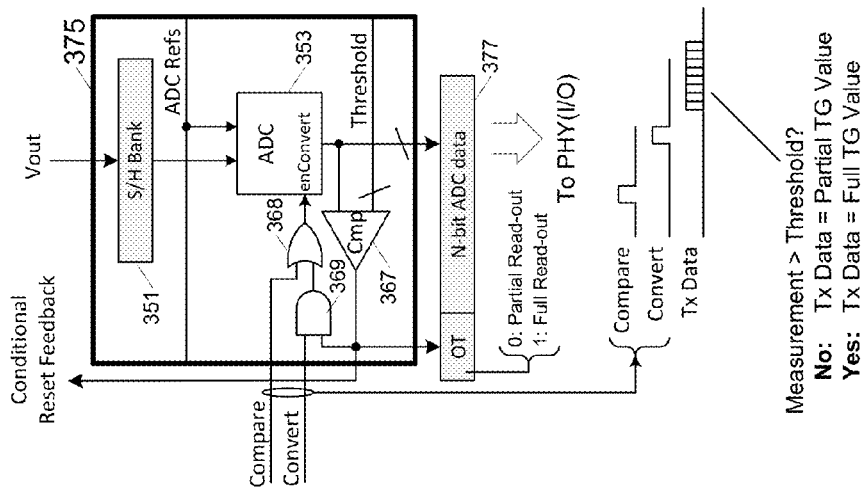
FIGS. 15A-15C illustrate alternative column read-out circuit embodiments that may be employed in connection with the progressive read-out pixels described in reference to FIGS. 10-14.
Figure 15B:
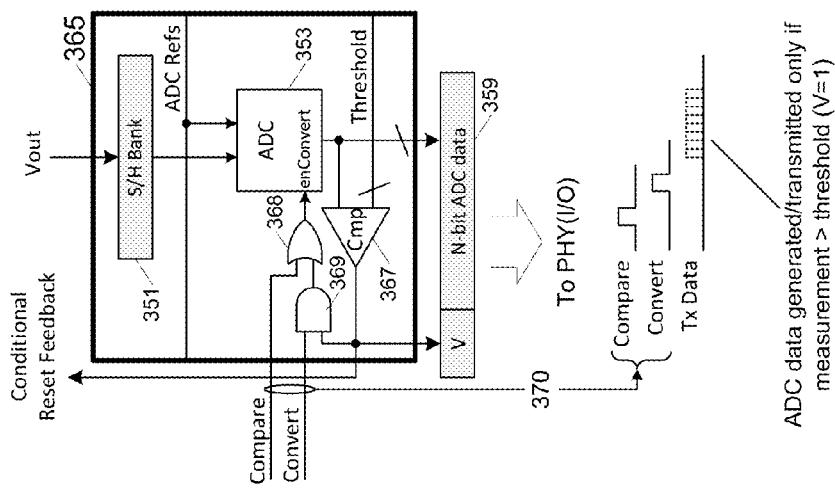
Figure 15C:
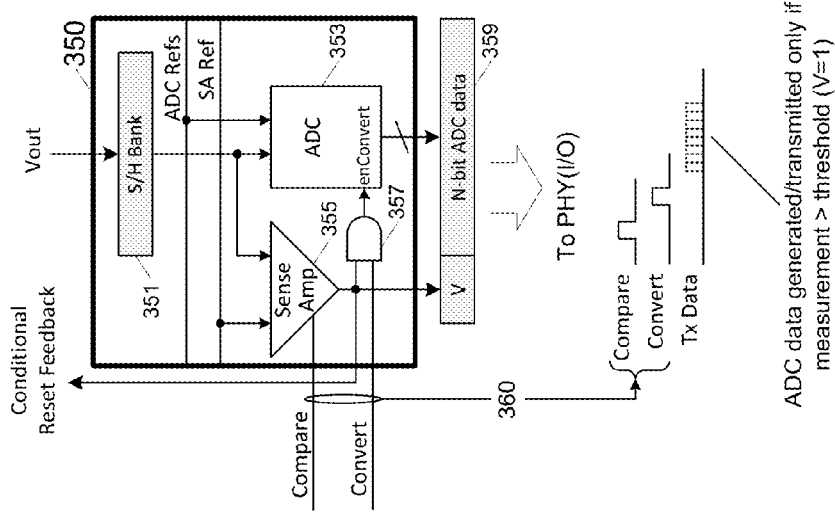

FIGS. 15A-15C illustrate alternative column read-out circuit embodiments that may be employed in connection with the exemplary progressive read-out pixels described above. FIG. 15A, for example, illustrates a column read-out circuit 350 formed by sample-and-hold bank 351, analog-to-digital converter (ADC) 353, sense amplifier 355 and ADC-enable gate 357. Sample-and-hold (S/H) bank 351 includes switch elements and analog storage elements (e.g., capacitive elements) to enable the reset-state and signal-state of a selected pixel (delivered via column "Vout" line) to be sampled and held in response to assertion of reset-state and signal-state control signals. In one embodiment, the pixel reset-state and signal-state signals are output differentially (e.g., signal-state−reset-state) from S/H bank 351, thus enabling sense amplifier 355 and ADC 353 to receive measurement signals that reflect the state of the floating diffusion less a variable (i.e., noisy) reset level. In the embodiment shown, sense amplifier 355 and ADC 353 receive separate reference signals ("SA Ref" and "ADC Refs") for application in overthreshold detection and ADC operations, respectively. More specifically, when a compare-strobe signal ("Compare") is pulsed, a threshold comparison is triggered within sense amplifier 353, yielding a logic high or low comparison result according to whether the S/H signal output (and thus the noise-corrected pixel signal-state) exceeds the sense-amp reference signal (i.e., a spillover threshold or conditional-reset threshold as described above). The comparison result is fed back to the pixel column as the conditional-reset signal discussed above, and is also supplied to logic gate 357 to selectively enable an analog-to-digital conversion operation within ADC 353. That is, if sense amplifier 355 signals an overthreshold condition (a logic '1' comparison result in this example), then an ensuing convert-strobe pulse ("Convert") is enabled to pass through logic AND gate 357 (i.e., by virtue of the high sense-amp output) to a convert-enable input of ADC 353, thereby triggering the ADC operation. In one embodiment, a buffer 359 is provided to store the resulting N-bit ADC value (e.g., an 8-bit to 12-bit value in a number of embodiments, though higher or lower resolutions may apply in all cases), as well as the comparison result from sense amplifier 355, the latter forming a validity bit "V" that qualifies ADC content within buffer 359 as containing valid or non-valid data. Accordingly, if no detectable spillover has occurred within the pixel being read-out, the logic-low comparison result will not only suppress the ADC operation (saving power), but also qualify the content of the read-out buffer, thereby permitting compression of the outgoing data stream. This result is indicated in the timing waveform at 360 by the dashed ADC data transmission—showing generation and transmission of ADC data only if the pixel measurement exceeds the spillover threshold (V=1).

FIG. 15B illustrates an alternative read-out circuit embodiment 365 that lacks a sense amplifier and instead applies ADC circuit 353 to perform both the threshold comparison and, if necessary, generation of ADC data corresponding to full pixel read-out. As before, S/H bank 351 outputs a measurement signal that reflects the difference between the signal-state and reset state during spillover (partial read-out) and full read-out operations. A compare-strobe ("Compare"), when asserted, is applied via logic OR gate 368 to an enable-convert input of the ADC to enable an ADC operation with respect to the measurement signal acquired during a partial-read operation (i.e., application of VTG$_{Partial}$ to the transfer gate of a selected pixel as discussed above). If the ADC output exceeds a digital threshold value (i.e., a multi-bit digital value or digital number), comparator 367 asserts a conditional-reset/overthreshold signal (e.g., to a logic '1' state in the example shown), thereby enabling an ensuing convert-strobe pulse ("Convert") to pass through logic AND gate 369 (and logic OR gate 368) to trigger another ADC operation, this time with respect to a measurement signal acquired during a full read-out operation. As in the embodiment of FIG. 15A, the conditional-reset signal is driven back to the pixel column to enable the full-read (and pixel reset) operation within the subject pixel, and is also output to read-out buffer 359 to be stored as a validity bit, qualifying the corresponding ADC data content of that buffer. Although the compare-strobe, convert-strobe and transmit-data waveforms in the embodiment of FIG. 15B (i.e., shown at 370) are illustrated as matching those in FIG. 15A, a somewhat larger delay may be imposed between the compare-strobe and convert-strobe pulses to account for the additional time required within ADC to digitize the S/H partial-read measurement. In both cases, the interval between the compare-strobe and convert-strobe pulses may be different from the intervals shown, for example, to align the read-out timing operations with the pixel operations described above (e.g., as shown in FIG. 11).

FIG. 15C illustrates a variation (375) of the read-out circuit embodiment of FIG. 15B. In general, the sequence of read-out operations is as discussed in reference to FIG. 15B except that the partial-read ADC output is latched within read-out buffer 377 and, if underthreshold (i.e., no conditional reset and thus no subsequent full-read ADC output), the digitized partial-read measurement is transmitted off chip together with an overthreshold bit (OT) that indicates whether the overthreshold condition has been detected. If the partial-read ADC output exceeds the spillover threshold, then the full-read measurement is digitized in a second ADC operation and stored within the read-out buffer, overwriting the partial-read ADC value. By this operation, a valid pixel read-out value, reflecting either a partial read-out (OT=0) or a full read-out (OT=1) is transmitted to an external destination regardless of whether the spillover threshold is exceeded, thus permitting a sequence of partial-readout values to be accumulated (integrated) within the final pixel value. Note that storage and transmission of the OT bit may be omitted, particularly in embodiments in which ADC measurements are aggregated or otherwise combined without regard to whether their acquisition occurred in a full or a partial read-out operation.

Image Decimation and Pixel Binning

A number of conditional-reset image sensor embodiments described herein are operable in decimation modes that yield less than maximum image resolution. For example, in one embodiment an image sensor capable of generating an 8 MP (8 megapixel) output in a still-image mode, yields a 2 MP output in a decimated, high-definition (HD) video mode; a 4:1 decimation ratio (higher or lower resolutions may apply in each mode, and other decimation modes and ratios may be achieved in alternative embodiments; also, if the still and video frame aspect ratios differ, some areas of the sensor may not be used at all in one or the other modes).

While post-digitization logic may be provided to decimate full-resolution data (e.g., on-chip logic at the output of the ADC bank or off-chip processing logic), pixel charge aggregation or "binning" within the pixel array and/or voltage binning within sample-and-hold storage elements is applied in a number of embodiments to effect pre-digitization (i.e., pre-ADC and thus analog) decimation, obviating die-consuming and power-consuming digital binning logic and, in many cases, yielding improved signal-to-noise ratio in the decimated output.

FIG. 16 illustrates a quad-pixel, shared floating diffusion image sensor architecture in which the row and column transfer-gate control lines (TGr and TGc) disclosed in the embodiments above are applied in a manner that enables multiple decimation modes without requiring additional array-traversing control lines. More specifically, by centralizing a shared floating diffusion 401 between four pixels (each including a respective photodiode, PD1-PD4, and transfer-enable transistor, 403.1-403.4, and transfer gate, 404.1-404.4) and splitting the column transfer-gate control line TGc into separate odd and even column-enable lines (TGc1 and TGc2, each coupled to a respective logic OR column-line driver 421, 423), it becomes possible to charge-bin all or any subset of the pixels in a decimation mode and also to operate and read-out each pixel individually a non-decimated (full-resolution) mode.

In the particular embodiment shown, the shared floating diffusion 401 (illustrated in two interconnected parts for drawing simplicity) is switchably coupled to photodiodes PD1-PD4 of the four pixels through respective transfer gates 404.1-404.4, with each transfer gate controlled by a different pair of TGr and TGc signals within the control signal matrix. That is, transfer gate 404.1 is controlled by transfer-enable transistor 403.1 via control signals TGr1/TGc1, transfer gate 404.2 is controlled by transfer-enable transistor 403.2 via control signals TGr2/TGc1, transfer gate 404.3 is controlled by transfer-enable transistor 403.3 via control signals TGr1/TGc2 and transfer gate 404.4 is controlled by transfer-enable transistor 403.4 via control signals TGr2/TGc2. As in the shared-element pixel arrangements described above, the shared floating diffusion 401 is coupled to a shared source follower 405, row-select transistor 407 and reset transistor 409, thus enabling a more compact quad-pixel layout. Moreover, as shown in the exemplary physical-layout diagram of FIG. 17, the four transfer gates ("TG") may be physically disposed at the corners of a centralized floating diffusion (FD) with transfer-enable transistors, reset gate, source follower and row-select transistors formed at the periphery of the quad-pixel layout, thus effecting a highly compact quad-pixel footprint that may be repeated in row and column dimensions across a multi-megapixel array.

FIGS. 18A and 18B illustrate color filter array (CFA) patterns that may be employed with respect to the quad-pixel architecture of FIGS. 16 and 17 and that may dictate practical decimation modes. In the CFA pattern of FIG. 18A, for example, the green corner pixels (G) that include photodiodes PD1 and PD4 (i.e., PD1 and PD4 are disposed beneath green color filter elements) may be binned in a 4:3 charge-binning decimation mode, while in the CFA pattern of FIG. 18B, which includes, white, green, red and blue color filters, both pairs of corner pixels in each quad-pixel (i.e., the pixels that photodiodes PD1 and PD4, and the pixels that include photodiodes PD2 and PD3) may be charge-binned in a 4:2 decimation mode. Other charge-binning arrangements may be employed with respect to other CFA patterns and/or black and white (or grayscale) imaging.

FIGS. 19 and 20 present timing diagrams illustrating exemplary phases of full-resolution (non-binning) and binned-mode pixel read-out operations, respectively, within an image sensor containing the 2×2 quad-pixel arrangement shown in FIG. 16. For purposes of example, different read-out gain configurations are assumed during partial read-out (threshold testing) and full-read out operations within each of the timing diagrams, with separate sets of sample and hold elements being applied to capture reset-state and signal-state samples during those read-out operations. Examples of different gain configuration circuits and their benefits are described below in reference to FIGS. 25A-25C, 26 and 27.

Turning first to the full-resolution read-out of FIG. 19, a reset operation is performed in phase 1 (delineated at the bottom of the timing diagram) by fully asserting the transfer-gate row signal as shown at 420 for the row being read-out (TGri), together with the odd and even transfer-gate column signals (TGc1, TGc2), thereby applying the full read-out potential to the transfer gates for the even and odd columns within the selected row to enable charge transfer from the corresponding photodiodes to the shared floating diffusion (i.e., resetting the photodiodes to an initial state in preparation for charge integration). After lowering the TGri signal, the reset-enable signal (RG) is pulsed at 422 to switch on the reset transistor and thus reset the floating diffusion. During integration phase 2 (duration not shown to scale), charge is integrated/accumulated within the photodiodes according to the intensity of the incoming light. During odd-column threshold-testing phase 3a, the RG signal is pulsed a second time at 424 to reset the floating diffusion, and reset-state sample-and-hold signals SHRsa and SHRadc are pulsed at 426 and 428 while row-select line RSi is high to enable the reset-state of the floating diffusion to be sampled within the sample-and-hold elements for the sense amplifier and ADC, respectively. After the reset-state of the floating diffusion is sampled, the even column transfer-gate signal (TGc2) is lowered (while TGc1 is held high) and TGri is raised to the $VTG_{partial}$ potential to enable a threshold-test read-out with respect to the odd-column pixel. At 430, a signal-state sample-and-hold signal, SHSsa, is raised to enable a sample of the floating diffusion state (i.e., any spillover charge therein) to be captured within a sample-and-hold element for the sense-amplifier, and, at 432, the compare-strobe signal ("Compare") is pulsed to enable the sense amplifier component of the read-out circuit to generate a comparison result between the floating diffusion signal state (less the reset state) and the conditional-reset (spillover) threshold.

The odd-column transfer-gate signal (TGc1) is lowered following capture of the floating diffusion signal-state at 432 and prior to raising the row transfer-gate signal to the fully-on ($VTG_{full}$) potential in odd-pixel, conditional read-out phase 4a. More specifically, if the comparison result indicates an underthreshold condition, the TGc1 line is held low while TGri is raised to the $VTG_{full}$ potential, thereby suppressing the full pixel read-out and allowing the charge integrated within the photodiode during integration phase 2 to remain undisturbed and serve as the initial state during a subsequent integration interval (i.e., continued integration). By contrast, if the sense-amp comparison result indicates an overthreshold condition (i.e., the charge accumulated during integration phase 2 exceeds the conditional-reset threshold), then the TGc1 line is raised as shown by the dashed pulse at 434 concurrently with application of the $VTG_{full}$ potential on TGri, thereby applying $VTG_{full}$ to the odd-pixel transfer gate to enable a full pixel read-out operation. Shortly thereafter, just prior to the conclusion of the odd-pixel conditional read-out, signal-state sample-and-hold signal SHSadc is pulsed (as shown at 436) to capture a sample of the odd-pixel read-out signal within the signal-state sample-and-hold element for the ADC. At 438, after capturing the odd-pixel read-out signal in the ADC sample-and-hold element, the convert-strobe is pulsed to trigger an ADC operation with respect to the differential between the reset-state and signal-state samples captured within the ADC sample-and-hold elements.

At the conclusion of the odd-pixel conditional read-out (i.e., phase 4a), the row transfer-gate signal is lowered so that, in the ensuing even-pixel threshold testing phase 3b, assertion of the odd-pixel column transfer-gate signal TGc1 at 440 drives the odd-pixel transfer gate low (ensuring isolation between the photodiode and floating diffusion), thus enabling the floating diffusion to be reset by the RG pulse at 442 without disturbing the odd-column pixel state. Still in phase 3b, the even-column transfer gate signal is raised at 446 concurrently with assertion of the SHRsa pulse at 448 to acquire a reset-state sample of the floating diffusion. As in the odd-pixel threshold test, the row transfer-gate signal TGri is raised to the partially-on potential (VTGpartial) at 450 (while TGc2 remains high), thereby enabling charge spillover from the even-pixel photodiode to the floating diffusion if an over-threshold condition exists within the photodiode. At 452, SHSsa is pulsed to sample the even-pixel signal-state and the compare-strobe is pulsed at 454 to enable an even-pixel overthreshold determination (even-pixel signal-state less floating diffusion reset-state) within the read-out sense-amplifier. As with the odd-pixel, if the comparison result from the sense amplifier indicates an overthreshold condition, the even-pixel column transfer gate signal is asserted at 456 concurrently with elevation of the TGri potential to the fully-on level ($VTG_{full}$), thus enabling a full read-out of the even-pixel signal state followed by assertion of the SHSadc and convert-strobe signals (at 458 and 460, respectively) to yield an even-pixel ADC result. If the comparison result from the sense amplifier indicates an underthreshold condition, the TGc2 pulse at 456 is suppressed to avoid disturbing the state of the even-pixel photodiode, thus leaving the charge on the photodiode intact for continued integration.

Still referring to FIG. 19, in data-transfer phase 5, the row-i ADC values for the even and odd pixels are transmitted (e.g., to an off-chip image processing destination) one after another to an on-chip or off-chip image processing destination. As discussed above, in the case of an underthreshold condition with respect to a given pixel, analog-to-digital conversion with respect to that pixel may be suppressed and/or the ADC output omitted from the outgoing data stream. In any case, data transmission with respect to a selected pixel row may be pipelined with pixel read-out operations within subsequent rows as shown, for example, by the transmission of row i−1 data concurrently with phases of the read-out operation with respect to row i pixels.

In the binned-mode read-out timing diagram of FIG. 20, hard-reset and integration operations (phases 1 and 2) are executed as described above in reference to FIG. 19, as is the floating diffusion reset (i.e., asserting RG while TGc1 and TGc2 are high, and sampling the reset-state in response to assertion of the SHRsa and SHRadc signals) at the start of threshold-testing phase 3. Thereafter, partial read-out operations are executed one after another with respect to corner pixels (i.e., containing photodiodes PD1 and PD4, in the example shown), by driving TGr1 to the partially-on state at 476 concurrently with assertion of TGc1 and deassertion of TGc2, and then driving TGr2 to the partially-on state at 478 concurrently with assertion of TGc2 and deassertion of TGc1. By this operation, any spillover charge from photodiodes PD1 and PD4 is aggregated in the floating diffusion and thus captured within the sense amp sample-and-hold element when SHSsa is asserted at 480. Accordingly, assertion of the compare-strobe signal at 482 enables a comparison of the aggregated the spillover charge from PD1 and PD4 (less the reset-state of the floating diffusion) and the conditional reset/conditional read-out threshold. If the comparison result indicates an overthreshold condition, TGc1 and TGc2 are pulsed one after another at 484 and 486 (and each concurrently with assertion of the VTG$_{full}$ potential on corresponding row lines TGr1 and TGr2, respectively) to enable the remainder of the charge accumulated within the corner photodiodes (PD1 and PD4) to be transferred to the floating diffusion, charge binning the pixel integration results and resetting each pixel in preparation for the next charge integration interval. Accordingly, when the SHSadc signal is pulsed at 488, the photodiode charge binned (or aggregated) within the floating diffusion is captured within the signal-state sample and hold element for the ADC, thus enabling an ADC operation with respect to the combined charge from the corner pixels (less the floating diffusion reset state) when the convert-strobe is pulsed at 490. The resulting digitized pixel value (i.e. ADC output) for row i may be transmitted to off-chip or on-chip processing logic during read-out of the following pair of pixel rows.

Still referring to FIG. 20, if the comparison result output by the read-out sense amplifier indicates an underthreshold condition, the TGc1 and TGc2 signal assertions shown at 484 and 486 are suppressed to avoid disturbing the contents of the subject photodiodes, thereby permitting continued integration during a subsequent subframe interval. While the timing sequence shown yields the output of binned results from the corner pixels containing photodiodes PD 1 and PD4 (i.e., northwest and southeast corners in the layout shown in FIGS. 16 and 18), the waveforms output onto signal lines TGc1 and TGc2 may be swapped to yield binned results from corner pixels containing photodiodes PD2 and PD3. Further, read-out of the aggregated (binned) charge within all four photodiodes may be effected by performing additional partial-read operations in phase 3 (i.e., repeating the TGr1, TGr2 partial-on pulses, but reversing the assertion sequence of column transfer gate signals TGc1 and TGc2 to effect partial-reads of photodiodes PD2 and PD3), and then, if an overthreshold result is detected, performing additional full read-out operations in phase 4 (i.e., repeating the TGr1 and TGr2 fully-on pulses, but reversing the assertion sequence of column transfer gate signals TGc1 and TGc2).

Figure 21:
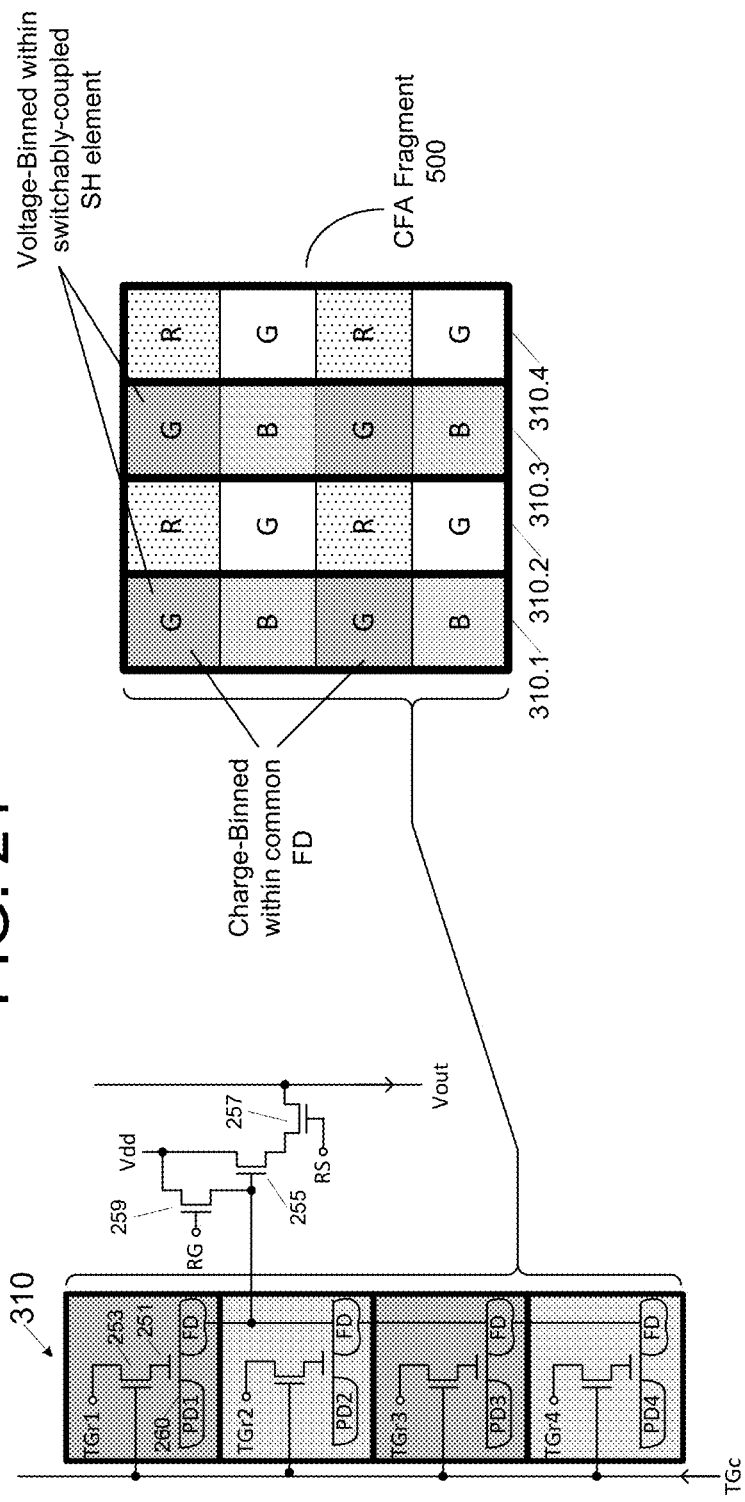
FIG. 21 illustrates an alternative binning strategy that may be executed with respect a collection of 4×1 quad-pixel blocks in conjunction with a color filter array.

FIG. 21 illustrates an alternative binning strategy that may be executed with respect to a collection of 4×1 quad-pixel blocks 310 and the color filter array (CFA) fragment shown at 500. In the embodiment shown, each quad pixel block 310 (shown at 310.1-310.4 with respect to the CFA fragment) is implemented generally as described in reference to FIG. 14 and may be read-out according to any of the read-out techniques described in reference to FIGS. 14 and 15A-15C. As shown, CFA fragment 500 (i.e., a sufficient portion of a sensor-wide CFA to demonstrate the CFA pattern) includes collections of like colored filter elements at the corner pixels of each 3×3 pixel group. Thus, green filter elements are disposed over shaded pixels 'G', blue filter elements are disposed over striped pixels 'B' and red filter elements are disposed over hashed pixels 'R'. In this arrangement, each pair of like-filtered pixels (i.e., subject to light filtered by same-color filter elements, R, G or B) disposed in the same quad-pixel block thus permit charge binning within their shared floating diffusion as detailed below. Further, referring to FIG. 22, by fixing column offset between the pixel pair within each column and the like-filtered pair of pixels coupled to the same row lines (i.e., fixed at a spacing of two columns in the example shown) and by providing switching elements at the column read-out points of pixel array 551 (i.e., switching elements 561 and 562 within sample-and-hold circuitry 553), it becomes possible to "voltage-bin" the results of the two charge-binned pixel pairs within sample-and-hold circuitry 553, thus combining (i.e., aggregating, binning) the four corner pixels in each 3×3 pixel group prior to digitization within the ADC elements of SA/ADC block 555.

Figure 22:
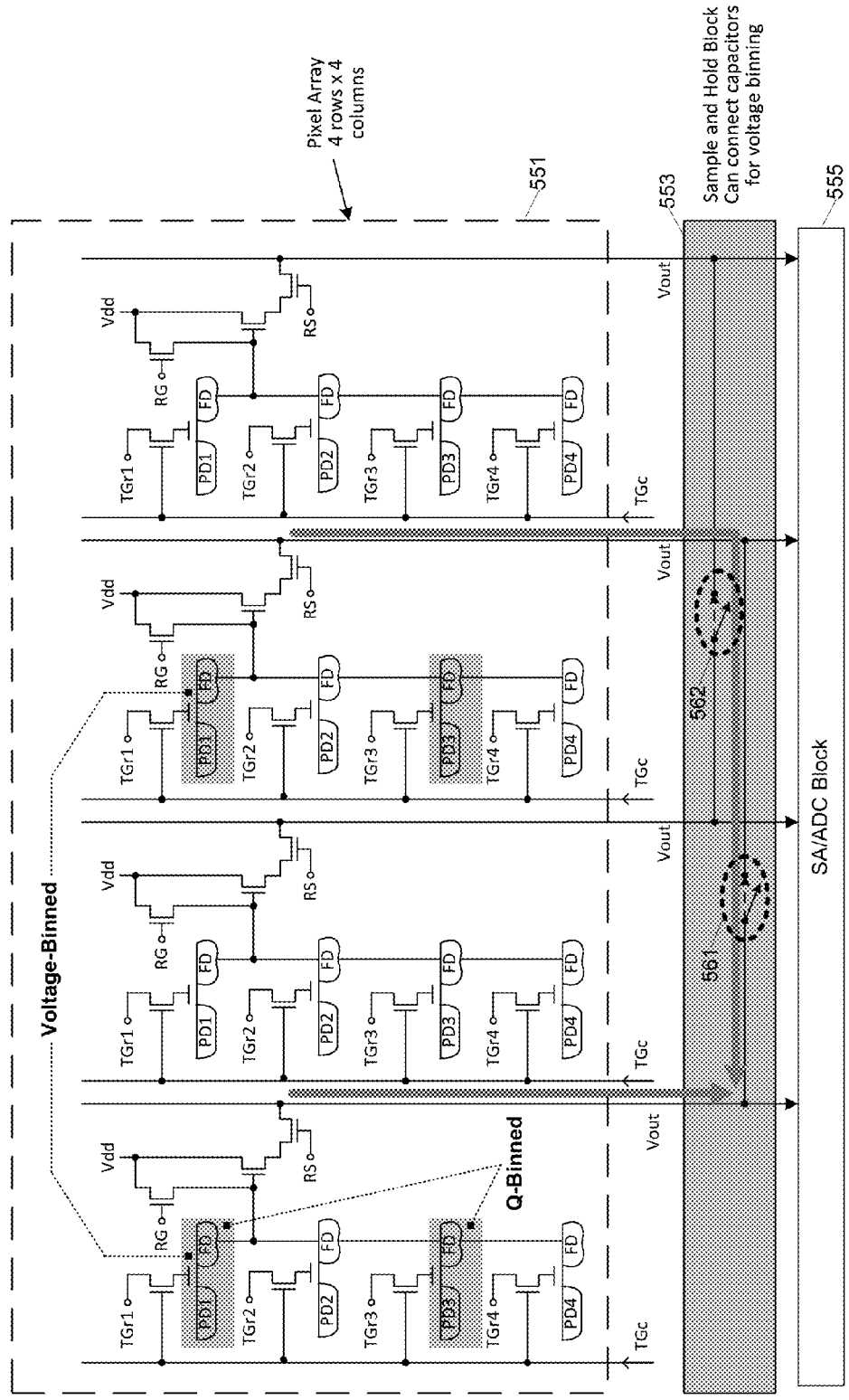
FIG. 22 illustrates a column-interconnect architecture that may be applied to enable voltage-binning of analog signals read-out from selected columns of 4×1 quad-pixel blocks.
Figure 23:
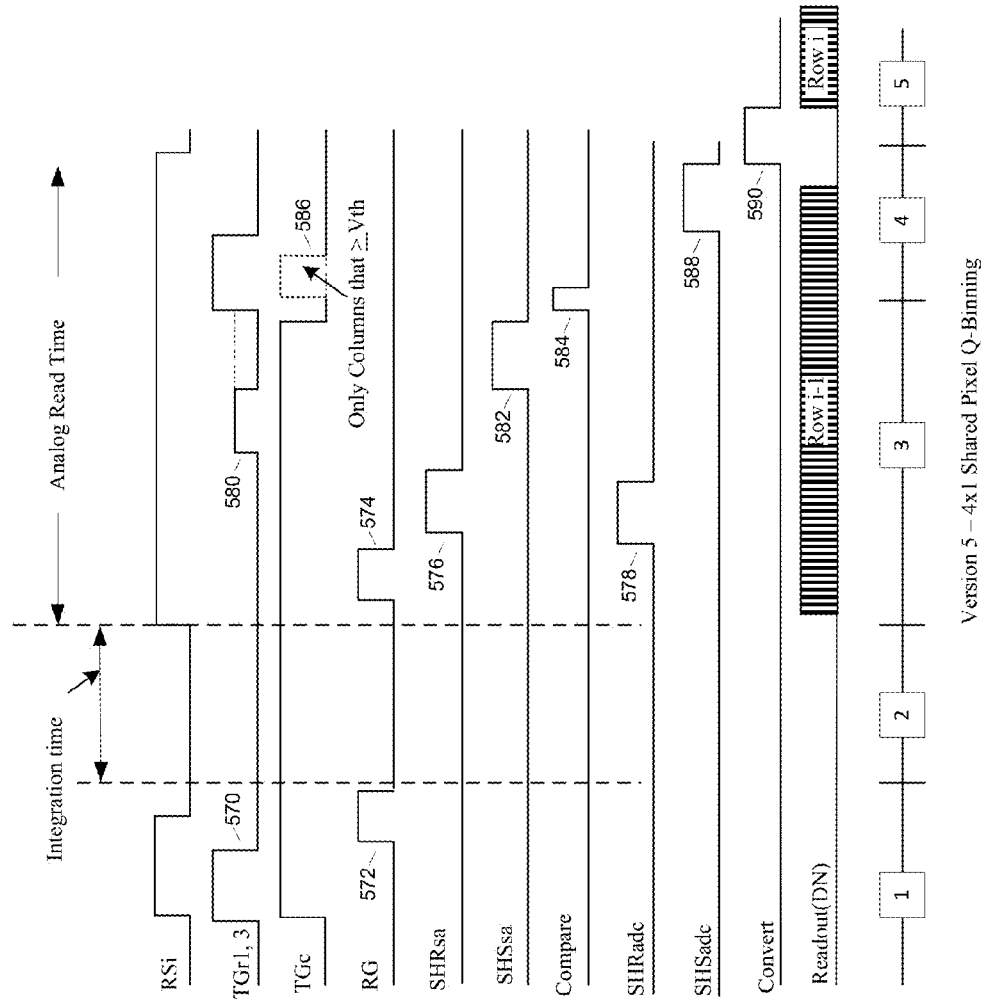
FIG. 23 illustrates an exemplary timing diagram of binned-mode read-out operations within the 4×1 quad-pixel architecture of FIGS. 21 and 22.

FIG. 23 illustrates an exemplary timing diagram of binned-mode read-out operations within the 4×1 quad-pixel architecture of FIGS. 21 and 22. In the example shown, row lines in pixel rows i and i+2 are operated in lock step to achieve 2:1 charge binning within the shared floating diffusion of a given quad-pixel block. More specifically, row signals for pixel rows 1 and 3 of a 4×1 quad pixel block (or row of such quad pixel blocks) are asserted in unison, followed by locked-step assertion of row signals for pixel rows 2 and 4, before advancing to assert row signals for the next row of 4×1 quad pixel blocks. Transverse connections are established within sample-and-hold switch elements (e.g., at 561 and 562 of sample-and-hold block 553 as shown in FIG. 22) to achieve 2:1 voltage binning and thus an overall 4:1 analog signal summing and concomitant image decimation.

Referring more specifically to FIG. 23, the row-select signals (RS), reset-gate signals (RG) and row transfer-gate signals (TGr1, TGr3 or "TGr1,3") are operated in lock step to reset the photodiodes and shared floating diffusion of the selected pixel rows during hard-reset phase 1, permit charge integration during integration phase 2, determine whether the charge-binned and voltage-binned charge-accumulation results within each column-interleaved collection of four pixels (i.e., the 3×3 corner pixels as described in reference to FIGS. 21 and 22) exceed the conditional-reset threshold in threshold-test phase 3, and, if an overthreshold condition is detected, conditionally read-out and digitize the full charge-binned and voltage-binned accumulated charge within the subject pixel collections in conditional read-out phase 4 before transmitting the digitized pixel value to downstream (on-chip or off-chip) processing logic in output phase 5. Considering the phases one by one, during hard-reset phase 1, the row-transfer gate signals TGr1 and TGr3 are pulsed to VTG$_{full}$ (as shown at 570) while simultaneously raising column transfer-gate signal TGc, thus transferring accumulated charge from photodiodes PD 1 and PD3 to their shared floating diffusion node. After the photodiode-to-floating-diffusion charge transfer, reset signal RG is pulsed at 572 to clear charge from the floating diffusion in preparation for the ensuing charge integration in phase 2. At the start of threshold-test phase 3, the reset signal is pulsed again (574) to reset the floating diffusion and then signals SHRsa and SHRadc are pulsed at 576 and 578 (while RSi is asserted) to capture samples of the reset-state of the floating diffusion within the sample-and-hold elements for the sense amplifier and ADC. At 580, TGr1 and TGr3 are raised to the partial-on transfer potential, VTG$_{partial}$, to enable charge spillover to the shared floating diffusion if an overthreshold condition exists in the photodiodes of the subject pixels. The SHSsa signal is then pulsed at 582 while the transverse-interconnect switch elements (e.g., transistors) are switched to a conducting state within the sample and hold bank to capture the signal-state of the floating diffusion nodes within related columns (i.e., column j and column j+2 in the embodiment shown) within a shared sample-and-hold element, thus voltage binning the two charge-binned spillover samples. The threshold-test phase is concluded by lowering the TGc signal and asserting the compare-strobe (584) to trigger a threshold comparison within the sense amplifier, comparing the aggregated spillover charge from the four charge/voltage binned pixels against a conditional-reset threshold. If the comparison result indicates an overthreshold condition, the TGc signal is pulsed at 586 during application of VTG$_{full}$ on the TGr1 and TGr3 lines, (thus enabling a full read-out of photodiodes PD1 and PD3 to the shared floating diffusion within corresponding quad pixel block), and then the SHSadc signal is raised at 588 to capture the signal-state of the floating diffusion nodes of switch-interconnected pixel columns within a signal-state sample-and-hold element for the ADC (i.e., voltage-binning the charge-binned floating diffusion contents). Thereafter, the convert-strobe is pulsed at 590 to trigger an ADC operation with respect to the voltage/charge-binned signal state captured within the sample-and-hold circuit (if any), followed by transmission of the ADC output in phase 5. As discussed above, the ADC operation and data transmission operations may be suppressed to save power and reduce signaling bandwidth if an overthreshold condition is not detected in threshold-test phase 4.

Figure 24:
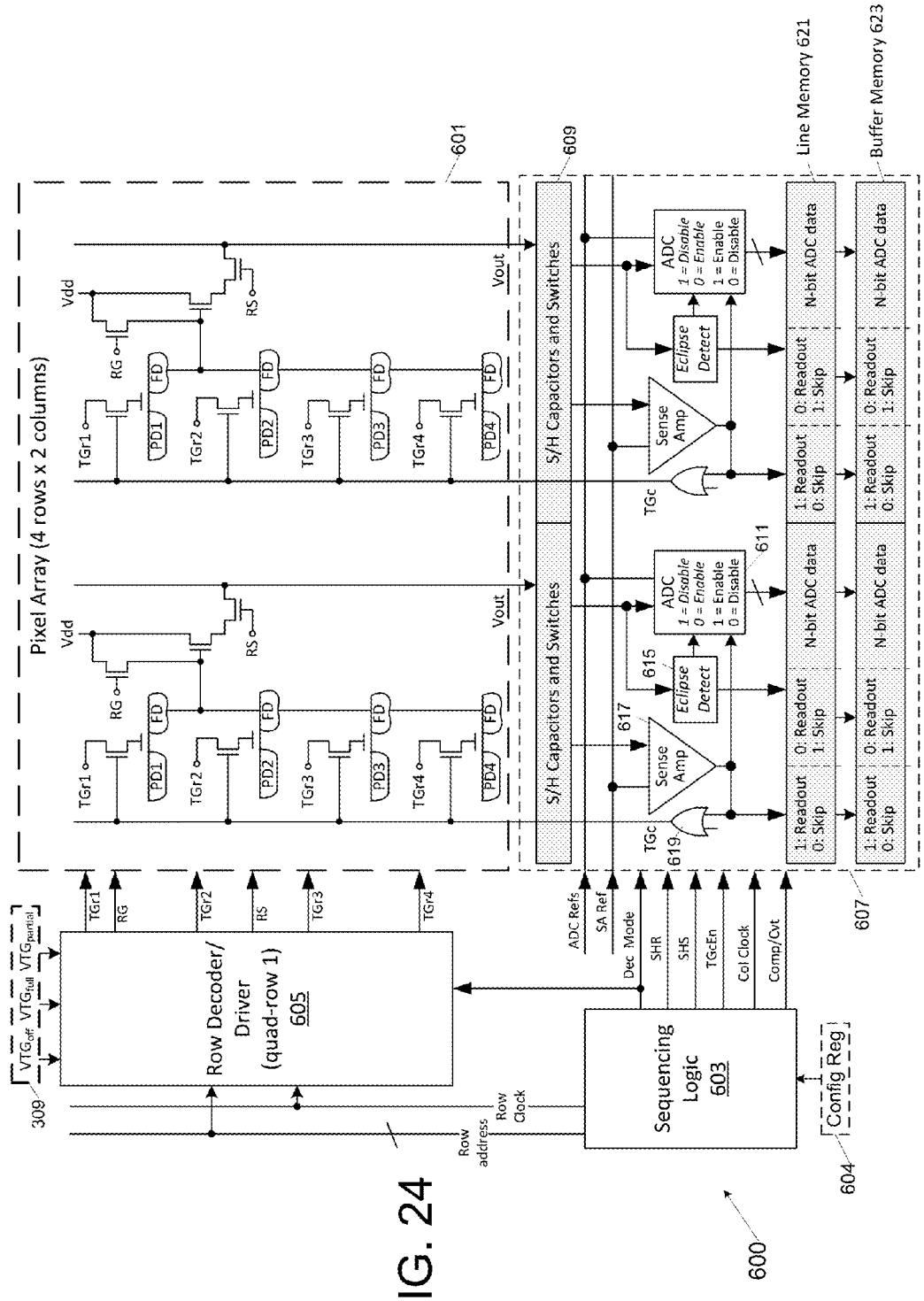
FIG. 24 illustrates a more detailed embodiment of an image sensor having an array of 4×1 quad pixel blocks operable in the decimation (binning) mode described in reference to FIGS. 21-23.

FIG. 24 illustrates a more detailed embodiment of an image sensor 600 having an array of 4×1 quad pixel blocks 601 operable in the decimation (binning) mode described in reference to FIGS. 21-23. As in the embodiment of FIG. 14, a row decoder/driver 605 receives transfer gate voltages (e.g., $VTG_{partial}$, $VTG_{full}$ and $VTG_{off}$) from an on-chip or off-chip voltage source 309 and a row address value and row clock (used to control row signal timing) from sequencing logic 603, outputting row control signals, RG, RS and TGr1-TGr4 in response. Sequencing logic additionally outputs a set of read-out control signals to column read-out circuitry 607, including a column clock signal (which may be composed of multiple timing/control signals for timing operations within the sense amplifiers, ADCs, memory buffers, etc. with column read-out circuitry 607), compare-strobe and convert-strobe signals as described above, the column transfer-gate enable signal (TGcEn), SHR and SHS signals (which may include separate signals for sense amp and ADC sample-and-hold elements). Sequencing logic also outputs a decimation-mode signal ("Dec Mode") to both column read-out circuitry 607 and row decoder/driver 605 to enable/disable the above-described charge and voltage binning operations. For example, in one embodiment, the decimation mode signal is configurable in one of at least two possible states (e.g., according to a decimation mode setting within a programmable configuration register 604), including a binning-disabled state in which pixel rows and columns are operated individually to enable full-resolution image read-out, and a bin-enable state in which the row decoder/driver asserts row signal pairs (e.g., TGr1/TGr3 and then TGr2/TGr4) in locked-step to achieve charge binning within the shared floating diffusion, and in which column read-out lines (Vout) for even and odd column pairs are transversely coupled (e.g., as shown in FIG. 22) to enable voltage binning within sample-and-hold elements.

Still referring to the embodiment of FIG. 24, column read-out circuitry 607 includes, in addition to sense amplifiers 617 and TGc logic gates 619 (which operate generally as described above), a set of column eclipse detect circuits 615, each coupled to receive a pixel reset signal from sample-and-hold block 609, and having circuitry to determine whether the photodiode measurement (whether binned or at full resolution) exceeds a saturation threshold. If a given eclipse-detector 615 (e.g., implemented by a threshold comparator) detects a saturation condition (i.e., saturation threshold exceeded), the eclipse detector raises an eclipse signal at a secondary enable input of ADC circuit 611 to disable ADC operation therein. The eclipse signal is also output to a line memory element 621 to qualify the ADC output, being recorded therein as a logic '1' eclipse bit if a saturation condition was detected (thus indicating that the ADC output is invalid and in fact should be represented by a maximum read-out value) and a logic '0' eclipse bit otherwise. By this operation, the eclipse bit and underthreshold bit recorded for each pixel column serve jointly to qualify the corresponding ADC output as follows (where 'X' indicates a don't care status):

TABLE 1

| Under-threshold | Eclipse | ADC Value | Interpretation |
|---|---|---|---|
| 0 | 0 | Invalid | Underthreshold: ADC output assumed to be 0 |
| X | 1 | Invalid | Saturation:, ADC output assumed to be all '1's |
| 1 | 0 | Valid | Overthreshold without Saturating |

Still referring to FIG. 24, when the binning mode is set to enable voltage binning between column pairs (e.g., even numbered columns voltage binned and odd-numbered columns voltage binned), the sense amplifier and ADC within one column in each binned column pair may be disabled to save power, with the transmitted data stream decimated according to the binning mode.

Dynamic-Gain Pixel Read-Out

As briefly mentioned in connection with FIGS. 19 and 20, different gains may be applied during partial and full read-out operations. That is, because the spillover charge during a partial read-out may be exceedingly small (i.e., where the charge integration level barely exceeds the conditional-reset threshold), it may be beneficial to apply a higher gain during the partial read-out. By contrast, because the full read-out may range between minimum and maximum charge integration levels, a significantly lower gain may be applied to normalize those charge levels to the minimum and maximum ADC output values. Accordingly, in a number of embodiments herein (including those described above in reference to FIGS. 19-24), different gains are applied by the column read-out circuitry during partial read-out and full read-out operations.

Figure 25C:
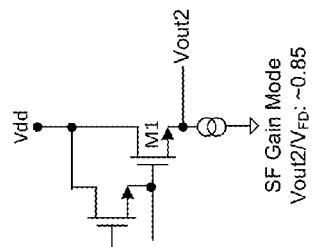
FIGS. 25A-25C illustrate an embodiment of a selectable-gain (or multi-gain) read-out circuit that may be used to effect a high-gain partial read-out and near-unity gain full read-out within a pixel column.
Figure 25B:
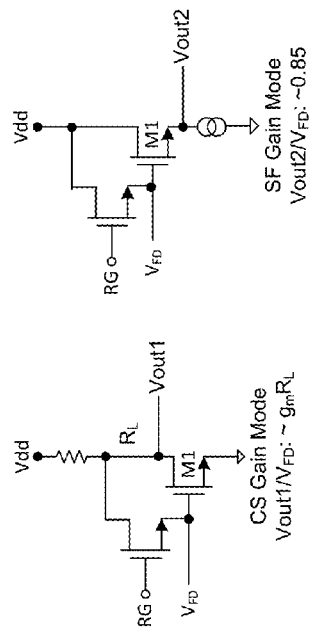
Figure 25A:
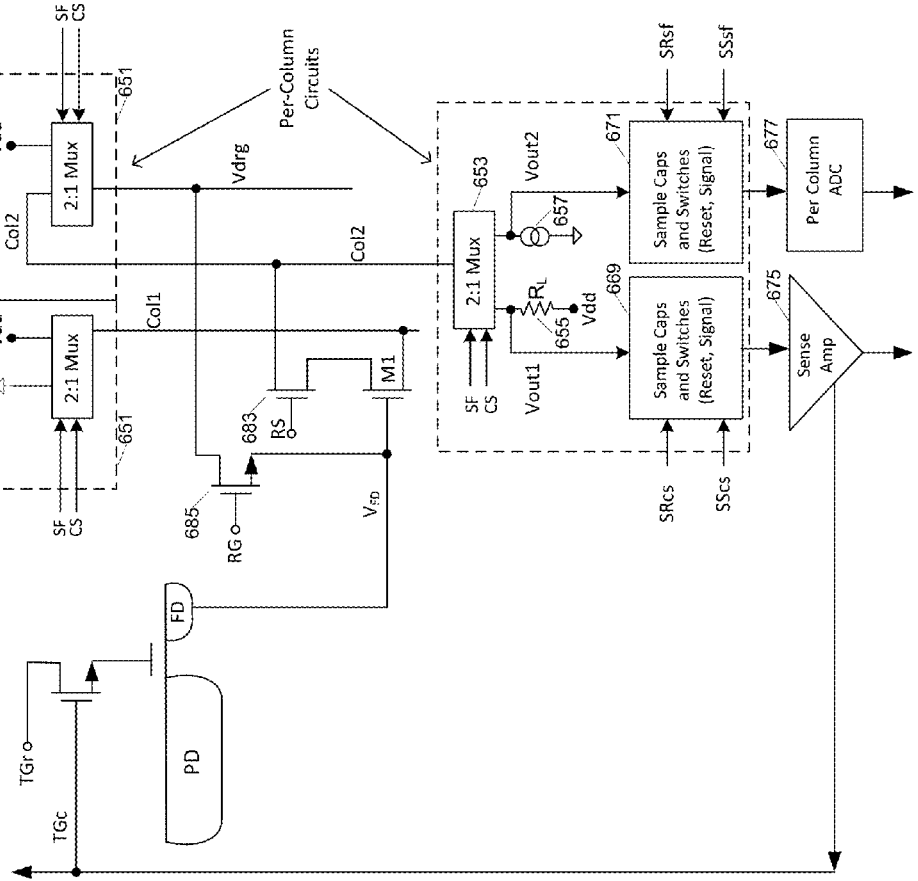

FIG. 25A illustrates an embodiment of a selectable-gain (or multi-gain) read-out circuit that may be used to effect a high-gain partial read-out and near-unity gain full read-out within a pixel column. More specifically, in the implementation shown, multiplexers 651 and 653 are used to establish either a common-source amplifier configuration (gain=transconductance of transistor M1* load resistance $R_L$, where '*' denotes multiplication) or a source-follower configuration (unity gain or near-unity gain) according to the state of multiplexer control signals CS and SF. In the common-source amplifier configuration, (CS=1, SF=0), multiplexer 653 couples column line Col2 to voltage supply rail Vdd via load resistance $R_L$ (655), while multiplexer 651 couples column line Col1 to ground. As shown, Col2 is coupled to the drain terminal of row-select transistor 683 so that Vout1 will vary according to the current flow through transistor M1; a function of the applied gate voltage (floating diffusion charge level) and transconductance of that transistor. More specifically, as can be understood from FIG. 25B (which illustrates the common source gain configuration), Vout1 is given by $Vdd - I_{M1}*R_L$ so that $Vout1/V_{FD}$ is approximately $g_m*RL$, where $g_m$ represents the transconductance of transistor M1. Accordingly, by appropriately sizing M1 and/or $R_L$, a common-source gain substantially greater than unity may be achieved, thus improving sensitivity to the relatively small level of charge that may spillover to the floating diffusion during partial read-out operations. Note that reset transistor 685 is also coupled to the Col2 line, thus enabling the floating diffusion to be pulled up to CS mode Vout (i.e., reset) in response to RG signal assertion while in the common-source gain configuration.

In the source-follower configuration (SF=1, CS=0), multiplexer 653 couples a current source 657 to the Col2 line, and multiplexer 651 couples column line Col1 to Vdd, thus establishing M1 as a source-follower amplifier (i.e., output voltage at M1 source and thus Vout2 follows the floating-diffusion voltage applied at the gate of M1) as shown at FIG. 25C. More specifically, in order to maintain a substantially constant current through the Col2 line, the feedback loop that maintains the constant current source raises the potential at Vout2 as necessary to counteract any conductance change in transistor M1. Accordingly, assuming a substantially linear transconductance within M1, the current source raises and lowers Vout2 in a substantially linear correspondence to increase and decrease in the floating diffusion potential, thus effecting substantially constant proportionality between Vout2 and $V_{FD}$. In the embodiment shown, the constant of proportionality is slightly less than unity (e.g., 0.85 in the specific example depicted, though other proportionality constants, including unity, may be achieved in alternative embodiments or other programmed configurations) in the source follower configuration.

Still referring to FIG. 25A, separate sets of sample-and-hold elements (e.g., capacitive elements and switch elements) 669 and 671 are coupled to the Vout1 and Vout2 nodes, respectively, to accommodate the different gain configurations applied during partial read-out and full read-out operations, with correspondingly separate sets of reset-state and signal-state sample-enable signals applied to the two sample-and-hold circuits. In the example shown, the partial read-out sample-and-hold circuit 669 (i.e., controlled by signals SRcs and SScs in the common-source gain configuration) provides a differential output (i.e., signal-state sample less reset-state sample) to a sense amplifier circuit 675, while the full read-out sample-and-hold circuit 671 (controlled by signals SRsf and SSsf in the source-follower gain configuration) provides a differential output to ADC 677. As in all embodiments having both a sense amplifier and ADC, the sense amplifier may be omitted and the ADC applied during both the partial and full read-out operations as discussed in reference to FIGS. 15B and 15C. In such ADC-only implementations, the outputs of sample-and-hold circuits 669 and 671 may be multiplexed to the input of ADC 677 according to the state of the CS and SF signals. In an embodiment in which the CS and SF signals always have complementary states, a single signal may alternatively be used to switch between common-source and source-follower gain configurations.

Figure 26:
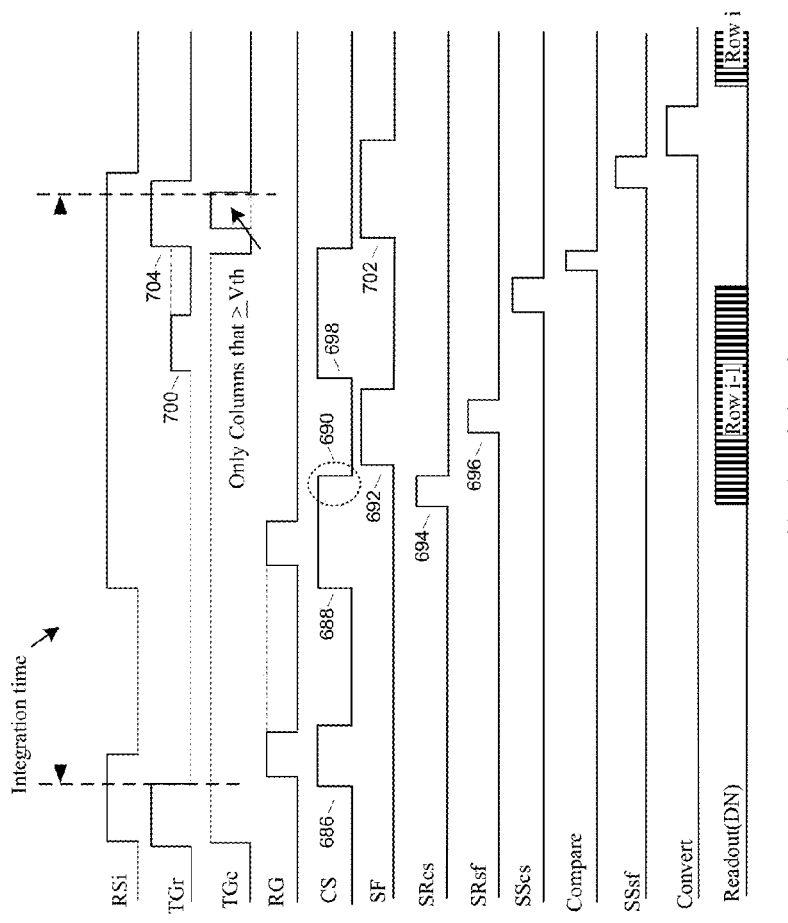
FIG. 26 presents an exemplary timing diagram illustrating the alternating application of common-source and source-follower gain configurations during hard-reset, integration, partial read-out and (conditional) full read-out operations within the multi-gain architecture of FIG. 25A.

FIG. 26 presents an exemplary timing diagram illustrating the alternating application of common-source and source-follower gain configurations during hard-reset, integration, partial read-out and (conditional) full read-out operations within the multi-gain architecture of FIG. 25A. As shown, the common-source enable signal (CS) is asserted at 686 concurrently with the hard-reset RG pulse (i.e., asserted in preparation for charge integration) and at 688 (floating diffusion reset in preparation for reset-state sampling). During at least a portion of the charge integration interval, signal gain may be disabled altogether to save power (i.e., lowering both the SF and CS control signals as shown), though in actuality one or both gain modes may be applied during that interval to enable operations in other pixel rows. During reset-state sampling, the common-source and source-follower gain configurations are enabled one after another as shown at 690 and 692 (i.e., initially holding CS high while SF is low and then reversing that configuration), with reset-state sampling signals SRcs and SRsf being pulsed at 694 and 696 while in the common-source and source-follower gain configurations, respectively, to capture reset-state samples within the different sample-and-hold circuits provided for the two gain configurations. Thereafter, CS is raised at 698 (and SF lowered) to apply the common-source gain configuration during the partial read-out operation (effected by raising TGr to the partially-on state at 700 while TGc is held high and concluding with assertion of the SScs and compare-strobe signals), and then SF is raised at 702 (and CS lowered) to apply the source-follower gain configuration during the ensuing conditional full read-out operation (effected by raising TGr to the full read-out potential at 704 concurrently with conditional pulsing of the TGc signal and concluding with assertion of the SSsf and convert-strobe signals).

Figure 27:
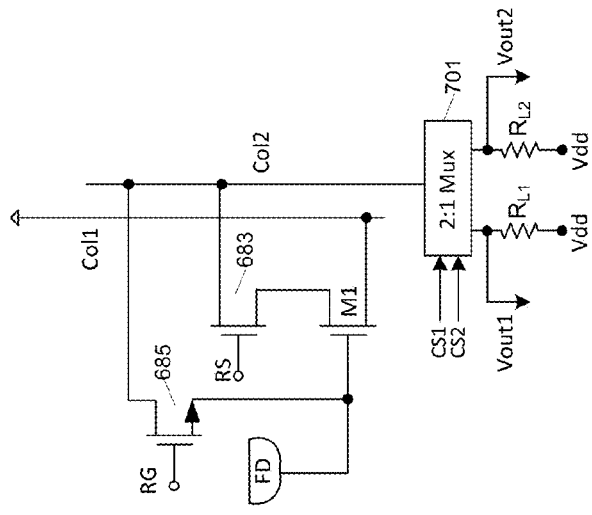
FIG. 27 illustrates an alternative embodiment of a selectable-gain (or multi-gain) read-out circuit that may be used to effect a high-gain partial read-out and near-unity gain full read-out within a pixel column.

Reflecting on the multi-gain architecture described in reference to FIGS. 25A-25C and FIG. 26, it should be noted that other gain configurations or combinations of gain configurations may be used in alternative embodiments. For example, as shown in FIG. 27, two different common-source gain configurations, may be effected by coupling different pull-up resistances (RL1 and RL2) to the col2 line via multiplexer 701, and thereafter selecting one gain or the other (i.e., through appropriate assertion of control signals CS1 and CS2) generally as described in reference to FIG. 26. In another embodiment, a programmable gain amplifier may be coupled to the Col2 and/or Col1 line and switched between programmed settings to effect different partial read-out and full read-out gains. More generally, any practicable configuration or architecture that enables adjustment of the gain applied during partial read-out and full read-out operations may be employed in alternative embodiments.

Image Sensor Architecture, System Architecture

Figure 28:
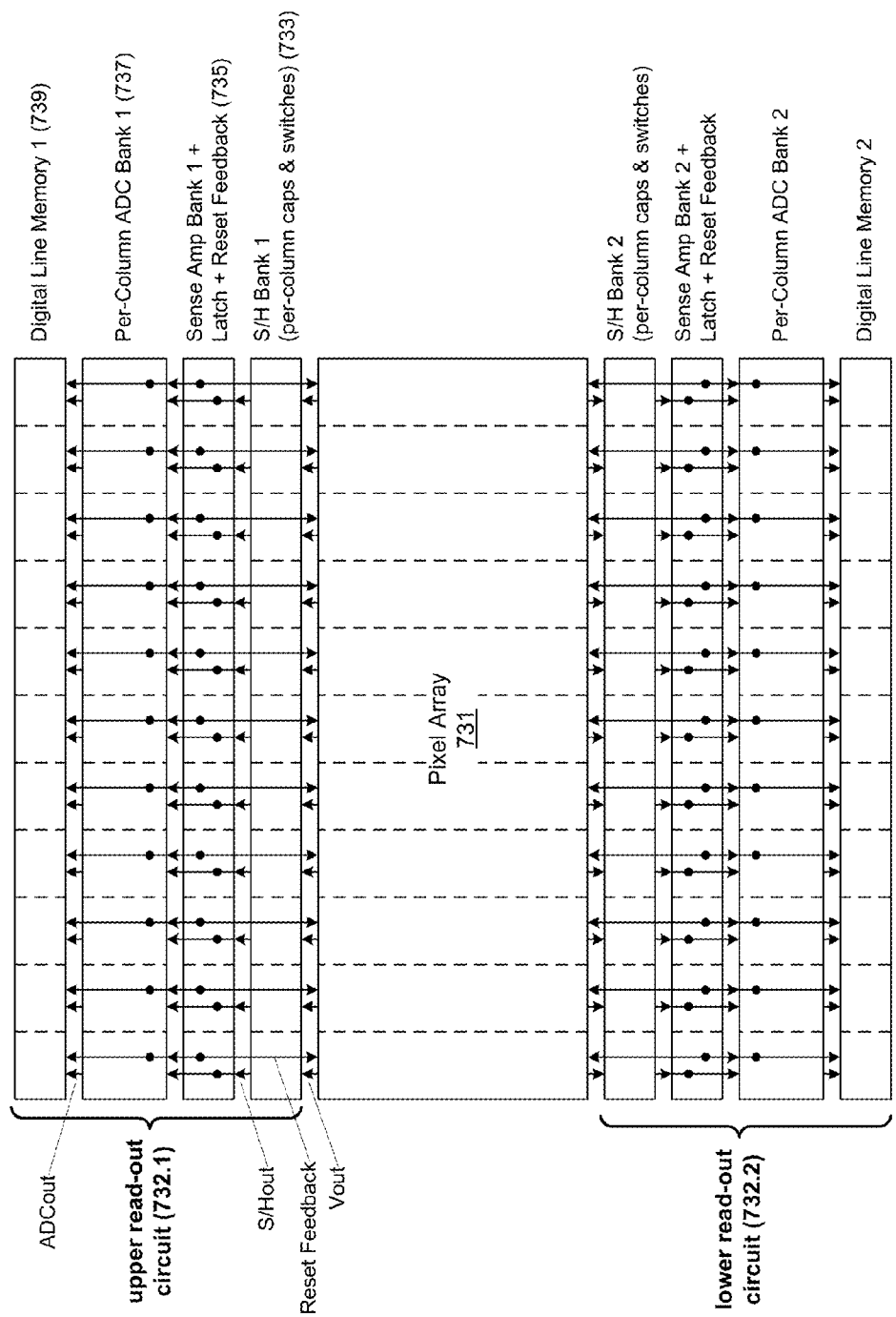
FIG. 28 illustrates an embodiment of an image sensor having a pixel array disposed between upper and lower read-out circuits.

FIG. 28 illustrates an embodiment of an image sensor having a pixel array 731 disposed between upper and lower read-out circuits 732.1 and 732.2. The read-out circuits are coupled to respective halves of the pixel rows in the array and are operable in parallel, thereby halving the time required to scan through the rows of the pixel array. In one embodiment, the pixel rows are allocated between the upper and lower read-out circuits according to the physical half of the pixel array in which the pixel rows reside. For example, all upper pixel rows (i.e., above a physical midpoint) may be coupled to the upper read-out circuit, and all lower pixel rows may be coupled to the lower read-out circuit, thereby reducing the overall column line length (reducing capacitance, noise, required drive power, etc. with respect to each Vout and reset feedback (TGc) line). In other embodiments, the pixel row interconnections to the upper and lower read-out circuits may be interleaved across the rows of pixel arrays, with the connection alternating between upper and lower read-out circuits for each successive row of pixel blocks (e.g., every fourth row in a pixel array populated by the 4×1 quad-pixel block shown in FIG. 21, or every second row in a pixel array populated by the 2×2 quad-pixel block shown in FIGS. 16 and 17, or every other row in a pixel array populated by pixels having dedicated Vout interconnects). In the embodiment shown, each read-out circuit (732.1 and 732.2) includes a sample-and-hold bank 733 (e.g., including per-column capacitive storage elements and switching elements as described above), a sense amplifier bank 735 including per-column sense amplifier circuits (or latches) and reset-feedback logic, a per-column ADC bank 737 and a digital line memory 739. In embodiments that apply the per-column ADCs to digitize partial read-out samples, the sense amplifier bank 735 may be omitted and the per-column ADC bank outfitted with digital comparators to generate reset-feedback signals (i.e., conditional-reset signals, TGc). Also, the sample-and-hold bank may include transverse switching elements as described in reference to FIG. 22 to support voltage binning operations. More generally, the various circuit blocks of the upper and lower read-out circuits may be operated and/or configured as described above to support various decimation modes and read-out options. Though not specifically shown, the upper and lower digital line memories 739 may feed a shared physical output driver (PHY), for example, disposed to the left or right of the pixel array and coupled to receive data in parallel from each of the digital line memories. Alternatively, separate PHYs may be provided with respect to the two digital line memories, with the PHYs being disposed, for example, at an opposite edges of the image sensor IC. Further, while the upper and lower read-out circuits may be implemented on the same physical die as pixel array 731 (e.g., at the periphery of the die (sandwiching the pixel array) or in the center of the die between respective halves of the pixel array, the read-out circuits may alternatively be located on another die (e.g., coupled to the pixel array die in a stacked configuration that may additionally include other imaging-related dies).

Figure 29:
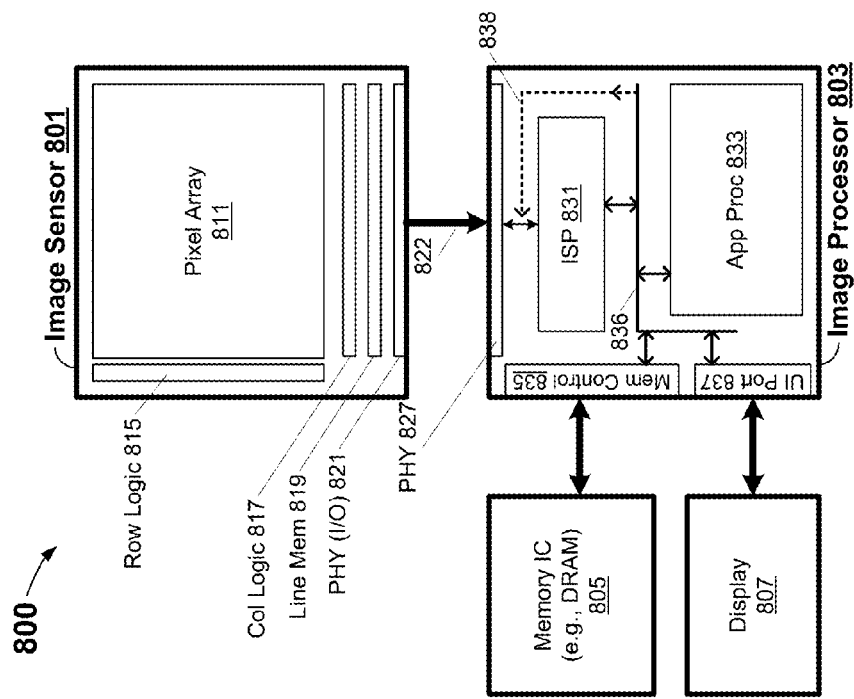
FIG. 29 illustrates an embodiment of an imaging system having a conditional-reset image sensor together with an image processor, memory and display.

FIG. 29 illustrates an embodiment of an imaging system 800 having an image sensor 801, image processor 803, memory 805 and display 807. The image sensor 801 includes a pixel array 811 constituted by temporally-oversampled conditional-reset pixels according to any of the embodiments disclosed herein, and also includes pixel control and read-out circuitry as described above, including row logic 815, column logic 817, line memory 819 and PHY 821. Image processor 803 (which may be implemented as a system-on-chip or the like) includes an image signal processor (ISP) 831 and application processor 833, coupled to one another via one or more interconnect buses or links 836. As shown, ISP 831 is coupled to receive imaging data from the pixel array via PHY 827 (and signaling link(s) 822, which may be implemented, for example, by a Mobile Industry Processor Interface ("MIPI" bus) or any other practicable signaling interface), and the ISP and application processor are coupled to a memory control interface 835 and user-interface port 837 via interconnect 836. Further, as explained below, interconnect 836 may also be coupled to the image sensor interface of ISP 831 (i.e., the ISPs interface to PHY 827) via side-channel 838 to enable the application processor to deliver data to the ISP in a manner that emulates an image sensor.

Still referring to FIG. 29, imaging system 800 further includes one or more memory components 805 coupled to the memory control interface 835 of image processor 803. In the example shown, and in the discussion below, the memory components are assumed to include a dynamic random access memory (DRAM) which may serve as a buffer for image sub-frame data and/or as a frame buffer for other functions. The memory components may additionally include one or more non-volatile memories for long-term storage of processed images.

User-interface port 837 is coupled to a user display 807 which may itself include a frame memory (or frame buffer) to store an image to be displayed for a user (e.g., a still image frame or video frame). Though not shown, user-interface port 837 may also be coupled to a keypad, touchscreen or other user-input circuitry capable of providing information to image processor 803 corresponding to user-input, including operating mode information that may be used to configure decimation modes within the image sensor 801. Although also not shown, image processor 803 may be coupled to image sensor 801 through a sideband channel or other control interface to permit transmission of operating mode, configuration information, operation-triggering instructions (including image capture instructions, configuration-programming instructions, etc.) and the like to the image sensor.

Figure 30:
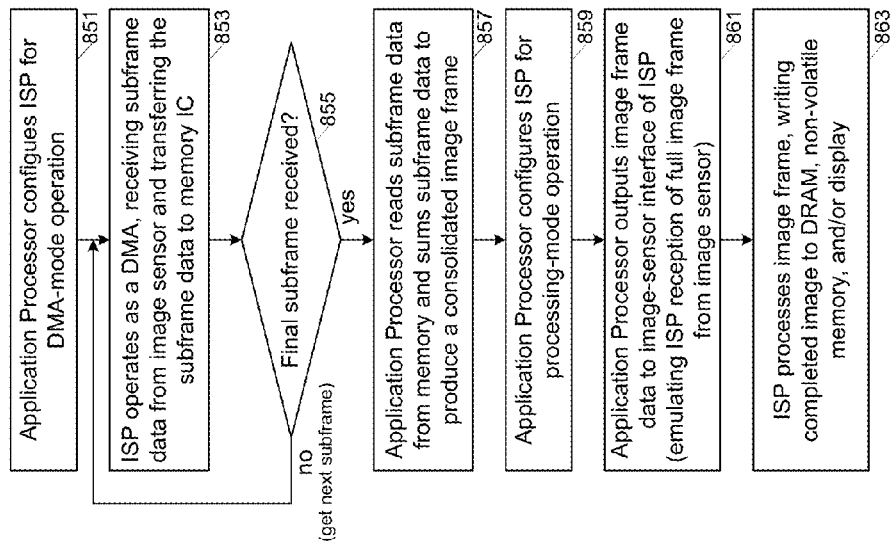
FIG. 30 illustrates an exemplary sequence of operations that may be executed within the imaging system of FIG. 29 in connection with an image processing operation.

FIG. 30 illustrates an exemplary sequence of operations that may be executed within the imaging system of FIG. 29 in connection with an image processing operation. Starting at 851, the application processor configures ISP 831 for DMA (direct-memory-access) operation with respect to memory control interface 835 and thus memory IC 805. By this arrangement, the ISP is enabled to operate as DMA controller between image sensor 801 and memory IC 805, receiving subframe data from image sensor 801 row by row (as shown at 853) and transferring the subframe data to the memory IC. Thus, the subframe data generated by temporal oversampling within image sensor 801 are, in effect, piped through the ISP directly to memory IC (e.g., a DRAM) where they may be accessed by the application processor. Note that, in the embodiment shown, subframes are loaded into the memory one after another until a final subframe has been received and stored (i.e., the frame-by-frame storage loop and its eventual termination being reflected in decision block 855). This process may be optimized in an alternative embodiment by omitting storage of the final subframe in memory IC 805 and instead delivering the final subframe data directly to application processor 833. That is, as shown at 857, the application processor retrieves and combines (e.g., sums) the stored subframes to produce a consolidated (integrated) image frame so that, instead of storing the final subframe in memory and then reading it right back out, the final subframe may be delivered directly to the application processor to serve as a starting point for subframe data consolidation. In any case, at 859 the application processor configures ISP 831 for operation in image-processing mode and, at 861, outputs the image frame data (i.e., the consolidation of the temporally oversampled image sensor data) to the image-sensor interface of the ISP (i.e., to the front-end of the ISP via channel 838), thereby emulating image sensor delivery of a full image frame to ISP 831. At 863, the ISP processes the image frame delivered by the application processor to produce a finalized image frame, writing the completed (processed) image frame, for example, to DRAM or non-volatile memory (i.e., one or both of memory ICs 805), and/or directly to the frame buffer within display 807 to enable the image to be displayed to the system user.

Split-Gate Architecture

Figure 31:
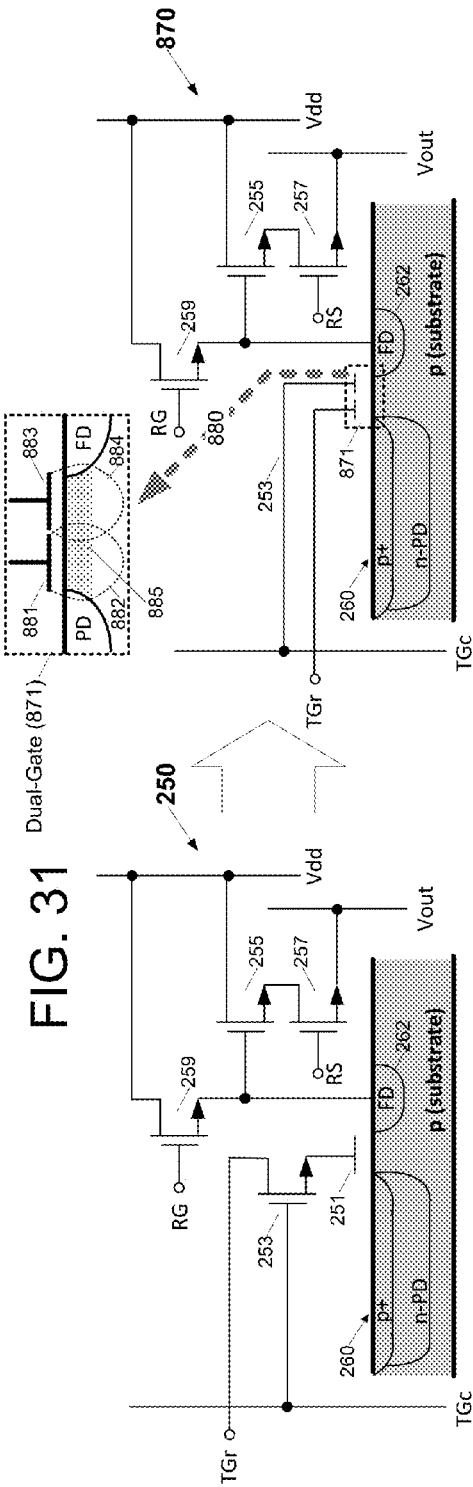
FIG. 31 contrasts embodiments of the conditional-reset pixel of FIG. 10 and a "split-gate" pixel.

FIG. 31 contrasts embodiments of the conditional-reset pixel 250 of FIG. 10 and a modified pixel architecture 870, referred to herein as "split-gate" conditional-reset pixel or split-gate pixel. In the embodiment shown, split-gate pixel 870 includes a photodiode 260 together with the same floating diffusion 262, reset transistor 259, source-follower 255, and read-select transistor 257 as pixel 250, but omits transfer-enable transistor 253 and single-control transfer-gate 251 in favor of a split, dual-control transfer-gate 871. Referring to detail view 880, dual-control transfer gate (or "dual-gate") includes distinct (separate) row and column transfer gate elements 881 and 883 disposed adjacent one another over the substrate region between photodetector 260 (PD) and floating diffusion 262 (FD). The row and column transfer gate elements (881 and 883) are coupled to row and column control lines, respectively, to receive row and column control signals, TGr and TGc and thus are independently (separately) controlled. As discussed in further detail below, by omitting the source/drain implant ordinarily required between series-coupled transistors (and thus between adjacent gate terminals), the row and column transfer gate elements may be disposed closely enough to one another that the resulting overlapping electrostatic fields will form a continuous enhancement channel 885 when both TGr and TGc are asserted, (at a signal level to provide charge transfer), while maintaining an ability to interrupt the channel when either of TGr and TGc are deasserted, (at a signal level to prevent charge transfer). Accordingly, the logic-AND function effected by the combined operation of transfer-gate 251 and transfer-enable transistor 253 in pixel 250 may be achieved within the substantially more compact dual-control gate 871, reducing the pixel footprint (i.e., die area consumption) by a transistor or a significant portion of a transistor relative to pixel 250. In the case of a quad pixel layout, for example, the dual-gate arrangement lowers the per-pixel transistor count from 2.75T (i.e., when pixel 250 is employed) to approximately 1.75T to 2T, depending on the dual-gate implementation. In addition to the reduced pixel footprint, the dual-gate design permits a negative potential to be applied to the transfer gate or transfer gates during the charge-integration (light accumulation) interval to reduce PD to FD leakage current and transfer gate dark current, a function not readily available in embodiment 250 as a negative TGr voltage may disruptively forward-bias the source/drain to substrate diodes in transfer-enable transistor 253. Further, in contrast to the floating potential that results at transfer gate 251 of pixel 250 whenever TGc is lowered, row and column transfer gate elements 881 and 883 are continuously coupled to signal driving sources and thus continuously driven to the driver output voltage (i.e., not floating), potentially reducing noise in the pixel read-out operation.

Figure 32:
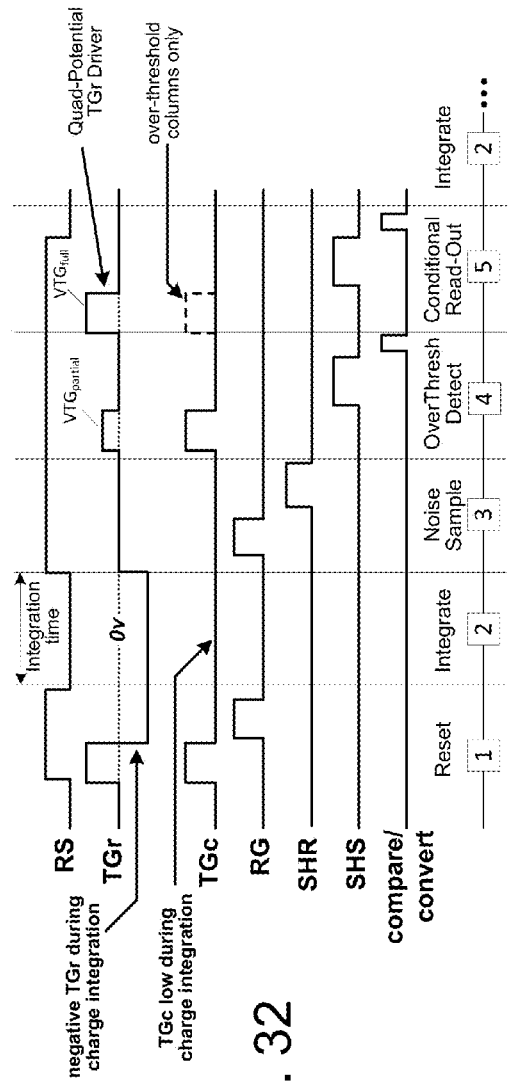
FIG. 32 is a timing diagram illustrating an exemplary pixel cycle (reset/charge integration/read-out) within the split-gate pixel of FIG. 31.

FIG. 32 is a timing diagram illustrating an exemplary pixel cycle (reset/charge integration/read-out) within the split-gate pixel of FIG. 31. As in embodiments described above, the pixel cycle is split into five intervals or phases corresponding to distinct operations carried out to yield an eventual progressive read-out in the final two phases (the pixel can also provide an unconditional readout sequence that skips phase four). Referring to both FIG. 32 and split-gate pixel 870 in FIG. 31, a reset operation is executed within the photodiode and floating diffusion in phase one by concurrently raising the TGr and TGc signals to establish a conduction channel between photodiode 260 and floating diffusion 262 (i.e., as shown at 885 in FIG. 31), and thereby reset the photodiode by enabling residual or accumulated charge within the photodiode to be transferred to the floating diffusion. After (or concurrently with) the charge transfer operation, the reset-gate signal (RG) is pulsed to switch on reset transistor 259 and thus evacuate/empty charge from the floating diffusion by switchably coupling the floating diffusion to $V_{dd}$ or other supply voltage rail. In the embodiment shown, TGr is driven to a negative potential following the photodetector reset operation (e.g., immediately after concurrent assertion with TGc or at the conclusion of the reset phase), thereby establishing a low-leakage isolation between the photodetector and floating diffusion, and reducing dark current from the region below TGr. Also, because the row and column control signals are jointly applied to adjacent transfer gate elements, TGc may be raised and lowered as necessary following the photodetector reset operation and during the ensuing integration phase (phase 2) without undesirably floating the transfer gate. Thus, TGc is lowered following pixel reset and, while shown as remaining low throughout the ensuing integration and noise sampling phases (phases 2 and 3), will toggle between high and low states during those phases to support reset and read-out operations in other pixel rows.

The noise or reset sampling operation within phase 3, overthreshold detection within phase 4 and conditional read-out (or conditional transfer) within phase 5 are carried out generally as discussed in reference to FIG. 11, except that TGc need only be raised in conjunction with the TGr pulses (i.e., to VTGpartial and VTGfull) during the partial-transfer and conditional-transfer operations. In the embodiment shown, a quad-potential TGr driver is provided within the row decoder/driver (e.g., within element 305 of FIG. 14) to maintain TGr at the negative potential throughout the integration phase, and then step TGr up to a pre-read potential (zero volts in the example shown) at the start of the noise sampling phase before raising TGr further to $VTG_{partial}$ and finally to $VTG_{full}$ in the overthreshold detection and conditional read-out operations, respectively. In alternative embodiments, a three-potential driver may be used to maintain TGr at the negative potential except when pulsed to $VTG_{partial}$ or $VTG_{full}$ (i.e., no pre-read potential).

Figure 33:
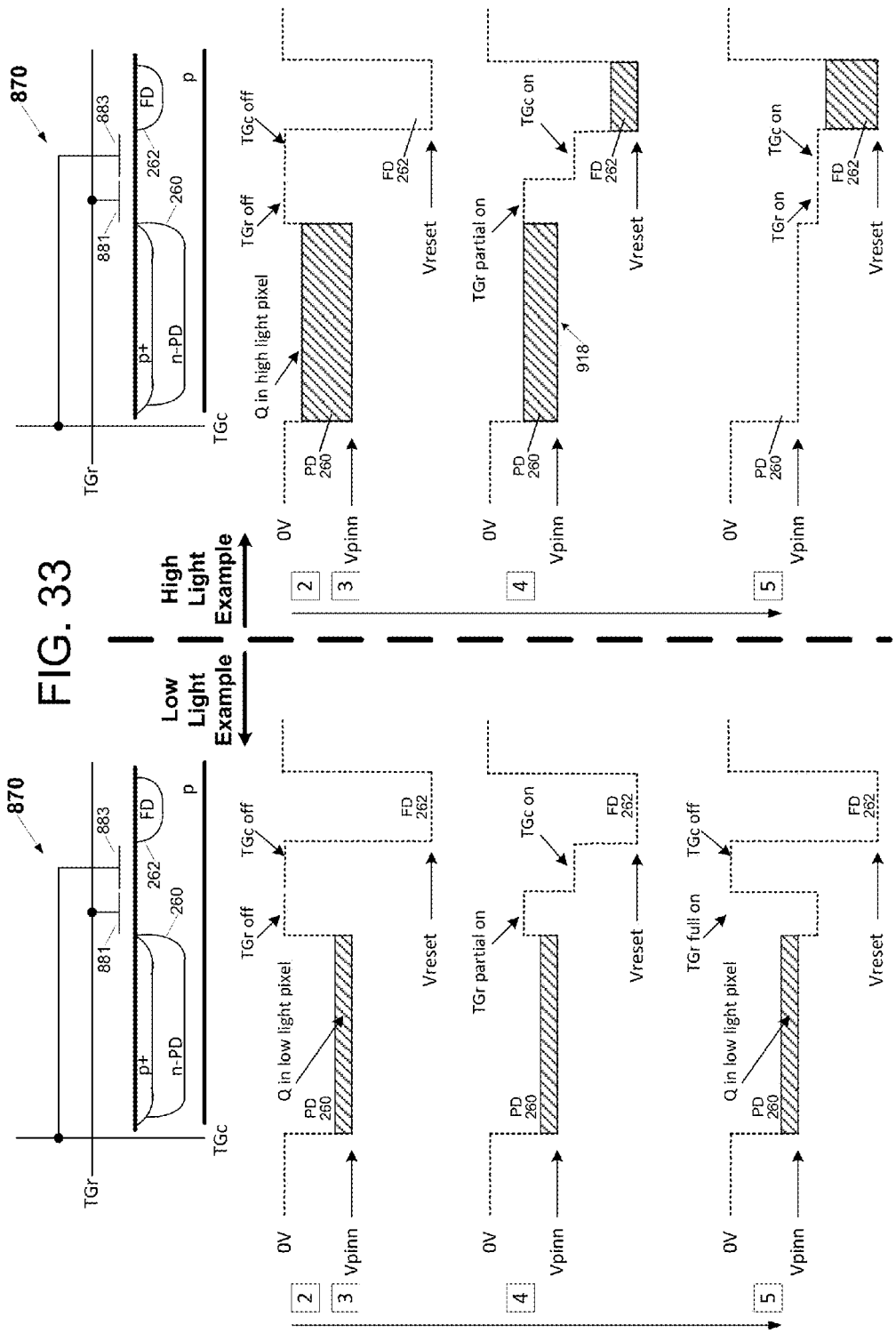
FIG. 33 illustrates exemplary low-light and high-light operation of the split-gate pixel of FIG. 31, showing electrostatic potential diagrams in each case beneath schematic cross-section diagrams of the photodetector, dual-control transfer gate and floating diffusion.

FIG. 33 illustrates exemplary low-light and high-light operation of the split-gate pixel of FIG. 31, showing electrostatic potential diagrams in each case beneath schematic cross-section diagrams of the photodetector (photodiode 260 in this example), row and column transfer gate elements 881 and 883 (i.e., forming a dual-control transfer gate) and floating diffusion 262. As in preceding examples, the depicted levels of electrostatic potential are not intended to be an accurate representation of the levels produced in an actual or simulated device, but rather a general (or conceptual) representation to illustrate the operation of the pixel read-out phases. Starting with the low-light example, a relatively low level of charge is accumulated within the photodiode during the integration phase (phase 2) so that, when TGc is asserted and TGr is raised to the partial-on potential ($VTG_{partial}$) during overthreshold detection phase 4 (i.e., after noise sample acquisition in phase 3), the charge level is insufficient to be transferred via the relatively shallow channel formed between photodiode 260 and floating diffusion 262. Because the accumulated charge level does not exceed the spillover threshold established by application of $VTG_{partial}$ to the gate element couple to the TGr line, there is no spillover from the photodiode to the floating diffusion and the accumulated charge instead remains undisturbed within the photodiode. Because no spillover is detected during the overthreshold phase, TGc is deasserted during conditional transfer (conditional read-out) phase 5. Although some charge will migrate to the well under the row gate during TGr assertion, that charge will move back to the photodiode well when TGr is deasserted, thus maintaining the charge level within the photodiode as a starting point for further charge accumulation in a subsequent integration interval. By contrast, in the high-light example, the higher level of accumulated charge does exceed the spillover threshold during overthreshold detection phase 4 so that a portion of the accumulated charge (i.e., that subset of charge carriers that are above the transfer gate partially-on electrostatic potential) spills over into floating diffusion node 262, with the residual accumulated charge remaining within the photodiode as shown at 918. Accordingly, during overthreshold phase 5, TGr is raised to the $VTG_{full}$ potential concurrently with assertion of TGc, thus establishing a full conduction path through the channel formed by the dual-gate structure to transfer the entirety of the accumulated charge from photodiode 260 to floating diffusion 262.

FIG. 34 illustrates an alternative overthreshold detection operation within the split-gate pixel of FIG. 31. As shown, instead of driving the TGr line to a partial potential (i.e., $VTG_{partial}$), a fractional (i.e., reduced-width) TGr pulse 920 is applied in conjunction with the TGc pulse (which may also have a fractional pulse width) thus limiting the time available for charge transfer between the photodetector and floating diffusion. In one embodiment, for example, fractional pulse 920 is a short-duration pulse having a time constant shorter than required to transfer all charge above the threshold defined by the voltage applied to the dual-control transfer gate and therefore transfers the charge only partially, in contrast to a full-width pulse which is long enough to transfer all of that charge. Accordingly, due to the time constant and sub-threshold characteristics of the photodetector-to-diffusion charge transfer, below-threshold charge integration within the photodetector will yield little or no charge transfer during the fractional pulse interval, while overthreshold charge integration will yield a detectable charge transfer, analogous, in effect, to application of $VTG_{partial}$ for the full pulse interval. Pulse width control may provide superior performance (i.e., relative to voltage-level control) in terms of repeatability and/or threshold precision, particularly in noisy environments (e.g., where switching noise may couple to the TGr line) or where programmable threshold trimming or calibration may be needed. As shown at 921, the partial-readout control, whether pulse-width or voltage-level controlled, alternatively (or additionally) may be applied to the TGc line, particularly where the TGc signal is used to control the gate element nearest the photodetector. Also, pulse-width control and voltage control may be combined, for example, by driving a fractional pulse having a reduced voltage onto the TGc or TGr line. Further, the full pulse applied to the TGr and/or TGc line during a conditional read-out operation (and/or during a reset operation) may be replaced by a burst of fractional pulses as shown at 922, thus establishing a uniform (fractional) with for each pulse applied. In one embodiment, the full pulse width during conditional-readout phase 5 is on the order of 200 to 1000 nanoseconds (nS), while the fractional pulse width is on the order of 2 to 200 nanoseconds, though other fractional and/or full pulse widths may apply in alternative embodiments. Although shown as operative for a split-gate embodiment, similar fractional pulse methods are also applicable to the operation of, for example, a FIG. 14 or FIG. 16 embodiment.

FIG. 35 illustrates an exemplary implementation of the dual-control gate 871 shown in FIG. 31. In the implementation shown, two distinct polysilicon features 925 and 927 are formed in immediate proximity to one another over the substrate region between photodiode 260 and floating diffusion 262 with a separation distance ("$d_{sep}$") shorter than the minimum inter-poly distance specified for polysilicon lines of drain-to-source-coupled transistors, but long enough to ensure electrical isolation between the two polysilicon features (i.e., sufficient separation to avoid shorting the features to one another). In one fabrication technique, the two polysilicon features are formed separately to enable a distance $d_{sep}$ that is less than the minimum lithographic feature size. In an alternative embodiment, a single polysilicon feature is formed and then etched or otherwise split/divided into two distinct polysilicon features (e.g., with $d_{sep}$ set to the minimum lithographic feature size or smaller). In the implementation shown, sidewall spacers 929, 931 are formed with respect to each polysilicon line, with spacer structures formed within separation region merging as shown at 933 (i.e., due to the narrow $d_{sep}$ dimension) so that subsequent doping to form source/drain implant structures is blocked within the separation region, thus avoiding formation of such a carrier trapping structure in the otherwise continuous substrate region between photodiode 260 and floating diffusion 262, yielding the dual-gate control described above. While polysilicon feature 925 (Poly 1) is shown as the gate element coupled to TGr and polysilicon feature 927 (Poly 1') as the gate element coupled to TGc, that interconnection arrangement may be reversed in alternative embodiments.

FIG. 36 illustrates an alternative manner of implementing the dual-control gate structure 871 of FIG. 31. In this embodiment, a first polysilicon feature 941 is formed (e.g., lithographically printed and etched), covered with a layer of insulating material 945, and then a second polysilicon feature 943 is formed over the top of the first. A portion of the second polysilicon feature (not shown) is etched away to expose and enable metal-layer contact to the initial polysilicon feature 941 without removing the (insulating) material 945 that remains in the separation region (i.e., the region marked by "$d_{sep}$"). By this operation, $d_{sep}$ may be made arbitrarily small (i.e., as small as possible while maintaining integrity of the insulating material within the separation region and thus electrical isolation between the two polysilicon features) and the overall footprint of the dual-control gate is similar to a single-control gate. Various alternative and/or supplemental fabrication techniques may be employed in other embodiments to form the dual-gate structure between photodiode 260 and floating diffusion 262.

Figure 37:
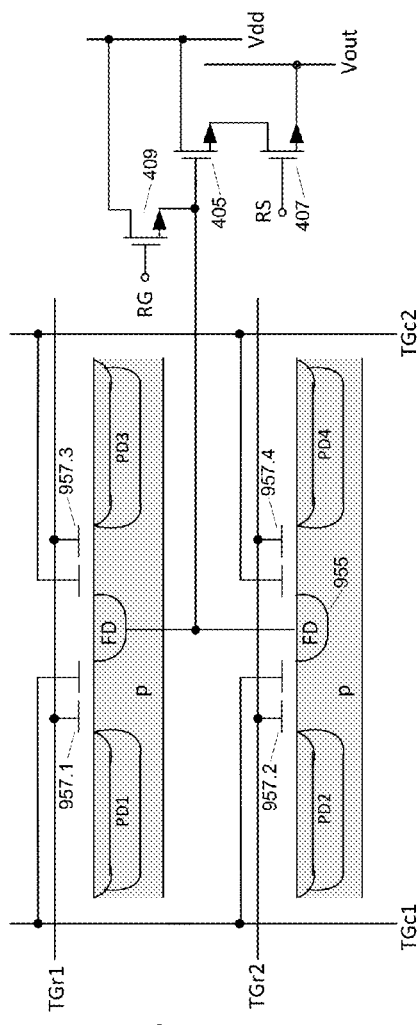
FIG. 37 illustrates a quad-pixel, shared floating diffusion image sensor architecture in which pairs of row and column transfer-gate control lines are coupled to a dual-gate structure within each of four split-gate pixels.
Figure 39:
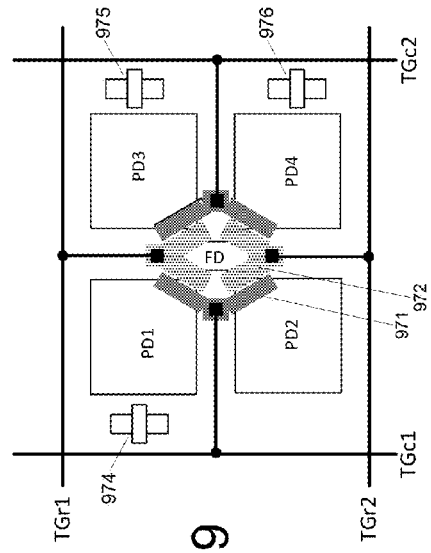
FIGS. 38 and 39 illustrate exemplary physical layouts of the quad-pixel of FIG. 37, showing the four photodiodes disposed about and switchably coupled to a centralized floating diffusion via respective dual-control gate structures.
Figure 38:
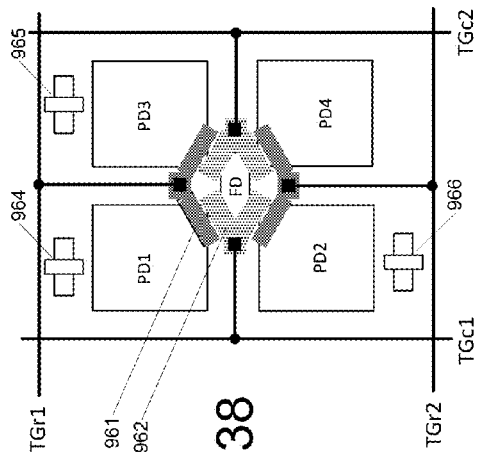

FIG. 37 illustrates a quad-pixel, shared floating diffusion image sensor architecture in which pairs of row and column transfer-gate control lines (TGr1/TGr2 and TGc1/TGc2) are coupled to a dual-gate structure (957.1-957.4) within each of four split-gate pixels in the manner described above. More specifically, by centralizing a shared floating diffusion 955 between four pixels (each also including a respective one of photodiodes PD1-PD4 and one of dual-control transfer gates 957.1-957.4, together with shared reset-gate transistor 409, source follower 405 and read-select transistor 407) and splitting the column transfer-gate control line TGc into separate odd and even column-enable lines (TGc1 and TGc2, each coupled to a respective column-line driver), a highly compact pixel layout may be achieved. FIGS. 38 and 39 illustrate exemplary physical layouts of the quad-pixel of FIG. 37, showing the four photodiodes disposed about and switchably coupled to a centralized floating diffusion ("FD") via respective dual-control gate structures. In the embodiment of FIG. 38, row lines (TGr1, TGr2) are coupled to respective gate elements 961 nearest the photodiodes and column lines are coupled to gate elements 962 nearest the floating diffusion (i.e., gate elements 961 and 962 collectively forming a dual-gate), while that interconnect order is reversed in the embodiment of FIG. 39, with row lines coupled to gate elements 972 nearest the floating diffusion and column lines coupled to gate elements 971 nearest the photodiodes. In both layouts, each row line may be coupled to the gate elements for photodiodes in the same row (e.g., PD1/PD3 or PD2/PD4 in the example shown) via a single metal-to-poly contact and each column line may likewise be coupled to the gate elements for photodiodes in the same column (e.g., PD1/PD2 or PD3/PD4) via a single contact, thus halving the contact area as compared to implementations that require two interconnects per signal line per quad pixel. Also, in the embodiments of both FIGS. 38 and 39, the shared reset gate transistor, read-select transistor and source follower transistor are disposed at the periphery of the photodiode cell as shown at 964, 965 and 966 in FIGS. 38 and 974, 975 and 976 in FIG. 39 (each transistor being shown as a polysilicon line over a diffusion region, omitting interconnect lines to avoid obscuring other features of the drawing). In both layouts, the transistors may be disposed in positions/locations other than those shown. For example, all three shared transistors may be co-located at the same edge of a given pixel, or all or one or more of the transistors may be disposed in a central region of the quad pixel between rows or columns of the photodiodes. Also, while a consolidated diffusion region is shown, the diffusion region may alternatively be split into two or more interconnected diffusion regions. The structures shown allow both individual and selective charge-binned readout of pixels with the quad group.

Figure 41:
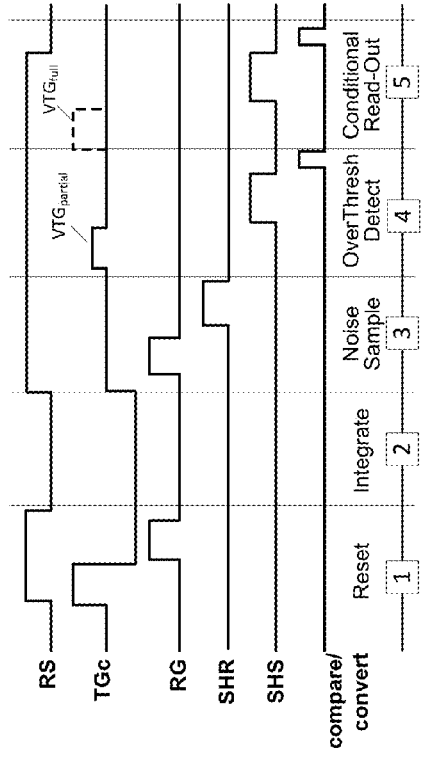
FIGS. 40 and 41 illustrate a split-gate pixel architecture and corresponding timing diagram according to an alternative embodiment that lacks a dedicated row transfer-gate (TGr) line.
Figure 40:
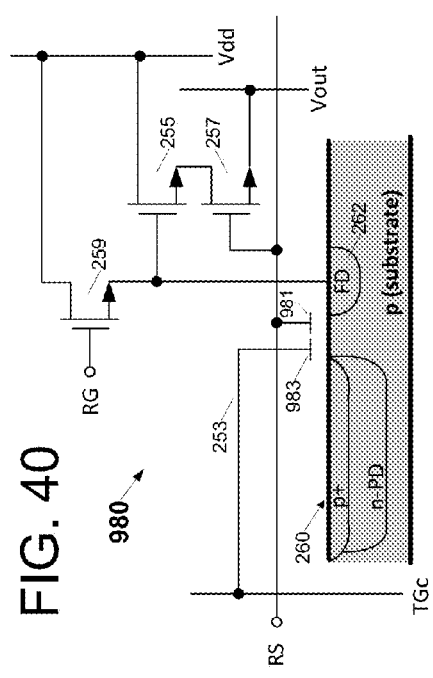

FIGS. 40 and 41 illustrate a split-gate pixel architecture and corresponding timing diagram according to an alternative embodiment that lacks a dedicated row transfer-gate (TGr) line. More specifically, the read-select and row transfer-gate control functions are merged within a single read-select (or row-select) signal coupled to row gate element 881 and to read-select transistor 257 as shown, thus reducing the number of row signal lines per pixel row from three to two (column transfer gate element 883 and the remaining shared transistors (255, 259) are connected as described above). This row line reduction may be particularly beneficial in front-side illuminated implementations as the 33% row metal reduction increases the overall fill factor of the pixel array. Even in backside illuminated embodiments, the row line reduction may simplify per-cell signal line interconnection, possibly reducing the number of metal layers required or otherwise reducing fabrication complexity and cost. Note that frontside or backside illumination may be employed with respect to any of the embodiments disclosed herein.

Referring to FIG. 41, reset, integration, noise-sampling, overthreshold detection and conditional read-out operations are carried out generally as described in reference to FIG. 32, except that row transfer gate element 981 is switched to conducting and non-conducting states through assertion and deassertion of the read-select signal (RS), and overthreshold and conditional read-out operations are managed by asserting partial potential (and/or pulse width) and full potential (and/or full pulse sequence) on the column control line (TGc). Thus, a photodiode reset is effected by asserting TGc concurrently with read-select signal assertion, overthreshold detection is carried out by raising TGc to the $VTG_{partial}$ potential (and/or applying a reduced-width TGc pulse) concurrently with read-select signal assertion, and conditional read-out is executed by conditionally (selectively) raising TGc to the $VTG_{full}$ potential as shown. In the embodiment of FIG. 40, row gate element 981 is disposed nearest the floating diffusion and the column gate element 983 is disposed nearest the photodiode. This disposition may be reversed in alternative embodiments.

Figure 42A:
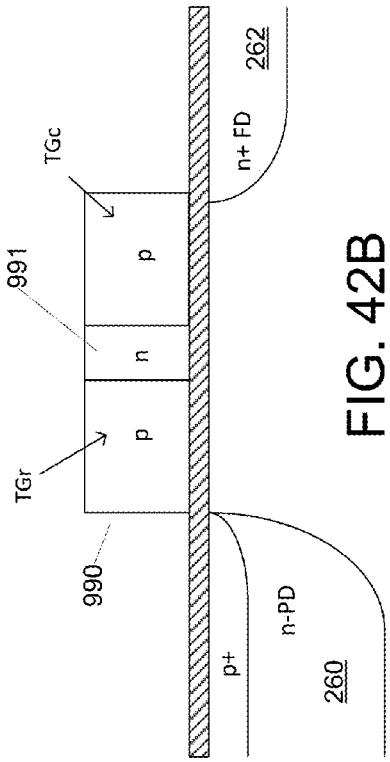
FIG. 42A illustrates an alternative dual-control gate arrangement in which the gate elements of a dual-control gate are formed by respective p-doped and n-doped regions of a diode.

FIG. 42A illustrates an alternative dual-control gate arrangement in which the gate elements of a dual-control gate are formed by respective p-doped and n-doped regions of a transfer gate diode 987. The doping is achieved by depositing a lightly or intrinsically doped polysilicon, and using the pinning implants and FD implants to dope the PD and FD sides of the TG respectively. Alternate methods can also be employed. With this structure the TGr signal is connected to the p-type side of the diode 987 via a first contact (not shown), and the TGc signal is connected to the n-type side of the diode 987 via a separate, second contact (also not shown). Electrical isolation of the two gate control signals is achieved by diode isolation and does not require two physically separate polysilicon structures. As a result the dual-control gate is smaller.

Figure 42B:
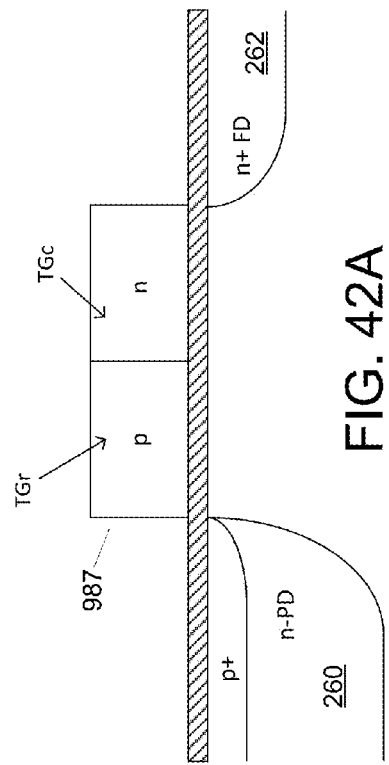
FIG. 42B illustrates another alternative dual-control gate arrangement in which the gate elements of a dual-control gate are formed by respective p-doped regions of back-to-back diodes having a shared n-doped region.

FIG. 42B illustrates another alternative dual-control gate arrangement in which the gate elements of a dual-control transfer gate 990 are formed by respective p-doped regions of back-to-back diodes having a shared n-doped region 991. The doping is achieved by depositing a lightly or intrinsically doped polysilicon, and using the pinning implants, FD implants and/or specific transfer gate doping implants to dope the PD and FD sides and center n-type region (991) of the dual-control transfer gate, respectively. As with all embodiments disclosed herein, alternative fabrication methods can be employed. With this structure the TGr signal is connected to the p-type side of the diode adjacent to the PD via a separate contact, (not shown), and the TGc signal is connected to the p-type side of the diode 990 adjacent to the FD via a separate contact, (not shown). Electrical isolation of the two gate control signals is achieved by diode isolation (intervening n-type region 991) and does not require two physically separate polysilicon structures.

Figure 43:
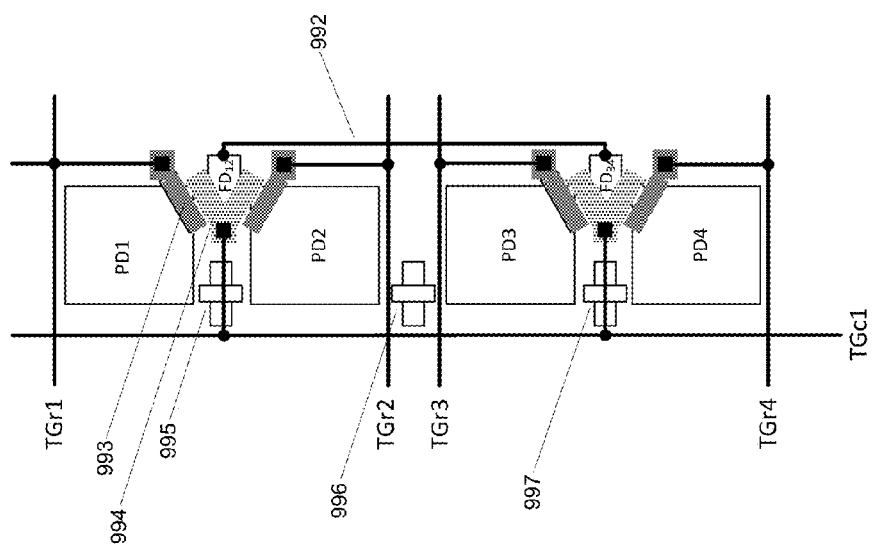
FIG. 43 illustrates a 4×1 block of split-pixels (a quad, split-pixel block) that may be operated in binned or independent-pixel modes as described above, for example, in reference to FIG. 21.

FIG. 43 illustrates a 4×1 block of split-pixels (a quad, split-pixel block) that may be operated in binned or independent-pixel modes as described above, for example, in reference to FIG. 21. As shown, floating diffusion regions $FD_{12}$ and $FD_{34}$ for upper and lower pixel pairs, respectively, are interconnected via conductor 992 (or alternatively formed by a single floating diffusion region), thus permitting, for example, the states of photodiodes PD1 and PD3 or photodiodes PD2 and PD4 to be read conjunctively (i.e., read concurrently or as one). Each photodiode in the 4×1 pixel block is switchably coupled to a floating diffusion node via a dual-control gate, with a row gate element 993 coupled to a respective one of the four row lines (i.e., TGr1-TGr4 for photodiodes PD1-PD4, respectively) and a column gate element 994 coupled to the per block column line. In the implementation shown, a shared column-line contact is coupled to each of the two column gate elements adjacent a given floating diffusion, thus halving the required number of column line interconnects. Shared transistors 995, 996 and 997 (i.e., reset-gate, source follower and read-select transistors) are disposed in regions between photodiodes PD1-PD4, though any or all of those transistors may be disposed at other positions. Also, while the row line is coupled to the dual-control gate element nearest the photodiode and column line coupled to the gate element nearest the floating diffusion, that arrangement may be reversed in alternative implementations.

Bandwidth Reduction—Threshold-Referenced Visually Lossless Lookup Table

Figure 44:
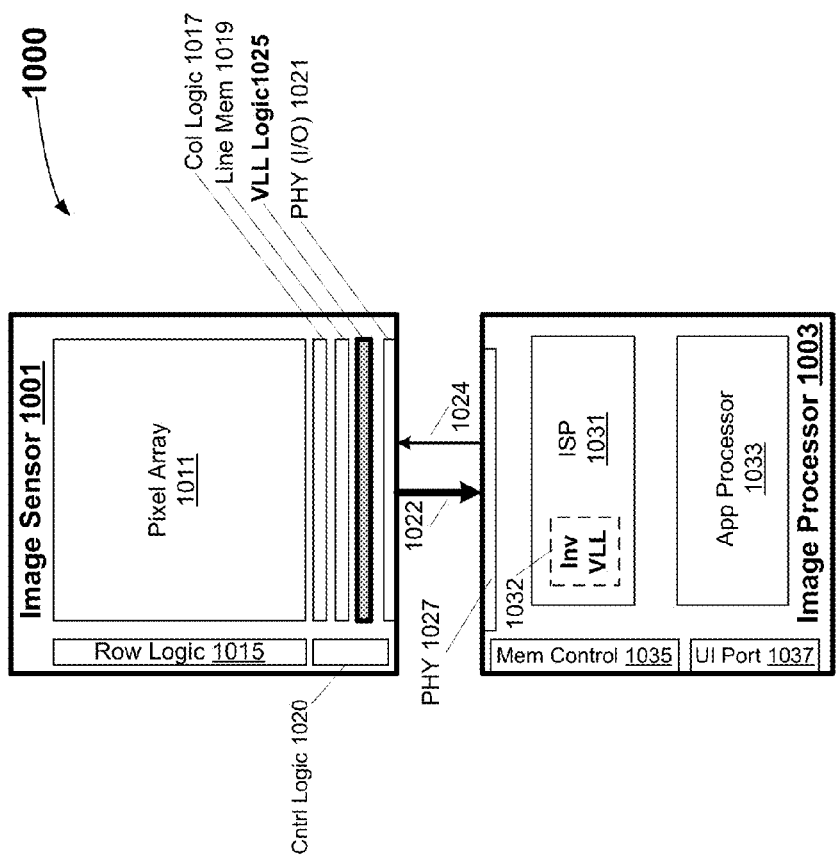
FIG. 44 illustrates an imaging system architecture in which the data transfer bandwidth required between an image sensor and image processor is reduced using a visually lossless lookup table (VLL)

FIG. 44 illustrates an imaging system architecture in which the data transfer bandwidth required between an image sensor 1001 and image processor 1003 is reduced through one or more data compression strategies. In the embodiment shown, for example, image sensor 1001 employs a visually lossless lookup table (VLL) 1025 to reduce the volume of data required to convey the oversampled output of a conditional-reset/readout pixel array to image processor 1003, and image processor 1003 includes circuitry and/or logic (e.g., within an image signal processor 1031, application processor 1033 or both) to execute an inverse-VLL operation 1032 to reproduce the pre-VLL output of pixel array 1011 as closely as possible. As in embodiments described above, image sensor 1001 includes row and column logic (1015, 1017) to conduct row-by-row pixel read-out operations, line memory (1019) to store the read-out results for eventual transfer, a physical interface to effectuate image data transfer (PHY 1021) over output path 1022 to a counterpart PHY 1027 within image processor 1003, and control logic (1020) to provide timing and control signals to the other circuit blocks as necessary to synchronize and pipeline their operations. In addition to image-data-transmitting output driver circuitry, PHY 1021 includes receive circuitry to receive commands and data from the image processor via signaling path 1024 (which may be a bidirectional path also used to convey image data and/or status), including lookup table data to be loaded into the VLL 1025 as discussed below. Though not specifically shown, the imaging system of FIG. 44 additionally includes one or more memory components that interface with image processor via memory control circuitry 1035, and one or more user-interface components (e.g., a display on which images may be rendered) coupled to UI port 1037.

FIG. 45 illustrates an exemplary compression function that may be applied within the VLL of FIG. 44 to convert an N-bit input ($VLL_{IN}[N-1:0]$) to an M-bit output ($VLL_{OUT}[M-1:0]$, where M<N. In a number of embodiments, the compression function corresponds generally to a log function (shown by the curve at 1041), but with a linearized initial region 1042 to enhance resolution relative to the steepest part of the log curve and thereby minimize the loss caused by the VLL. In one implementation, for example, $VLL_{IN}=VLL_{OUT}$ up to the maximum input value (X) of the linear region.

Continuing with FIG. 45 and considering that no read-out occurs in pixels yielding below-threshold partial-transfer samples (i.e., those pixels instead being permitted to continue charge integration into a subsequent subframe), it follows that the portion of the VLL transformation that corresponds to input values below the threshold need not be converted for subframes that employ conditional readout. Thus, instead of mapping the VLL compression curve to the entire range of possible input values, the compression curve may be encoded with the pixel reset threshold (or slightly above or below the threshold) as the starting point, thereby reducing the input range by Y, the value corresponding to the pixel reset threshold in the full-range mapping. An example of such a "threshold-referenced" VLL transform is shown in FIG. 46, in this case representing any pixel yielding a partial-transfer sample at or below the reset threshold with a zero-valued VLL output and showing the input values for which no output representation is needed (or provided) as a dashed line extending below the pixel reset threshold.

Reflecting on the threshold-referenced VLL shown in FIG. 46, because the range of possible input values is reduced by Y (i.e., the input values 0 to Y−1 need not be mapped to output values), it becomes possible to (i) reduce the corresponding output range (and possibly the number of bits required to convey the range of output values) while maintaining the same VLL resolution, (ii) increase the VLL resolution by mapping the same number of output values (e.g., $2^M$) to the reduced number of input values, or (iii) both reduce the output range and increase the resolution in the case of a sufficiently high conditional read/reset threshold. Further, in an oversampling image sensor embodiment that permits the conditional read/reset threshold to be varied or adjusted from subframe to subframe (i.e., threshold for at least one subframe of a multi-subframe exposure interval is different from the threshold for at least one other subframe), correspondingly varied VLLs may be applied, including, in some cases, VLLs having different output bit depths. For example, a subframe-specific conditional read/reset threshold that reduces the required output range by half enables output bit-depth to be reduced from M bits to M−1 bits, thereby further reducing bandwidth requirements in the imaging system.

In addition to threshold-referenced VLLs (e.g., applied to respective subframes of an overall frame interval), VLLs may output reserved codes to signal underthreshold conditions and saturation conditions, the latter including extreme brightness conditions that cause the reset state of the floating diffusion to collapse—the above-mentioned "eclipse" events in which the resulting read-out mimics a low-light (dark) condition. More specifically, the zero-valued output (or any other output) of a given VLL may be reserved to represent an underthreshold condition and thus an unknown state of the pixel for the subframe at issue, while an all '1' VLL output (i.e., 'FF' in hexadecimal format in the case of an 8-bit VLL output, but any other output could be so defined) may signify a saturated or eclipsed pixel and thus another unknown pixel state. The inverse VLL logic implemented within the image processor (element 1032 of FIG. 44) may detect such out-of-range codes and take appropriate processing steps to compensate for the missing pixel values.

Referring again to FIG. 44, in addition to the bandwidth reduction effected by VLL logic 1025, column logic 1017 may selectively disable sample digitization (i.e., disabling analog-to-digital-converter (ADC) operation) when underthreshold, saturation or eclipse events are detected, thereby reducing power consumption. Also, the disabled digitization may be signaled to downstream logic, including the VLL and line memory PHY, to disable operations in any or all of those circuit blocks, thus avoiding power and bandwidth consumption with respect to such non-readouts. In a number of embodiments described below, the result of the pixel state assessment (i.e., determining whether the pixel is underthreshold, eclipsed and/or saturated (with the eclipse state in some embodiments treated as a special case of saturation)) is captured by read-enable circuitry within the image sensor column logic and output as a set of one or more flag bits. Examples of such flag bits include the underthreshold and eclipse bits described above in reference to FIG. 24. Further in a number of embodiments, the information conveyed in the underthreshold and eclipse bits are logically reorganized in a read-enable bit (RE) and an above/below range bit (AB), where the RE bit is set (e.g., to a logic '1') if the subject pixel is not eclipsed and not saturated and not underthreshold, and cleared (or reset) otherwise. If the RE bit is cleared (i.e., RE=0 to indicate that the pixel is either underthreshold, eclipsed or saturated), then the AB bit is set to indicate a saturation condition (i.e., eclipsed or above saturation threshold) and cleared to indicate an underthreshold condition. As explained below, because the AB bit is unneeded when the RE bit is set and the ADC output is unneeded when the RE bit is cleared, a single bit within the line memory may be used to store either the AB bit or a bit of the ADC output, depending on the state of the RE bit, thus reducing the amount of line memory storage required to capture row read-out results.

Figure 48:
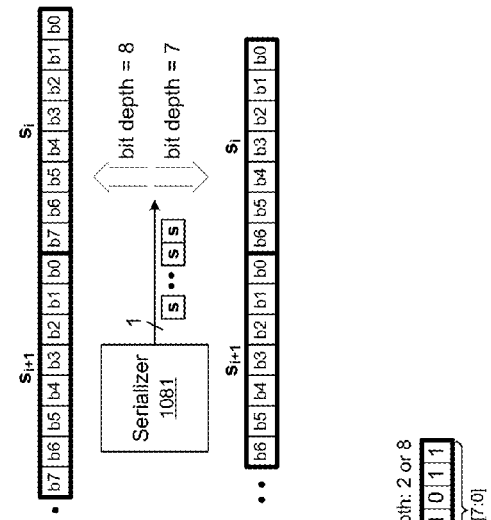
FIG. 48 depicts an exemplary output table showing an exemplary interpretation of ADC and VLL outputs for the various states of flag bits recorded within line memory.

FIG. 47 illustrates embodiments of a line memory 1050 and VLL logic circuit 1053 that may be used to implement the line memory and VLL logic shown in FIG. 44, together with output drivers 1059 that may be included within the image sensor PHY. In the embodiment shown, each output driver 1059 is assumed to drive a bit-serial differential link (a single-ended link may alternatively be used) that corresponds to an output "lane" of the image sensor, with each output lane including a respective VLL logic component 1057 and a respective segment of line memory 1050. Further, for purposes of example only, individual ADC/Flag values output from line memory 1050 to the VLL logic 1053 are assumed to include an eleven-bit composite value constituted by a 10-bit ADC value (ADC[9:0]) and a single-bit read-enable flag (RE), with the most significant bit of the ADC value, ADC[9], doubling as the AB bit when RE is low. FIG. 48 depicts an exemplary output table corresponding to such an arrangement and showing the interpretation of the ADC field (i.e., within the line memory) and VLL output for the various states of the RE and AB flag bits. Each VLL logic component 1057, for its part, generates an encoded output that indicates either an out-of-range condition (underthreshold or saturated/eclipsed) or a point in the overthreshold portion of a composite VLL transform as explained above. Also, at least in the FIG. 47 embodiment, each VLL logic component 1057 drives a parallel set of eight signal lines (assuming a 10-bit to 8-bit compression), one or more of which may remain undriven in low bit-depth compressions and/or instances of out-of-range pixel states. These specific numbers of bits and flag encoding schemes are carried forward in a number of embodiments described below, but in all such cases any practicable alternative representation of flag/status bits and/or quantities of bits conveyed in ADC values or composite flag-ADC values may apply.

Still referring to the embodiment of FIG. 47, line memory 1050 includes two component memory buffers, referred to herein as the primary buffer 1051 and secondary buffer 1052, together with column multiplexer circuitry 1055. Though not specifically shown, primary buffer 1051 is coupled to receive the parallel outputs of the column logic (e.g., element 1017 in FIG. 44) and, when fully loaded, transfers the read-out results in parallel to the secondary buffer 1052, thereby freeing the primary buffer to be loaded with read-out results from a subsequent row of the pixel array while data from the secondary buffer is streamed, column by column (and lane-parallel), to the VLL logic components 1057 and serializing output drivers 1059. Multiplexing circuitry 1055 is provided to serialize the output of the secondary buffer segment allocated to each output lane (i.e., selecting image data from one pixel column at a time) in the embodiment shown, but may be omitted in embodiments in which the secondary buffer is organized as a set of parallel-load, shift registers that shift out one column data value at a time. Also, while each column data value is depicted as an 11-bit value consisting of an RE bit and 10-bit ADC value (with the most significant bit of the ADC value serving as an AB bit when RE is low), other flag-bit formats and ADC bit depths (e.g., 12-bit ADC instead of 10-bit) may be employed in alternative embodiments or configurations. Lastly, while the VLL logic component 1057 for each lane is shown to output an 8-bit output (e.g., with the all '1' and all '0' values encoding the saturation/eclipse and underthreshold conditions, respectively), alternative output bit depths may apply (e.g., 10-bit in the case of a 12-bit ADC value) and/or the flag bits (RE bit, AB bit or other flag encodings) may be explicitly output from the image sensor instead of being encoded within the VLL output value.

Figure 49:
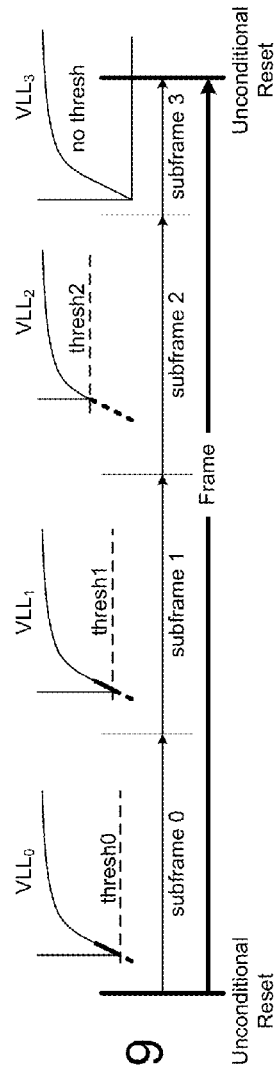
FIG. 49 illustrates an exemplary sequence of four sub-frames that constitute an image frame interval (exposure interval) within the image sensor of FIG. 44.

FIG. 49 illustrates an exemplary sequence of four subframes that constitute an image frame interval (exposure interval) within the image sensor of FIG. 44. There may be more or fewer subframes per image frame in alternative implementations or configurations. As in embodiments described above, image pixels are conditionally reset and read out during all but the last subframe, with all pixels being unconditionally read and reset during that final subframe. Further, in the embodiment shown, different pixel reset thresholds are applied in each of the conditional read/reset subframes (any of which may have a different duration than any other of the subframes), and correspondingly different threshold-referenced VLLs are applied to compress the readout.

Figure 50:
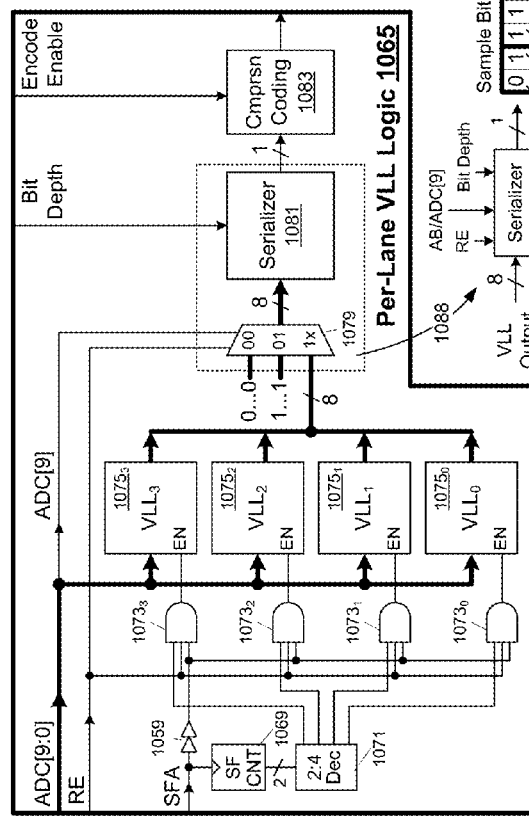
FIG. 50 illustrates an exemplary per-lane VLL logic component capable of applying subframe-specific threshold-referenced VLLs as shown in FIG. 49, and that may be employed to realize the individual per-lane VLL logic circuits depicted in FIG. 47.

FIG. 50 illustrates an exemplary per-lane VLL logic component 1065 capable of applying subframe-specific threshold-referenced VLLs as shown in FIG. 49, and that may be employed to realize the individual per-lane VLL logic circuits 1057 depicted in FIG. 47. As shown, VLL logic circuit 1065 receives a read-enable bit (RE), a 10-bit ADC value (the MSB of which serves as the AB bit when RE is low), and a sub-frame-advance signal (SFA) that signals transitions between subframes. The subframe-advance signal is applied to a subframe counter 1069 ("SF CNT") which, in this four-subframe per complete frame example, progresses through a modulo-four subframe count sequence (0, 1, 2, 3, 0, 1, 2, 3 . . . or, in binary notation: 00, 01, 10, 11, 00, 01, 10, 11 . . . ) as the subframe-advance signal cycles (which may be four times per frame or up to once per row, for fully interleaved readout). A 2:4 decoder 1071 converts the counter output into a one-hot set of four VLL select signals which are in turn applied, along with the read-enable bit, to respective logic gates $1073_0$-$1073_3$ to gate a delayed version of the subframe-advance signal (i.e., delayed by element(s) 1059). By this arrangement, when the RE bit corresponding to a given ADC value is high (indicating a valid ADC value), a subframe-count-indexed one of the four gates $1073_0$-$1073_3$ is enabled to pass the delayed sub-frame advance signal to the enable input of a respective one of VLLs $1075_0$-$1075_3$, thus enabling one of the four VLLs (collectively, VLLs 1075) to output a lookup value corresponding to the incoming ADC value. In the embodiment shown, the outputs of VLLs 1075 are supplied to multiplexer 1079 and output therefrom when RE=1. When RE is low, the AB bit (i.e., most significant bit of the ADC value in this example) selects either an all '0' or all '1' value to be output to downstream logic, thereby signaling an under-threshold condition or a saturated/eclipsed condition, as the case may be. More compact output forms may be chosen to represent the out-of-range conditions (under threshold or saturated/eclipsed) in alternative embodiments, as discussed below.

Figure 51:
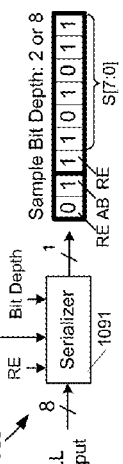
FIG. 51 depicts an exemplary serializer output as a sequence of samples, with eight-bit samples being transmitted back-to-back in an 8-bit bit-depth mode, and 7-bit samples being transmitted back-to-back in a 7-bit bit-depth mode.

Still referring to FIG. 50, a serializer 1081 converts the multi-bit output of multiplexer 1079 into a serial bit stream, in this case performing an 8:1 parallel-to-serial conversion. The serializer output may be compressed further by compression logic 1083 (e.g., which may implement Huffman coding or any other practicable compressed-output encoding) to reduce the volume of output data. To accommodate non-uniform bit-depth VLL implementations (e.g., some VLL outputs being represented in fewer bits than outputs of other VLLs), one or more bit depth signals may be supplied to serializer 1081 to specify the number of valid bits conveyed in the multiplexer output. In one embodiment, for example, the bit depth signal is a single-bit signal that is high to indicate a full bit-depth (i.e., all output lines from multiplexer 1079 output carry valid image data) and low to indicate a lesser bit-depth (e.g., one or more lines of the multiplexer output are unused). In other embodiments, the bit depth signal may be a multi-bit signal to indicate more than two possible bit depths, and in yet other embodiments, the output of the VLLs and/or multiplexer 1079 are used, alone or together with an explicit bit-depth signal, to indicate bit depth (e.g., MSB or MSBs of VLL output or multiplexer output indicates bit depth). In any case, serializer 1081 operates to pack the outgoing serial bit stream in accordance with the bit-depth indication. FIG. 51, for example, depicts the serializer output as a sequence of samples, with eight-bit samples ($s_i$, $s_{i+1}$, $s_{i+2}$, . . . ) being transmitted back-to-back (i.e., without any unused transmission slots) in an 8-bit bit-depth mode, and 7-bit samples being transmitted back-to-back in a 7-bit bit-depth mode to effect a compression ratio of 7:8 (12.5% data reduction).

Referring to detail view 1088 in FIG. 50, the functions of serializer 1081 and VLL output multiplexer 1079 may alternatively be implemented within a serializer circuit 1091 that receives the VLL outputs, flag bits (RE, AB/ADC[9]), and bit depth signals and includes gear logic to output digitized samples having one of multiple depths according to those inputs, including a two-bit value in cases where RE is low, and an eight-bit value when RE is high. As an example, the RE bit may form the most significant bit of each packet, with the remaining number of bits being one (AB bit) or seven (seven-bit VLL output) according to whether the RE bit is low or high, respectively. Other bit-depths may apply in alternative embodiments or configurations.

Low Power, Pipelined Image Sensor

Figure 52:
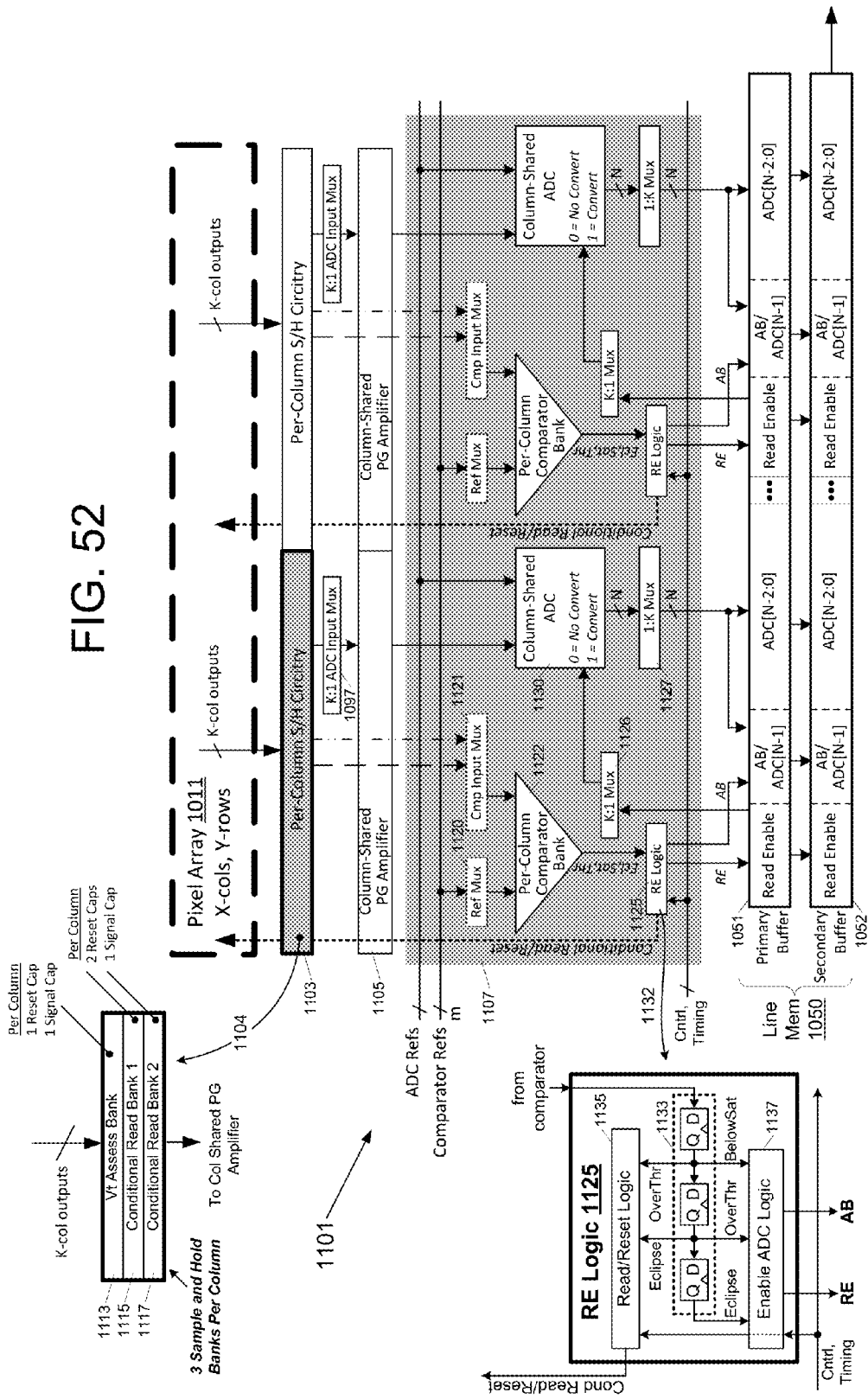
FIG. 52 illustrates an embodiment of a low power image sensor that may be used to implement component circuitry within the image sensor of FIG. 44

FIG. 52 illustrates an embodiment of a low power image sensor that may be used to implement component circuitry within the image sensor of FIG. 44. In the example shown, image sensor 1101 includes a pixel array 1011, multi-bank sample-and-hold (S/H) circuitry 1103, column-shared programmable-gain (PG) amplifier bank 1105 (PGA), comparator/ADC circuitry 1107 (including per-column comparator circuitry and column-shared ADC circuitry as discussed below), and line memory 1050. Pixel array output lines convey pixel read-out signals to sample-and-hold circuitry 1103, which in turn supplies analog samples of the read-out signals, with and without gain from the PGA 1105, to comparator/ADC circuitry 1107. To conserve die area, a single programmable gain amplifier 1105 and single ADC circuit 1130 are shared among K columns of the pixel array and cycled K times for each row of the pixel array. By contrast, a dedicated (separate) threshold comparator 1122 is provided for each column of pixels to enable pixel state (e.g., eclipse, under/over threshold, saturation) to be assessed across an entire row of pixels in parallel. In the embodiment shown, such "per-column" threshold comparators 1122 are operated cyclically to perform multiple pixel state evaluations per pixel row (i.e., in parallel for each pixel in the row), including an eclipse assessment to determine, for each pixel in the row, whether the reset state of the floating diffusion has fallen below an eclipse threshold; an underthreshold assessment to determine whether charge integration within the pixel has exceeded a conditional read/reset threshold, and a saturation assessment to determine whether the pixel charge integration level sampled in a conditional read/reset operation exceeds a saturation threshold (i.e., a threshold corresponding to a saturation point of ADC circuit 1130). Thresholds corresponding to the various pixel state assessments (e.g., eclipse threshold, conditional read/reset threshold, saturation threshold) are applied one after another to the input of the per-column comparators 1122 via corresponding reference multiplexers 1120, and a comparator input multiplexer 1121 is provided to select between multiple sample-and-hold circuit outputs as discussed below.

Comparator results for each pixel column are captured within a respective read-enable logic circuit 1125 which conditionally drives a conditional read/reset signal (e.g., TGc) back to the pixel column and also outputs read-enable and above/below-range bits (RE and AB) to primary buffer 1051 of line memory 1050. After pixel state assessment is complete for a given pixel row, the read-enable bit for each of K columns is passed, one after another via a multiplexer 1126, to the enable input of column-shared ADC (analog-to-digital converter) circuit 1130 and to column-shared PGA 1105, thereby selectively enabling digitization of individual column readouts (i.e., according to the logic state of the selected RE bit), suppressing signal amplification and digitization (and thus conserving power) for pixels that are eclipsed, below the conditional read/reset threshold, or saturated. Multiplexer 1127 is provided to demultiplex (i.e., distribute) digitized samples from column-shared ADC circuit 1130 into respective per-column storage locations within the primary line-memory buffer 1051 including, in the embodiment shown, overwriting the AB bit location.

Still referring to FIG. 52, pipelined operation within the various data read-out stages (i.e., pixel state assessment, conditional ADC, and line memory read-out) is enabled, at least in part, by multi-bank sample-and-hold circuitry 1103. In the embodiment shown in detail view 1104, for example, three separate sample-and-hold banks are provided for sequentially executed read-out operations, including an "Eclipse/Vt" bank 1113 that stores pixel samples evaluated to detect eclipse events and determine whether the conditional read/reset threshold is exceeded (the latter referred to alternately as "Vt assessment" or conditional read/reset threshold assessment); an even-row conditional read S/H bank 1115 (Conditional Read Bank 1) to store pixel samples that enable saturation detection and read-out digitization (ADC operation) for even-numbered pixel rows, and an odd-row conditional read S/H bank 1117 (Conditional Read Bank 2) to store pixel samples that enable saturation detection and read-out digitization for odd-numbered pixel rows. As explained in greater detail below, by providing a separate (dedicated) Eclipse/Vt bank 1113, S/H for the comparator operation can be pipelined with storage into the conditional read S/H banks. Thus, by providing separate conditional read S/H banks for even and odd rows and alternately storing samples therein for eventual digitization within the column-shared ADC circuitry, it becomes possible to pipeline pixel state assessment and ADC operations from row to row.

Referring to detail view 1132, an exemplary implementation of RE logic 1125 includes shift register 1133 to capture the output of comparator 1122 following a sequence of per-row pixel assessment evaluations, latching each new assessment result (i.e., comparator output, including an eclipse flag, overthreshold flag and below-saturation flag) in response to a timing signal from the sensor control logic (e.g., element 1020 of FIG. 44). Read/reset logic 1135 evaluates the states of the eclipse and overthreshold (i.e., above Vt) flags when enabled by another timing signal (or state transition signal), asserting a conditional read/reset signal according to their states as discussed below. Similarly, Enable-ADC logic 1137 outputs read-enable and above/below-range bits (RE) and (AB) for the pixel under evaluation in response to another control/timing signal and according to the states of the eclipse, overthreshold and below-saturation flags.

Figure 53:
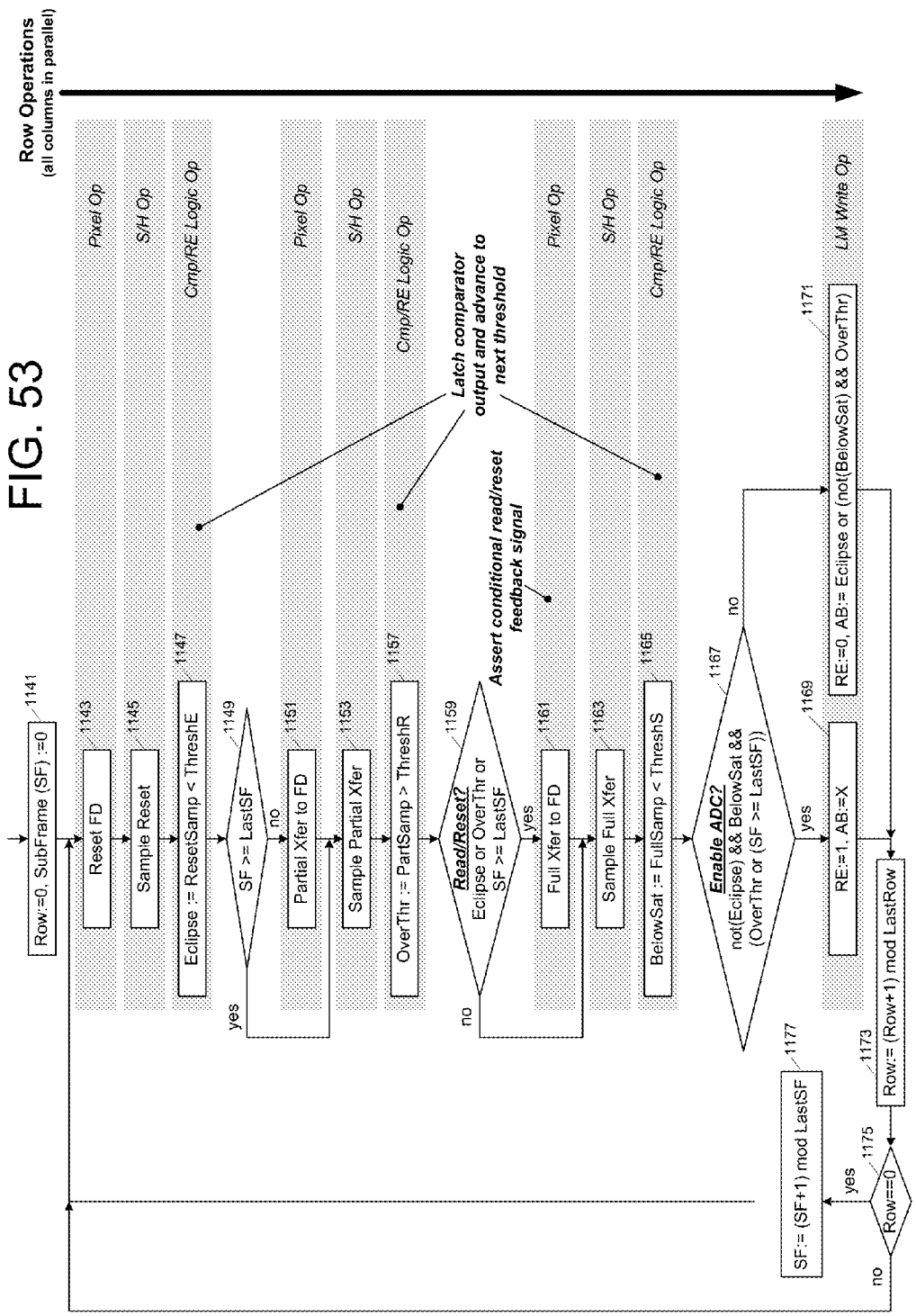
FIG. 53 illustrates a sequence of operations that may be executed within the pixel array, sample/hold banks and comparator circuitry of FIG. 52 to carry out pixel state assessment and enable subsequent ADC operation for row after row of pixels.

FIG. 53 illustrates a sequence of operations that may be executed within the pixel array, sample/hold banks and comparator circuitry of FIG. 52 to carry out pixel state assessment and enable subsequent PGA and ADC operation for row after row of pixels. In the implementation shown, each image frame is assumed to contain a sequence of conditional-read subframes that conclude with conditional read/reset operations, and a final unconditional-read subframe in which the integration states of pixels within the subject row are unconditionally read-out and, if no saturation or eclipse condition is detected, digitized to yield a subframe output.

Starting at 1141, row and subframe indices (Row, SF) are cleared to zero, followed by a three-phase pixel assessment operation involving, in order, the selected pixel row (i.e., row zero in the first loop iteration), the sample and hold circuitry, and the comparator/read-enable logic. More specifically, the floating diffusion (FD) is reset in a pixel operation at 1143, a sample of the FD reset state is captured in the sample-and-hold circuitry at 1145 and the reset-state sample is compared with an eclipse threshold at 1147, with the result of the eclipse assessment being latched as a Boolean "Eclipse" flag (e.g., within RE shift register 1133 of FIG. 52). If the subframe is not the last (final) subframe in the exposure interval (negative determination at 1149), another three-phase pixel assessment operation is carried out to determine whether charge integrated within the pixel has exceeded the conditional read/reset threshold. Thus, a partial transfer from photodetector to floating diffusion is executed in a pixel operation at 1151, a sample of the signal-state of the floating diffusion (enabling determination of whether a least a specified amount of charge was transferred during the partial-transfer operation) is captured within the sample and hold circuitry at 1153, and the signal-state sample is compared within a conditional read/reset threshold (ThreshR) within the comparator circuitry at 1157, with the result of the comparison being latched as a Boolean "OverThr" flag within the RE logic. In the embodiment shown, if the subframe is the final subframe (i.e., affirmative determination at 1149), the partial transfer operation at 1151 is bypassed, thus leaving the state of the photodetector undisturbed in preparation for an unconditional read operation (note that some other operating modes may have more than one unconditional read per row per frame). In one implementation, the sample and hold operation at 1153 and the ThreshR comparison/OverThr latching operations at 1157 are carried out regardless of whether partial transfer operation 1151 is bypassed, thus simplifying control of the sample and hold circuitry and comparator/RE logic (i.e., the logic may operate the same way for each subframe so that no subframe-dependent control operation is needed with respect to the operations shown at 1153 and 1157). In alternative embodiments, the control logic may account for the final subframe condition and bypass the partial transfer sample operation 1153 and/or comparator/read-enable logic operation 1157.

Referring to the read/reset determination at 1159, if either the Eclipse flag or OverThr flag is set (indicating that the subject pixel is in an eclipsed state and thus should be reset, or that sufficient charge has been integrated within the pixel to trigger conditional read and reset), or if the subframe is the final subframe in the integration interval (indicating that an unconditional read/reset is to be performed), then a full transfer from photodetector to floating diffusion is executed in the pixel operation at 1161 (thus resetting the photodetector), followed by capture of the signal-state of the floating diffusion in a sample-and-hold operation at 1163, and then a comparison of the signal-state sample with a saturation threshold (ThreshS) at 1165, with the comparison result being latched as a Boolean "BelowSat" flag within the RE logic (a differential saturation test may be applied in alternative embodiments, comparing the difference between the signal-state sample and reset sample with the saturation threshold). Note that the floating diffusion of the pixel will be reset at 1143 before further sampling so that the photodetector-to-floating diffusion charge transfer at 1161 effectively resets the pixel. Thus, if the pixel is eclipsed, has integrated charge above the conditional read/reset level, or is being evaluated in the final subframe of an exposure interval (i.e., affirmative determination at 1159), the pixel is reset. By contrast, if the pixel is neither eclipsed or overthreshold in a non-final subframe (negative determination at 1159), the charge transfer operation at 1161 is bypassed, thereby preserving charge within the photodetector to enable integration to continue into the next subframe. Note that the sampling operation at 1153 and BelowSat comparison/result-latch at 1157 may be omitted for eclipsed pixels in an alternative embodiment.

At 1167, the OverThresh, BelowSat and Eclipse flags are evaluated together with the final-subframe indication to either enable or disable PGA and ADC operation with respect to the subject pixel, a selection effected by setting or clearing the RE bit in a line memory write operation at 1169 or 1171, respectively. More specifically, if the pixel state flags indicate that the pixel is not eclipsed and below the saturation threshold, and either (i) the subframe is the final subframe or the pixel state flags indicate that the partial read-out exceeded the conditional-reset threshold (i.e., affirmative determination at 1167), then PGA and ADC operation is enabled by setting the read-enable bit in a line memory write operation at 1169. In that case, the value written to the AB bit, if any, is a don't care ('X') as the set RE bit will enable a subsequent ADC output to overwrite the AB bit. If the pixel state flags indicate that the pixel is either eclipsed or saturated, or does not exceed the conditional read/reset threshold (except in final subframe), or is not below the saturation threshold (i.e., negative determination at 1167) then PGA and ADC operation is disabled by clearing the read-enable bit in a line memory write operation at 1171. If ADC operation is disabled, the AB bit is written with a value that indicates whether the pixel state is saturated or eclipsed (AB:=1), or the pixel is underthreshold (AB:=0). Note that the expression shown in operation 1171 reflects the particular implementation of the pixel assessment shown in FIG. 53 (i.e., OverThresh is meaningless if the pixel is eclipsed, and BelowSat is meaningless if Overthresh and Eclipse are both false in a non-final subframe) and may be different for a different pixel assessment sequence. Following the line memory write operation at 1169 or 1171, the row index is incremented by the scan sequencer (i.e., within control logic 1020 of FIG. 44) at 1173 in preparation for loop iteration with respect to the subsequent pixel row, rolling/resetting to row zero following loop iteration with respect to the final row in the sensor (for interleaved operation, row sequencing will not be sequential and the subframe index may change at each row). If a row reset occurs (i.e., affirmative determination at decision 1175), the subframe index is incremented at 1177 in preparation for subsequent subframe processing, rolling to zero if the just-processed subframe was the final subframe in an exposure. Note that depending on the pixel architecture and subframe exposure method, the next row may not be physically adjacent to the subsequent row.

Referring to FIGS. 52 and 53, in one embodiment, the comparator/RE logic operations shown at 1147, 1157 and 1165, not only latch the comparator output within the RE logic (e.g., shifting the comparator result into shift register 1133 of FIG. 52), but also advance the control input to reference multiplexer 1120, thereby sequencing in order through the eclipse, conditional-reset and saturation thresholds (ThreshE, ThreshR, ThreshS). While not specifically shown, the conditional reset and/or saturation thresholds may be changed from subframe to subframe, thus enabling subframe-specific thresholds to be applied according subframe duration (i.e., setting a higher or lower conditional reset threshold according to the subframe integration interval), programmable gain settings (i.e., aligning ThreshS with the signal level that will saturate the ADC for a given programmable gain setting), and/or any other factors.

FIG. 54A illustrates an exemplary timing diagram in accordance with the sensor architecture of FIG. 52 and operational sequence of FIG. 53, including alternate TGc waveforms, "TGc (split-gate)" and "TGc (unit-gate)," corresponding to split-gate and continuous-gate pixel array embodiments, respectively. As noted above, the TGc waveforms for the two embodiments differ primarily in the TGc state during intervals of isolation between photodetector and floating diffusion. In the exemplary diagram of FIG. 54A, for instance, TGc is lowered in the split-gate embodiment to maximize the isolation between photodetector and floating diffusion, but held high in the continuous-gate embodiment for the same purpose (i.e., to ensure that the low state of the TGr line is applied to the transfer gate and thus avoid (or minimize) the floating transfer-gate condition.

FIGS. 54B and 54C present exemplary read-out sequences that may be employed with respect to even and odd rows of pixels. More specifically, FIG. 54B illustrates a non-shared pixel architecture where even and odd rows and pixels have a dedicated RS control and are read-out one after another, while FIG. 54C illustrates a shared pixel architecture in which each pair of pixels within a pixel column form a two-pixel cell (sharing a floating diffusion) and share a read-out line. In this arrangement, a first 2-row by 1-column shared pixel cell containing even-row pixels 'i' and 'i+2' and a second 2-row by 1-column shared pixel cell containing odd-row pixels 'i+1' and 'i+3' constitute a 4-row by 1-column region. A single row-select signal (RS-E) is provided for the first shared pixel cell (the even-row pixels) and another single row-select signal (RS-O) is provided for the second shared pixel cell (the odd-row pixels). The row readout order is as shown from top down (i.e., i, i+2, i+1, i+3) to avoid resource conflict with the shared floating diffusion region in the shared pixel cells. In general, the timing diagram of FIG. 54A, sample-and-hold circuitry described below in reference to FIG. 55 and sample-and-hold pipeline shown in FIG. 56 refer to the dedicated row-select embodiment of FIG. 54B. In all cases, the timing events and circuitry shown may be extended to cover the shared-read-out architecture of FIG. 54C or other shared read-out (shared floating diffusion) architectures, including 2×2 pixel-sharing readout architectures where each row readout may only be a half-row (even or odd columns) readout. It is also noted that "even" and "odd" readout refers to the use of the sample and hold registers and does not require that readout of an odd array row always follow an even array row—for interleaved readout where a row readout from one subframe is followed by a row readout from another subframe, the two row indices always may be spaced apart in the array and thus an even row could follow another even row in readout order, without causing a resource conflict.

In the timing example presented in FIG. 54A, interleaved pixel row operations are executed for even and odd pixel rows with the row operations for any single row corresponding to those shown in FIG. 53. More specifically, pixel reset, reset-state sample, eclipse assessment, partial transfer, signal-state sample and overthreshold (i.e., conditional read/reset threshold) assessment operations are executed with respect to even pixel row 'i' during an interval in which an even-row row-select signal (RS-E) is asserted as shown at 1201, followed by pixel reset, reset-state sample and eclipse assessment operations with respect to odd pixel row 'i+1' during assertion of odd-row row-select signal (RS-O) at 1203. Thereafter, RS-E is raised again at 1202 to enable signal-state sample capture following a conditional read/reset operation in pixel i, with RS-O and RS-E thereafter being alternately enabled to permit interleaved (pipelined) reset-state and signal-state sampling operations with respect to the even and odd sample-and-hold banks. As discussed above, pixel reset is effected by assertion of a reset-gate signal (RG) as shown at 1205 to couple the floating diffusions within a given row of pixels to a reset potential. Note that the pixel row index 'i' shown beneath the signal pulse in the signal RG waveform signifies a pulse on the RG signal line for row 'i', while pulse 'i+1' shown in that same waveform signifies a pulse on the RG signal line for row 'i+1' and thus the pulsing of a separate signal line—this indexed interpretation applies in a number of waveforms depicted in FIGS. 54A and 55.

Continuing with FIG. 54A, a row 'i' reset-state sample capture within the Eclipse/Vt S/H bank is triggered by assertion of $SHR_{comp}$ at 1207, with $SHR_{1a}$ being simultaneously (1209) asserted to capture a reset-state sample within the even row conditional read S/H bank, the latter sample to be applied during subsequent saturation assessment and, if enabled, ADC operation. An eclipse signal is pulsed at 1211 to enable the $SHR_{comp}$ reset-state sample to be compared with an eclipse threshold (ThreshE) and latch the comparison result (e.g., within the RE logic as discussed above). Thereafter, at 1217, TGc is pulsed (split-gate embodiment) or maintained high (continuous-gate embodiment) and TGr is concurrently raised to a partial-transfer potential (e.g., $VTG_{partial}$ as discussed above) at 1213 to enable partial charge transfer from photodetector to floating diffusion, followed by an $SHS_{comp}$ pulse at 1223 to capture a signal-state sample of the floating diffusion within the Eclipse/Vt sample-and-hold bank. In the case of a non-final subframe, Vtcomp is pulsed at 1225 to compare the partial-transfer sample (i.e., the signal-state sample less the reset-state sample within the Eclipse/Vt sample-and-hold bank) with the conditional read/reset threshold (ThreshR) and latch the comparison result. As discussed above, the Vtcomp pulse may be suppressed in a subframe in view of a forthcoming unconditional read.

Still referring to FIG. 54A, the read-enable logic conditionally asserts the TGc signal at time 1219 (i.e., if the conditional read/reset threshold is exceeded, the pixel is eclipsed or an unconditional read/reset is to be performed), concurrently with the full-transfer pulse 1215 on the TGr line, thereby enabling charge integrated within the photodetector to be transferred in its entirety to the floating diffusion, resetting the photodetector in preparation for the next integration interval. $SHS_1$ is pulsed at 1226 to capture the signal state of the floating diffusion within conditional read S/H bank 1, and at 1227 a saturation signal is pulsed to enable the floating diffusion signal state less reset-state (the latter captured in response to the $SHR_{1a}$ pulse at 1209, or alternately the floating diffusion signal state) to be compared with an appropriate saturation threshold (ThreshS). As discussed above, the combined pixel assessment results (i.e., eclipse, conditional read/reset and saturation assessments) may be recorded in line memory in the form of RE and AB bits, thus enabling column-sequential ADC operations to be carried out selectively according to the RE bit state for each individual pixel column. At 1229, a convert signal is cycled K times (e.g., 48 times) per row read interval (e.g., 2.75 microseconds, though different row intervals may apply) to enable column-shared ADC operation, with the output of each individual pixel column (i.e., signal state less reset state amplified according to the gain selected within the programmable gain amplifier) being selectively/conditionally digitized according to the state of the corresponding RE bit. Digitized read-out values are stored within the line memory as described above, with the contents of the primary line memory buffer transferred to the secondary buffer and output via the PHY with a one row-interval latency as shown at 1231.

The multi-bank sample-and-hold implementation shown in FIG. 53 and described in further detail below in reference to FIG. 55 becomes easier to understand in the context of FIG. 54A. More specifically, provision of separate even-row and odd-row conditional read S/H banks makes it possible to capture a signal-state sample of the full charge transfer from photodetector to floating-diffusion within the conditional read S/H bank for an odd pixel row (e.g., row i+1 as shown at $SHS_2$ pulse 1228) concurrently with ADC operations with respect to prior-row pixel samples latched within the even-row conditional read S/H bank, and vice-versa. Similarly, because the reset-state sample captured within a given conditional read S/H bank is maintained for more than one row interval (i.e., to support Vt assessment as shown at 1225, and ADC operation at 1229, provision of two reset-state S/H elements, 'a' and 'b', per conditional read S/H bank makes it possible to pipeline those operations without resource conflict. This can be seen by the alternating assertion of signals $SHR_{1a}$ and $SHR_{1b}$ for even row reset-state samples (e.g., for samples i and i+2 as shown at 1209 and 1210) and, similarly, by the alternating assertion of signals $SHR_{2a}$ and $SHR_{2b}$ for odd row reset-state samples. Further, because the Eclipse/Vt assessment may be completed within a row interval, a single Eclipse/Vt S/H bank is sufficient to support operations in all rows.

FIG. 55 illustrates an embodiment of multi-bank sample-and-hold circuit 1081 that may be used to implement the sample-and-hold (S/H) circuitry depicted in FIG. 52. As shown, the column read-out line for each of K pixel columns ($out_0$, $out_1$, ..., $out_{K-1}$) is supplied to a respective per-column S/H circuit 1251, each of which includes three sets of sample-and-hold elements (switch elements and storage elements) corresponding to the three sample-and-hold storage banks shown in FIG. 53, namely, an eclipse/Vt assess bank, and separate even and odd conditional read banks (i.e., Conditional Read Bank 1 and Conditional Read Bank 2). More specifically, as shown in detail view 1252, a per-column component of the eclipse/Vt assess bank 1255 includes two capacitive storage elements, $Cr_{comp}$, $Cs_{comp}$, coupled via switch elements 1261 and 1263 to control lines $SHR_{comp}$ and $SHS_{comp}$, respectively. By this arrangement, when either of the $SHR_{comp}$ or $SHS_{comp}$ signals is pulsed (e.g., as shown in FIG. 54A), the floating diffusion state driven onto column read-out line, Out (e.g., by a source follower transistor as described above), is captured within the corresponding capacitive element.

Still referring to FIG. 55, even-row conditional read S/H bank component 1257 includes a pair of reset-state capacitive elements, $Cr_{1a}$ and $Cr_{1b}$, and corresponding switch elements 1265, 1267 (controlled by $SHR_{1a}$ and $SHR_{1b}$, respectively), and a signal-state capacitive element $Cs_1$ and corresponding switch element 1269 controlled by $SHS_1$. Odd row S/H bank component 1259 similarly includes reset-state capacitive elements, $Cr_{2a}$ and $Cr_{2b}$, and corresponding switch elements controlled by $SHR_{2a}$ and $SHR_{2b}$, respectively, and a signal-state capacitive element, $Cs_2$, and corresponding switch element controlled by $SHS_2$. As explained above, by providing separate reset-state capacitive elements within each conditional read S/H bank, it becomes possible to extend the interval for which a given reset-state sample is held (maintained) beyond two row intervals, and thus enabling pixel state assessment, conditional read/reset and selective ADC operations to be pipelined. FIG. 56 illustrates an exemplary sample and hold pipeline corresponding generally to the S/H bank usage intervals within the timing arrangement of FIG. 54A.

Figure 57:
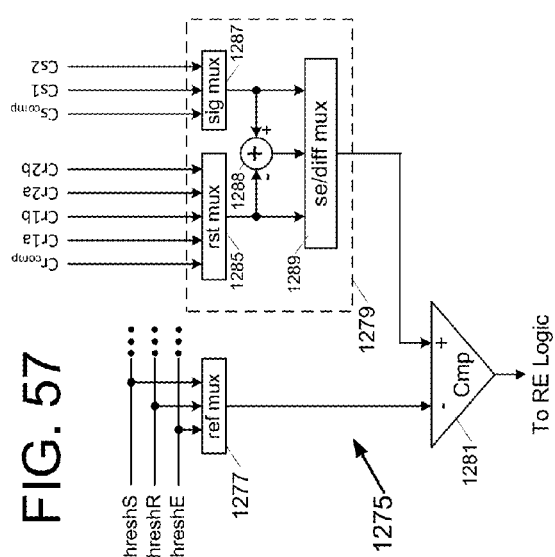
FIG. 57 illustrates embodiments of a reference multiplexer, comparator input multiplexer and comparator that may be used to implement like-named components depicted in FIG. 52.

FIG. 57 illustrates embodiments of a reference multiplexer 1277, comparator input multiplexer 1279 and comparator 1281 that may be used to implement like-named components depicted in FIG. 52. In the embodiment shown, reference multiplexer 1277 sequences through selection of three threshold references, including the eclipse, conditional-reset and saturation thresholds discussed above (ThreshE, ThreshR, ThreshS). As mentioned, additional thresholds may be provided and selected to account for variation in programmable gain, reset threshold and so forth (e.g., from subframe to subframe and/or according to imaging settings). The comparator input multiplexer 1279 includes a reset-state multiplexer 1285 and signal-state multiplexer 1287, as well as a single-ended/differential multiplexer 1289 that enables selection between single-ended and differential outputs, the latter (i.e., difference between signal-state and reference-state selections) being generated by difference circuit 1288.

In one embodiment, the eclipse evaluation is carried out by supplying $Cr_{comp}$ (i.e., the reset-state stored on capacitive element $Cr_{comp}$ within the eclipse/Vt S/H bank) in single-ended form to comparator 1281 for comparison with ThreshE, and the saturation assessment can be similarly carried out by supplying $Cs_1$ or $Cs_2$ in single-ended form to comparator 1281 for comparison with ThreshS. By contrast, conditional-reset comparison is effected by selecting the differential between $Cs_{comp}$ and $Cr_{comp}$, and the saturation comparison by selecting the differential between $Cs_1$ and either of $Cr_{1a}$ and $Cr_{1b}$, or $Cs_2$ and either of $Cr_{2a}$ and $Cr_{2b}$. In alternative embodiments, any of the single-ended comparisons may be differential and vice-versa, in some cases simplifying the comparator input multiplexer circuitry (e.g., if no single-ended signals need be forwarded to comparator 1281).

Figure 58:
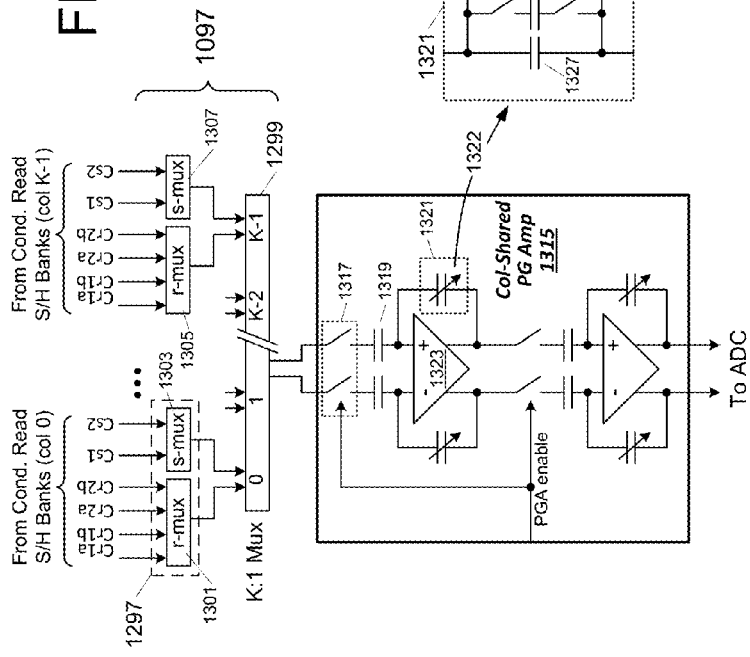
FIG. 58 illustrates embodiments of a column-shared programmable gain amplifier and K:1 ADC input multiplexer that may be deployed within the embodiment of FIG. 52.

FIG. 58 illustrates embodiments of a column-shared programmable gain amplifier 1315 and K:1 ADC input multiplexer 1097 that may be deployed within the embodiment of FIG. 52. The ADC input mux includes a column multiplexer 1299 and a set of K source-select multiplexers 1297 that cooperate to enable column-by-column delivery of one of four signal-state/reset-state signal pairs ($Cs_1/Cr_{1a}$, $Cs_1/Cr_{1b}$, $Cs_2/Cr_{2a}$ or $Cs_2/Cr_{2b}$) to the differential input of programmable-gain amplifier 1315. By this arrangement, after read-enable bits have been recorded to reflect the pixel state assessment for each of K columns, the source-select multiplexer can be set to select an even row or odd row input signal pair (e.g., alternating between $Cs_1/Cr_{1a}$ and $Cs_1/Cr_{1b}$ for every other even pixel row, and alternating between $Cs_2/Cr_{2a}$ and $Cs_2/Cr_{2b}$ for every other odd pixel row) and the K:1 column mux may be sequenced through the input sources from 0 to K−1 to support selective ADC operation.

In the embodiment shown, programmable gain amplifier 1315 includes multiple stages of capacitively coupled differential amplifiers 1323, each of which applies a programmable gain according to the ratio of an input capacitance 1319 and feedback-coupled variable capacitance 1321. In one implementation, shown in detail view 1322, variable capacitance element 1321 is implemented by switchably coupling a variable number of capacitive elements 1329 in parallel with a minimum capacitance 1327 in accordance with a program setting. In one embodiment, switchably coupled capacitive elements 1329 are binary-weighted (capacitances=x, 2x, 4x, 8x, etc.) to enable $2^R$ different capacitance settings in accordance with an R-bit control value. Alternatively, capacitive elements 1329 may be thermometer coded, have matching capacitances or any other arrangement that allows programmable gain amplifier to meet a desired amplification range and resolution. Also, the programmable gain amplifier may be disabled by opening gain-stage switch elements 1317 in response to deassertion of a PGA enable signal (e.g., a signal equivalent to or derived from the RE bits recorded within line memory 1050 and supplied via multiplexing element 1126 of FIG. 52). Also, any of the gain stages (only two of which are shown) may be bypassed according to programmed gain settings to further extend the amplification range of programmable gain amplifier 1315. Note that various other programmable gain amplifier implementations may be used in alternative embodiments, including PGA implementations that are enabled and disabled per the RE flag bit to save power.

Figure 59B:
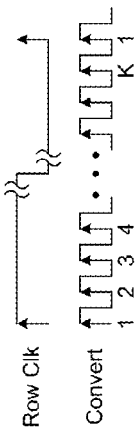
FIG. 59B illustrates a convert signal timing diagram corresponding to FIG. 59A.
Figure 59A:
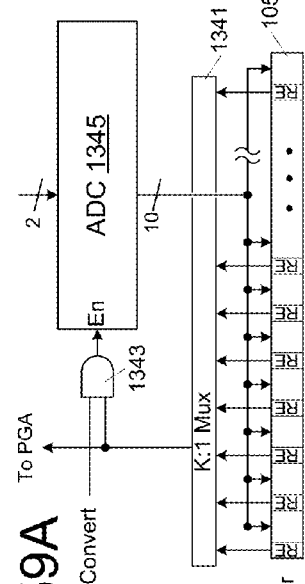
FIG. 59A illustrates embodiments of a read-enable multiplexer, ADC-enable logic and ADC circuit that may be used to implement the K:1 read-enable multiplexer and ADC circuitry of FIG. 52.

FIG. 59A illustrates embodiments of a read-enable multiplexer 1341, ADC-enable logic 1343 and ADC circuit 1345 that may be used to implement the K:1 read-enable multiplexer and ADC circuitry of FIG. 52. As shown, read-enable multiplexer 1341 is coupled to receive read-enable bits from each of K storage locations within primary line memory 1051 (i.e., each location corresponding to a respective pixel column) and iteratively sequences through those locations to supply the read-enable bits, one after another, to the input of ADC-enable logic 1343 (i.e., an AND logic gate in the embodiment shown) and also to the column-shared PGA (where they may serve as or enable generation of the PGA-enable signal described above). Referring to FIGS. 59A and 59B, a convert signal ("Convert") is cycled K times per pixel row to advance the read-enable bit selection (e.g., by incrementing a counter that controls the read-enable multiplexer selection), with the selected read-enable bit gating application of the convert signal to an enable input of ADC circuit 1345. By this operation, the high-state of the convert signal either passes through or is blocked by logic gate 1343 according to the state of the RE bit for that cycle of the convert signal, thereby either enabling or disabling operation of the PGA and ADC circuit according to the state of the RE bit. The ADC result for each read-enabled pixel column is stored within primary line memory buffer 1051 for eventual output to the VLL circuitry and PHY. Though not specifically shown, a set of "store" strobes that enable the output of ADC 1345 to be loaded into respective line memory buffer locations may be asserted in succession to enable successive (and selective) loading of ADC results into primary line memory buffer 1051. Alternatively, the ADC results may be loaded into a shift register and then transferred in parallel to the line memory buffer, masking or otherwise preventing buffer load operations for those pixel columns in which the RE bit is not set.

Read-Out Dilation

When a color filter array is applied in connection with the conditional read/reset image sensors described above, image distortion may occur when a moving object triggers color-differentiated sampling operations—conditional read/reset operations in a given subframe within pixels for some colors, but not for adjacent pixels of other colors. For example, a moving object that triggers read-out operations in green pixels (i.e., pixels that receive light predominantly in the green wavelength band), but not adjacent red or blue pixels, may trigger relatively rapid read/reset operations within the green pixels while the blue and red pixels are infrequently read (or read on different subframes than the adjacent green pixels), thus producing artifacts in the finalized image. In a number of embodiments described below, such chromatic distortion is mitigated by modifying the conditional read/reset determination for a given pixel to account for the read/reset assessment for one or more neighboring pixels, in effect, expanding the number of pixels to be read/reset in response to an overthreshold determination with respect to a given pixel; an approach referred to herein as "read-out dilation" or "read dilation."

Figure 60:
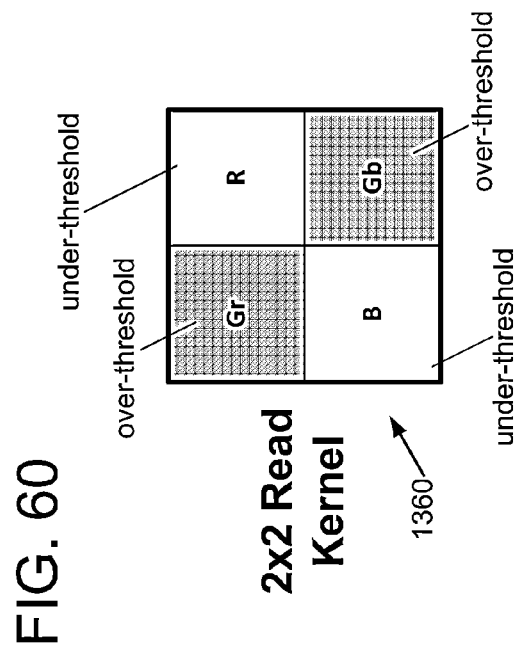
FIG. 60 illustrates an example of a 2×2 read kernel that may be effected through read dilation, with the four pixels shown disposed beneath color filter elements disposed in a Bayer pattern, including a red element (R), blue element (B) and two green elements (Gr and Gb)

As a matter of terminology, pixels that form an interdependent group for purposes of conditional read/reset are referred to as a "read kernel." With some exceptions, discussed below, if one pixel within the read kernel exceeds the conditional read/reset threshold, all other pixels within the kernel are marked for read/reset, thus dilating the read-out region to the entire kernel in a manner that prevents the chromatic distortion described above. FIG. 60 illustrates an example of a 2×2 read kernel 1360, with the four pixels shown disposed beneath color filter elements disposed in a Bayer pattern, including a red element (R), blue element (B) and two green elements (Gr and Gb, with the 'r' and 'b' indicating the color of the same-row pixel within the kernel). In the example shown, the green elements are determined to exceed the conditional read/reset threshold (i.e., overthreshold), triggering read/reset operations in those pixels, with read-dilation circuitry acting to include the red and blue pixels in the read/reset operations despite the underthreshold status of those pixels.

Figure 61:
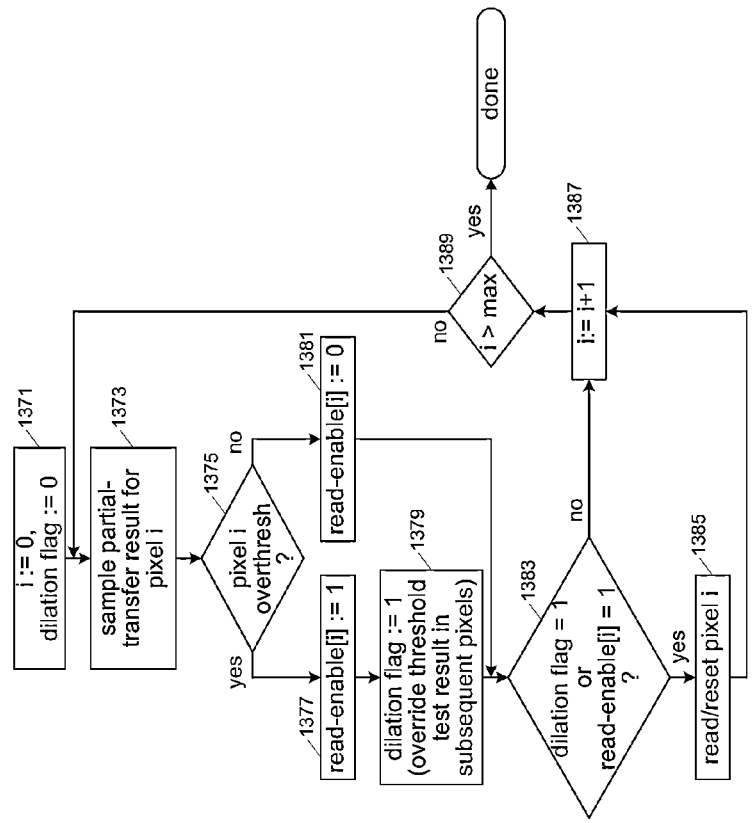
FIG. 61 illustrates an exemplary read dilation flow diagram with respect to a read kernel, assuming for purposes of explanation that neighboring read kernels do not overlap.

FIG. 61 illustrates an exemplary read dilation flow diagram with respect to a read kernel, assuming for purposes of explanation that neighboring read kernels do not overlap (i.e., each pixel is in no more than one read kernel). More detailed embodiments that enable overlapping read kernels are presented below with respect to FIGS. 62A/62B and 63A/63B.

Starting at 1371, a pixel index 'i' and dilation flag are initialized to zero. Following an integration interval, the partial-transfer result for pixel 'i' is sampled at 1373 and compared with the conditional read/reset threshold. If pixel 'i' is overthreshold (affirmative determination at 1375), the read-enable flag for pixel 'i' is set at 1377 and the dilation flag is also set at 1379. If the threshold test result indicates an under-threshold condition (negative determination at 1375), the read-enable flag for pixel 'i' is cleared at 1381. In either case (overthreshold or underthreshold), the dilation flag and read-enable flag are evaluated at 1383. If either flag is true (i.e., logical '1' in this example), a read/reset operation is executed with respect to pixel 'i' at 1385, followed by an increment operation at 1387 to increment the pixel index and repeat the loop operations for the next pixel in the kernel, concluding the kernel read-out operations if 'i' has exceeded the maximum index (i.e., affirmative determination at 1389). Returning to decision 1383, if neither the dilation flag nor the read-enable flag is true, the conditional read/reset operation is skipped, and loop index incremented to proceed to the next pixel in the kernel.

Reflecting on the operations shown in FIG. 61, it can be seen that setting the dilation flag at 1379 ensures that conditional read/reset operations will be performed for all subsequent pixels in the kernel (i.e., pixels corresponding to indices greater than i), in effect overriding the threshold test result for those pixels. Further, because only a single loop iteration is carried out with respect to each pixel in the kernel and pixels are evaluated sequentially, read-dilation extends only to those pixels evaluated after the first pixel determined to exceed the conditional read/reset threshold. In the read kernel of FIG. 60, for example, assuming that pixels are implemented in a 2×2 shared pixel architecture and are evaluated in the order {Gr, R, B, Gb}, if pixel R is the first overthreshold pixel (i.e., Gr is underthreshold), read-dilation will extend only to pixels B and Gb, not to pixel Gr. Similarly, if pixel B is the first overthreshold pixel, read dilation will extend only to pixel B, with pixels Gr and R not being read or reset. In a number of embodiments, this prospective read-dilation effect has implications for desired pixel evaluation order, with some pixels being evaluated in reverse column-order (i.e., proceeding from higher to lower column index) to minimize the possibility that a given color pixel will be systematically skipped for a given image capture. In other embodiments, pixel state assessment for a given row is recorded within the read-dilation logic for all pixels within the same row of a given read kernel before being written to line memory, thus enabling read-dilation to be extended to all such same-row, same-kernel pixels.

Figures 62A, 62B:
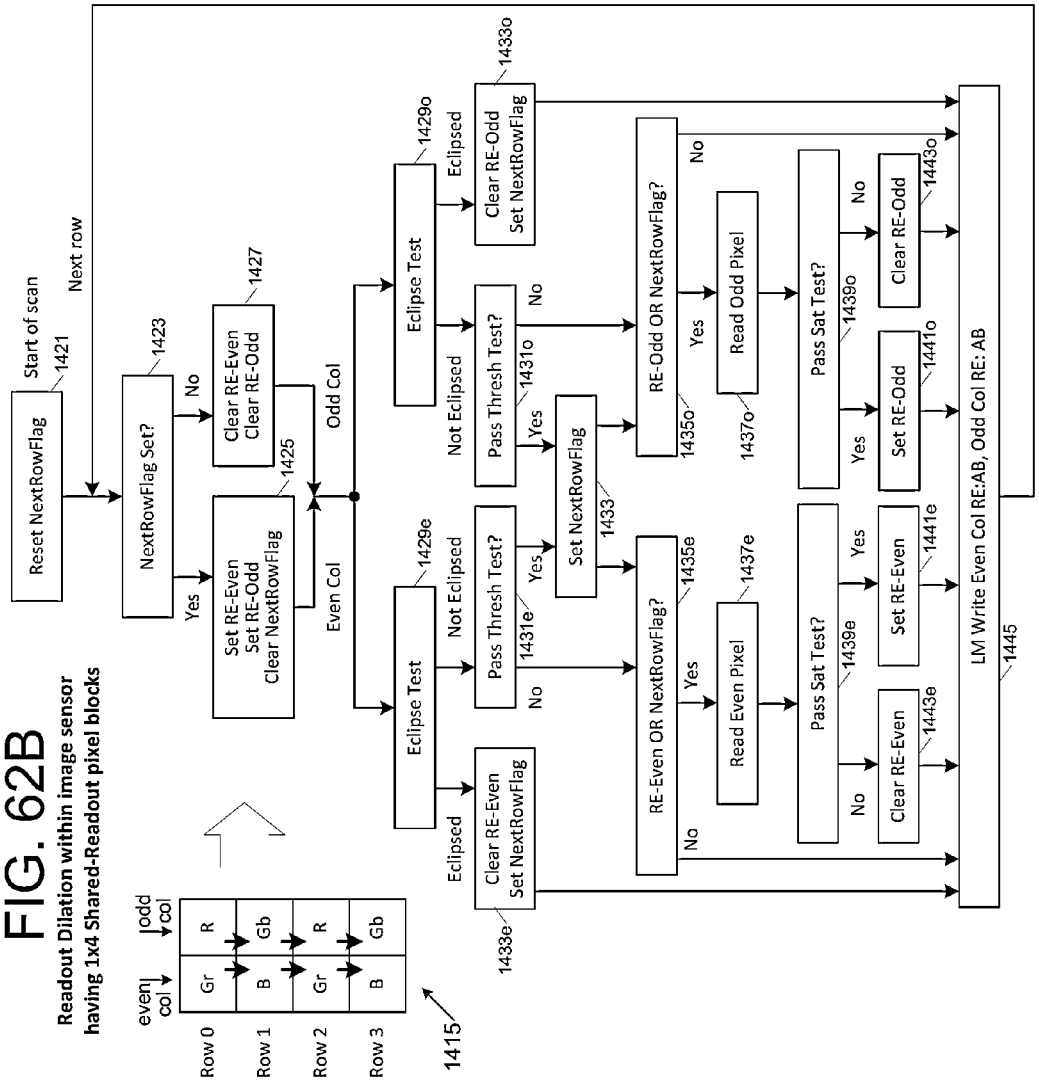
FIGS. 62A and 62B illustrate an exemplary set of 2×2 read kernels and corresponding read-dilation flow diagram in an embodiment in which the bottom row of each read kernel overlaps the top row of the read kernel below.

FIGS. 62A and 62B illustrate an exemplary set of 2×2 read kernels and corresponding read-dilation flow diagram in an embodiment in which the bottom row of each read kernel overlaps the top row of the read kernel below. As a point of reference, the leftmost column of pixels in each read kernel is referred to as the even pixel column and the rightmost column of pixels as the odd pixel column. Also, pixels in each row are evaluated in parallel (concurrently) as in the embodiments of FIGS. 52-59, and the pixels in each read kernel are disposed between Bayer-patterned color elements as in FIG. 60.

FIG. 62A illustrates, within read kernels 1401, 1403, 1405 and 1407, the four possible scenarios in which only one of four pixels (shaded) exceeds the conditional read/reset threshold. Assuming the row to row progression shown in FIG. 62B at 1415 (i.e., within adjacent columns of 1×4 shared-readout pixel blocks), in all four single-pixel exceedance cases, read-dilation logic extends the conditional read/reset operation to all the pixels in the read kernel.

FIG. 62B presents an exemplary flow diagram of the read dilation logic applied to realize the read kernel results in FIG. 62A. Starting at 1421, a next-row flag (NextRowFlag) is reset in preparation for the start of a scan through the pixel rows for a given subframe. At 1423 the next-row flag is evaluated and, if set, triggers the operations shown at 1425; setting read-enable flags for the even and odd pixel columns (RE-Even, RE-Odd) and clearing the next-row flag. If the next-row flag is found not to be set at 1423, then the read-enable flags for the even and odd pixel columns are cleared at 1427.

Following the flag setting/clearing operations at 1425 or 1427, eclipse evaluations are performed in parallel for the even- and odd-column pixels at 1429e and 1429o. In each case, if the pixel is determined to be eclipsed, then the corresponding read-enable flag (i.e., RE-Even for the even pixel, RE-Odd for the odd pixel) is cleared and the NextRowFlag is set at 1433e/1433o and the remaining tests and read are bypassed. Otherwise, for either of the pixels determined not to be eclipsed, a conditional-reset threshold test is performed and evaluated at 1431e/1431o, setting the next-row flag at 1433 if the conditional-reset threshold is exceeded in either pixel.

Following the pixel assessment operations at 1429e/1429o and, if necessary, 1431e/1431o (and any flag setting/clearing operations resulting therefrom), the read-enable flag is evaluated for each column in conjunction with the next-row flag at 1435e/1435o. As shown, if the read-enable flag for a given column is set, or if the next-row flag is set, a read/reset operation is carried out with respect to that pixel at 1437e/1437o. Thus, even if only one of the even and odd pixels is uneclipsed and exceeds the conditional-reset threshold, setting of the next-row flag at 1433 will result in a conditional read/reset operation being performed with respect to both pixels by virtue of the dilation logic in operations 1435e and 1435o. Moreover, because the read-enable flags for both pixel columns are set at the start of a loop iteration (i.e., at 1423) upon determining that the next-row flag is set, the even and odd pixels for a given row will be conditionally read and reset regardless of their respective pixel assessment results if the next-row flag was set for the preceding row, thus extending the read dilation from an overthreshold non-eclipsed pixel in a given read kernel to its neighbor in the row and to the two pixels below, as shown in the read kernels of FIG. 62A.

Continuing with the exemplary flow diagram of FIG. 62B, following a read/reset with respect to either pixel at 1437e or 1437o, the read-out value is compared with a saturation threshold in a saturation test at 1439e/1439o. If the pixel is not saturated (read-out value is below saturation threshold, yielding an affirmative determination at 1439e/1439o), the read-enable flag for the pixel is set at 1441e/1441o. Otherwise, the read-enable flag is cleared at 1443e/1443o. Following the detection of an eclipse at 1433e/1433o, or following read-enable set or clear operations at 1441e/1441o or 1443e/1443o, or following a negative determination at 1435e/1435o (i.e., neither read-enable flag nor next-row flag set and thus a determination to bypass pixel read/reset at 1437e/1437o), a line memory write operation is executed at 1445 to record the read-enable flag for both the even and odd columns as a read-enable bit (i.e., for the even-column pixel RE:=RE-Even, and for the odd-column pixel RE:=RE-Odd), and to set the AB bit according to the pixel assessment results. Thereafter, the loop iteration is executed for the next row of pixels, carrying forward the affirmative state of the next-row flag if set in operation 1433 (i.e., either of the even/odd pixels in the current row is non-eclipsed and exceeds the conditional read/reset threshold).

Figure 63B:
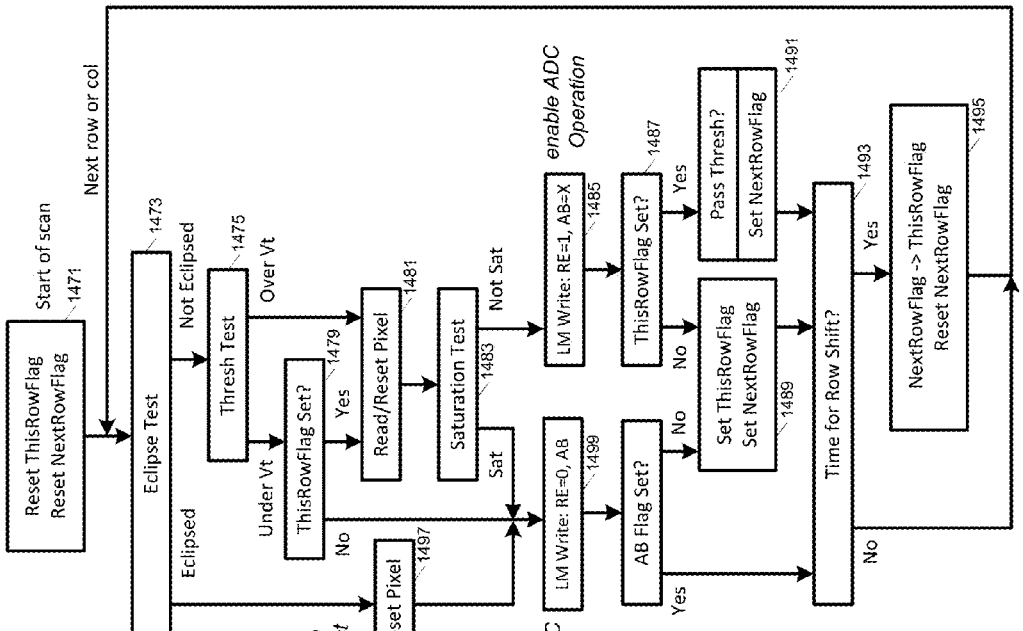
FIGS. 63A and 63B illustrate an exemplary set of 2×2 read kernels and corresponding read-dilation flow diagram within an image sensor embodiment in which the bottom row of each read kernel overlaps the top row of the read kernel below, but having 2×2 shared-readout pixel blocks instead of the 1×4 shared-readout pixel blocks assumed in FIGS. 62A and 62B.
Figure 63A:
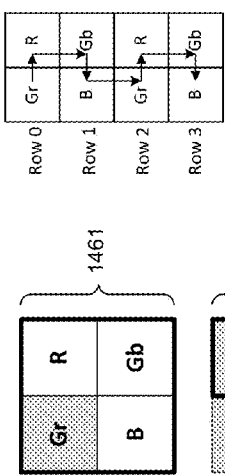

FIGS. 63A and 63B illustrate an exemplary set of 2×2 read kernels and corresponding read-dilation flow diagram within an image sensor embodiment in which the bottom row of each read kernel overlaps the top row of the read kernel below, but having 2×2 shared-readout pixel blocks instead of the 1×4 shared-readout pixel blocks assumed in FIGS. 62A and 62B. Because the pixels in each row of a given read-kernel share a floating diffusion (e.g., as described above in reference to FIGS. 16 and 17), the pixel evaluation sequence progresses sequentially through each pixel as shown at 1470 in FIG. 63B instead of column-parallel as in the embodiment of 62B. Moreover, instead of a simple left-to-right pixel evaluation progression within each row, the "green" pixel in each row (i.e., pixel disposed beneath a green color element, Gr or Gb within the Bayer color pattern shown) is evaluated first to maximize the opportunity to dilate the conditional read/reset to at least one pixel of each color. This optimization can be appreciated by considering each of the possible single-threshold-exceedance scenarios shown in FIG. 63A in the context of the pixel evaluation sequence shown at 1470 in FIG. 63B. In the first read kernel (1461), pixel Gr is the sole overthreshold pixel, but also the first pixel evaluated, thus extending the conditional read/reset operation to the remaining three pixels (R, Gb and B) despite their underthreshold condition. In the second read kernel (1463), the second evaluated pixel, pixel 'R', is the sole overthreshold pixel, but because pixel Gr was already determined to be underthreshold and not conditionally read/reset, the opportunity to extend the conditional read/reset to that pixel has passed (at least in an embodiment that refrains from regressive pixel evaluation). Consequently, though the overthreshold determination in pixel R results in read-dilation to the remaining pixels in the read kernel, the Gr pixel remains unread, as indicated by its placement outside the bold boundary (which encompasses the pixel subset included in the read-dilation) and cross-hatching. Despite omission of the Gr pixel, however, the subsequent-row green pixel (Gb) is nevertheless included within the read-dilation subset, thus ensuring that a pixel of each color is read-out, thus mitigating chromatic distortion in the scenario described above.

Continuing with FIG. 63A, if pixel Gb is the sole over-threshold pixel as in read kernel 1465, the reverse-direction pixel progression (i.e., from right to left as shown in FIG. 63B at 1470) ensures that pixel B will be included in the read-dilation subset and thus that all the pixels in the read kernel will be conditionally read/reset. Considering the alternative case in which pixel progression proceeds from left to right in each row (a possible embodiment); in that case pixel B would be read first, found to be underthreshold and therefore not conditionally read/reset—omitted from the read-dilation subset as in the case of pixel Gr above. In that case, the read-dilation pixel group would lack a blue pixel, making the sensor susceptible to chromatic distortion.

In the final read kernel 1467, pixel B is the sole overthreshold pixel which, due to the reverse (right to left) progression within the first pixel row, excludes pixel Gb from the read-dilation subset. Because the read-dilation pixel subset will still include pixel Gr, however, read-out of at least one pixel from each color group is guaranteed. Thus, by sequencing through the pixels of each row in an order that begins with a pixel color that appears redundantly within the read kernel, a pixel of each color is guaranteed (or at least more likely) to be included in the read-dilation pixel subset.

FIG. 63B presents an exemplary read-dilation flow diagram corresponding to the read kernels shown in FIG. 63A. Starting at 1471, two row flags are reset (i.e., cleared), one for the current row within a given read kernel ("ThisRowFlag") and one for the subsequent row ("NextRowFlag"). At 1473, an eclipse test is executed for the first pixel within a 2×2 shared-readout pixel block. If the pixel is not eclipsed, a threshold test is executed at 1475 to determine if charge integrated within the pixel exceeds the conditional read/reset threshold ("Vt"). If over threshold ("Over Vt"), the pixel is read/reset at 1481 and a saturation test is performed at 1483 to determine whether the read-out sample exceeds the saturation threshold. If the saturation threshold is not exceeded (i.e., pixel not saturated), the read-enable bit for the pixel is set in a line memory write operation at 1485 to enable a subsequent ADC operation (the AB bit will be overwritten with the ADC result, and thus is shown as being written with a "don't care" value, 'X' in the line memory write operation) and the current row flag is evaluated at 1487. If the current row flag is not set (negative determination at 1487), then the current row flag and next row flag are set at 1489. If the current row flag is determined to be set in branch point 1487 and if the pixel under evaluation was overthreshold (i.e., the subject pixel triggered or would have triggered a read-dilation event), then the next-row flag is set at 1491. At 1493, the pixel sequencing status is evaluated to determine whether the pixel under evaluation is the last of the two pixels to be evaluated within a given row of a 2×2 shared pixel block (e.g., either pixel R or pixel B in the exemplary sequence shown at 1470). If so, then the next pixel to be evaluated will be in a subsequent row so that, at 1495, the logic state of the next row flag is transferred (assigned) to the current row flag and the next row flag is reset. If the pixel under evaluation is not the last of the two pixels to be evaluated within a given shared pixel block row, the transfer and reset operations at 1495 are skipped.

Returning to the threshold test at 1475, if the pixel is determined to be underthreshold (under Vt), then the current row flag is evaluated at 1479 and, if clear (negative determination at 1479), a line memory write is executed at 1499 to clear the read-enable bit for the current pixel (thus disabling ADC operation for that pixel) and clear the AB bit to reflect the underthreshold condition. By contrast, if the current row flag is determined to be set at 1479, a conditional read/reset is executed at 1481, despite the underthreshold status of the pixel, thus effecting a read dilation. Because any overthreshold determination with respect to a pixel within the current row or previous row will ensure execution of a read/reset operation at 1481 for all non-eclipsed pixels yet to be evaluated within a given read kernel (i.e., by virtue an affirmative determination at 1479 if the subject pixel is not itself overthreshold), read dilation extends to all pixels within the read kernel following identification of an overthreshold pixel, thus effecting the read kernel patterns shown in FIG. 63A. Determination that a given pixel is saturated (i.e., affirmative determination at 1483) clears the RE bit in the line memory write at 1499 and sets the AB bit to reflect the saturation result (i.e., AB=1). In the embodiment of FIG. 63B, the saturation determination also results in skipping the conditional flag setting operations at 1489 and 1491. In alternative embodiments, a saturated pixel may result in setting flags at 1489 or 1491, despite disabling ADC operation for the subject pixel. Similarly, while an eclipse determination at 1473 results in bypassing the threshold testing operation at 1475 (proceeding straight to pixel reset at 1497; an operation which may be effected by a conditional read/reset operation as discussed above), clearing the RE bit and setting the AB bit at 1499 (i.e., to reflect the eclipsed condition), and then bypassing the conditional flag setting operations at 1489 and 1491, an eclipsed pixel may alternatively result in setting flags at 1489 or 1491, despite disabling the ADC operation.

FIG. 64 illustrates an exemplary K-column section of an image sensor 1510 having logic to carry out read-dilation operations as illustrated in FIGS. 62A/62B and 63A/63B. In the arrangement shown, the pixel array 1011, multi-bank sample-and-hold circuitry 1081, column-shared PGA 1083, column-shared ADC circuitry 1130, multiplexing circuits 1126 and 1127, and line memory buffers 1050 are implemented generally as described in reference to FIGS. 52-59. Comparator circuitry 1511 is also implemented generally as described in reference to FIGS. 52 and 57, except that the per-column read-enable logic (element 1125 of FIG. 52) is replaced by multi-column read-enable/dilation logic 1515 coupled to receive the output of the comparators for multiple adjacent columns corresponding to pixels within the same read kernel (two adjacent columns and thus columns ½, ¾, . . . , K−1/K, in the embodiment shown). By this arrangement, the read-enable bit determination for a given pixel may be based on the pixel assessment results and corresponding row flags for multiple column-adjacent and row-adjacent pixels within a read kernel as described in reference to FIGS. 62A/62B and 63A/63B.

In embodiments that allow interleaved operation between two or more subexposures, RE/Dilate Logic 1515 is designed to save dilation state when switching row context from one subexposure to another. For instance, if four subexposure scans are interleaved, logic 1515 retains four separate dilation states. When dilation state for a row x is complete, it is retained in an indexed set of registers while, e.g., dilation state for up to three unrelated rows is accessed for the next three row operations. On the fourth successive row operation, which visits row (x+1), the row x state is referenced to determine whether dilation requires pixel reads due to overthreshold state at row x.

Dilation may be neither necessary nor desirable in all modes of operation. Thus preferably, logic 1515 has at least one dilate mode and at least one non-dilate mode (where every pixel is evaluated for readout completely independent of surrounding pixels). In some embodiments, dilation can also be activated on a subframe basis. For instance, only the longest subexposure(s) may use dilation, as that is where motion artifacts would be more apparent and/or problematic. Dilation logic 1515 would in such case, when interleaving is used, allow state storage for each subexposure that indicates whether or not dilation applies each time a row is visited for that subexposure.

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "light" as used to apply to radiation is not limited to visible light, and when used to describe sensor function is intended to apply to the wavelength band or bands to which a particular pixel construction (including any corresponding filters) is sensitive. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

The section headings in the above detailed description have been provided for convenience of reference only and in no way define, limit, construe or describe the scope or extent of the corresponding sections or any of the embodiments presented herein. Also, various modifications and changes can be made to the embodiments presented herein without departing from the broader spirit and scope of the disclosure. For example, features or aspects of any of the embodiments can be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of operation within an integrated circuit image sensor having a pixel array, the method comprising:
    determining whether charge accumulation within a first pixel in the pixel array exceeds a conditional-read threshold;
    generating a digitized sample of the charge accumulation within the first pixel in response to determining that the charge accumulation within the first pixel exceeds the conditional-read threshold; and
    generating a digitized sample of charge accumulation within a second pixel in the pixel array in response to determining that the charge accumulation within the first pixel exceeds the conditional-read threshold.

2. The method of claim 1 wherein the first and second pixels are disposed adjacent one another in a row of pixels within the pixel array.

3. The method of claim 1 wherein the first and second pixels are disposed in adjacent rows of pixels within the pixel array.

4. The method of claim 1 further comprising determining that the charge accumulation within the first pixel does not exceed the conditional-read threshold and generating a digitized sample of the charge accumulation within the first pixel in response to determining that the charge accumulation within the second pixel exceeds the conditional-read threshold.

5. The method of claim 1 wherein generating the digitized sample of the charge accumulation within the second pixel comprises sampling the charge accumulation within the second pixel and resetting the second pixel to enable renewed charge accumulation.

6. The method of claim 1 wherein determining whether charge accumulation within the first pixel in the array exceeds a conditional-read threshold comprises:
    executing a partial charge-transfer operation with respect to a photodiode and floating diffusion region of the first pixel;
    generating a first signal representative of an amount of charge transferred from the photodiode to the floating diffusion region in the partial charge-transfer operation;
    comparing the first signal with the conditional-read threshold; and
    setting an enable value to either a first state or a second state according to whether the first signal exceeds the conditional-read threshold.

7. The method of claim 6 wherein the first and second pixels are constituent pixels of a group of pixels, and wherein the method comprises:
    in addition to determining whether charge accumulation within the first pixel exceeds the conditional-read threshold, determining whether charge accumulation within each other pixel of the group of pixels exceeds the conditional-read threshold, including setting a respective enable value for each other pixel accordingly; and
    in addition to generating the digitized sample of charge accumulation within the second pixel, generating a respective digitized sample of charge accumulation within each other pixel of the group of pixels if any one of the enable values corresponding to the group of pixels indicates that the conditional-read threshold has been exceeded.

8. The method of claim 7 wherein generating respective digitized samples of charge accumulation within the second pixel and each other pixel of the group of pixels comprises performing an analog-to-digital conversion with respect to each pixel of the group of pixels.

9. The method of claim 8 wherein the first pixel and at least one other pixel of the group of pixels are disposed within a first row of pixels of the pixel array, and wherein performing analog-to-digital conversion with respect to each pixel of the group of pixels comprises performing the analog-to-digital conversion with respect to the first pixel and the at least one other pixel of the group of pixels in sequential time intervals.

10. The method of claim 6 wherein generating the digitized sample of the charge accumulation within the second pixel in response to determining that the charge accumulation within the first pixel exceeds the conditional-read threshold comprises:
    executing a full charge-transfer operation with respect to a photodiode and floating diffusion region of the second pixel;
    generating a second signal representative of an amount of charge transferred from the photodiode to the floating diffusion region in the full charge-transfer operation; and
    executing an analog to digital conversion operation with respect to the second signal to produce the digitized sample.

11. An integrated-circuit image sensor comprising:
    a pixel array having first and second pixels;
    assessment circuitry to determine whether charge accumulation within the first pixel exceeds a conditional-read threshold; and digitization circuitry to generate a digitized sample of charge accumulation within the second pixel in response to determination by the assessment circuitry that the charge accumulation within the first pixel exceeds the conditional-read threshold.

12. The integrated-circuit image sensor of claim 11 wherein the first and second pixels are disposed adjacent one another in a row of pixels within the pixel array.

13. The integrated-circuit image sensor of claim 11 wherein the first and second pixels are disposed in adjacent rows of pixels within the pixel array.

14. The integrated-circuit image sensor of claim 11 wherein the digitization circuitry is further to generate a digitized sample of the charge accumulation within the first pixel in response to determination by the assessment circuitry that (i) the charge accumulation within the second pixel exceeds the conditional-read threshold or (ii) the charge accumulation within the first pixel exceeds the conditional-read threshold.

15. The integrated-circuit image sensor of claim 11 wherein the digitization circuitry to generate the digitized sample of the charge accumulation within the second pixel comprises circuitry to sample the charge accumulation within the second pixel and reset the second pixel to enable renewed charge accumulation.

16. The integrated-circuit image sensor of claim 11 wherein the assessment circuitry to determine whether charge accumulation within the first pixel in the array exceeds a conditional-read threshold comprises circuitry to:
execute a partial charge-transfer operation with respect to a photodiode and floating diffusion region of the first pixel;
generate a first signal representative of an amount of charge transferred from the photodiode to the floating diffusion region in the partial charge-transfer operation;
compare the first signal with the conditional-read threshold; and
set an enable value to either a first state or a second state according to whether the first signal exceeds the conditional-read threshold.

17. The integrated-circuit image sensor of claim 16 wherein the first and second pixels are constituent pixels of a group of pixels, and wherein:
the assessment circuitry includes, in addition to circuitry to determine whether charge accumulation within the first pixel exceeds the conditional-read threshold, circuitry to determine whether charge accumulation within each other pixel of the group of pixels exceeds the conditional-read threshold, including setting a respective enable value for each other pixel accordingly; and
the digitization circuitry includes, in addition to circuitry to generate the digitized sample of charge accumulation within the second pixel, circuitry to generate a respective digitized sample of charge accumulation within each other pixel of the group of pixels if any one of the enable values corresponding to the group of pixels indicates that the conditional-read threshold has been exceeded.

18. The integrated circuit image sensor of claim 17 wherein the circuitry to generate respective digitized samples of charge accumulation within the second pixel and each other pixel of the group of pixels comprises analog-to-digital conversion circuitry to perform an analog-to-digital conversion with respect to each pixel of the group of pixels.

19. The integrated circuit image sensor of claim 16 wherein the digitization circuitry to generate the digitized sample of charge accumulation within the second pixel comprises circuitry to:
execute a full charge transfer operation with respect to a photodiode and floating diffusion region of the second pixel;
generate a second signal representative of an amount of charge transferred from the photodiode to the floating diffusion in the full transfer operation; and
execute an analog to digital conversion operation with respect to the second signal to produce the digitized sample; and
wherein at least some of the circuitry to execute the full charge transfer operation and generate the second signal representative of the amount of charge transferred is shared between the assessment circuitry and the digitization circuitry.

20. A non-transitory computer readable medium that stores data representative of an integrated-circuit image sensor comprising:
a pixel array having first and second pixels;
assessment circuitry to determine whether charge accumulation within the first pixel exceeds a conditional-read threshold; and
digitization circuitry to generate a digitized sample of charge accumulation within the second pixel in response to determination by the assessment circuitry that the charge accumulation within the first pixel exceeds the conditional-read threshold.

* * * * *